(12) United States Patent
Momose et al.

(10) Patent No.: US 8,476,401 B2
(45) Date of Patent: Jul. 2, 2013

(54) RESIST POLYMER, PROCESS FOR PRODUCTION THEREOF, RESIST COMPOSITION, AND PROCESS FOR PRODUCTION OF SUBSTRATED WITH PATTERNS THEREON

(75) Inventors: Hikaru Momose, Yokohama (JP); Akifumi Ueda, Yokohama (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 713 days.

(21) Appl. No.: 11/574,860

(22) PCT Filed: Sep. 6, 2005

(86) PCT No.: PCT/JP2005/016297
§ 371 (c)(1),
(2), (4) Date: Mar. 7, 2007

(87) PCT Pub. No.: WO2006/028071
PCT Pub. Date: Mar. 16, 2006

(65) Prior Publication Data
US 2008/0032241 A1    Feb. 7, 2008

(30) Foreign Application Priority Data
Sep. 10, 2004   (JP) ................................. 2004-264051

(51) Int. Cl.
*C08G 63/08*   (2006.01)
(52) U.S. Cl.
USPC .......................................... 528/354; 528/271
(58) Field of Classification Search
USPC ................................ 430/270.1; 528/271, 354
See application file for complete search history.

(56) References Cited

U.S. PATENT DOCUMENTS

| 6,692,889 B1 * | 2/2004 | Funaki et al. ............... 430/270.1 |
| 2006/0127801 A1 * | 6/2006 | Momose et al. ............ 430/270.1 |

FOREIGN PATENT DOCUMENTS

| JP | 5 117205 | 5/1993 |
| JP | 10 55069 | 2/1998 |
| JP | 10 274852 | 10/1998 |
| JP | 10 319595 | 12/1998 |
| JP | 2001 117232 | 4/2001 |
| JP | 2001 188346 | 7/2001 |
| JP | 2001 337455 | 12/2001 |
| JP | 2002 6497 | 1/2002 |
| JP | 2002 72483 | 3/2002 |
| JP | 2002 182393 | 6/2002 |
| JP | 2003131382 A * | 5/2003 |
| JP | 2003 206315 | 7/2003 |
| JP | 2006169366 A * | 6/2006 |

OTHER PUBLICATIONS

English Translation of JP2003-131382 A, May 9, 2003.*

* cited by examiner

*Primary Examiner* — Cynthia Kelly
*Assistant Examiner* — Connie P Johnson
(74) *Attorney, Agent, or Firm* — Oblon, Spivak, McClelland, Maier & Neustadt, L.L.P.

(57) ABSTRACT

A resist polymer (Y'), which is used as a resist resin in DUV excimer laser lithography, electron beam lithography, and the like, contains a polymer (Y) comprising: a constituent unit (A) having a lactone skeleton; a constituent unit (B) having an acid-eliminable group; a constituent unit (C) having a hydrophilic group; and a constituent unit (E) having a structure represented by the following formula (1), wherein a content of the constituent unit (E) is 0.3 mol % or more based on the total number of the constituent units of the resist polymer (Y'):

[Chemical formula 1]

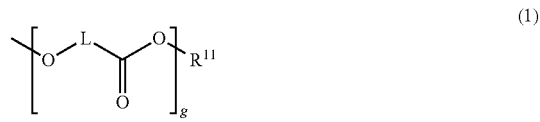

in the formula (1), L is a divalent linear, branched, or cyclic $C_{1-20}$ hydrocarbon group which may have a substituent and/or a heteroatom; $R^{11}$ is a g-valent linear, branched, or cyclic $C_{1-20}$ hydrocarbon group which may have a substituent and/or a heteroatom; and g represents an integer of 1 to 24.

2 Claims, No Drawings

RESIST POLYMER, PROCESS FOR PRODUCTION THEREOF, RESIST COMPOSITION, AND PROCESS FOR PRODUCTION OF SUBSTRATED WITH PATTERNS THEREON

CROSS REFERENCE TO RELATED APPLICATION

This application is a 371 of PCT/JP05/016297, filed on Sep. 6, 2005, and claims priority to Japanese Patent Application No. 2004-264051, filed on Sep. 10, 2004.

TECHNICAL FIELD

The present invention relates to a resist polymer, a process for production thereof, a resist composition containing the resist polymer, and a process for production of substrates with patterns thereon. In particular, the present invention relates to a resist composition suitable for fine processing using an excimer laser or electron beams.

BACKGROUND ART

In recent years, minimization has quickly progressed as a result of the development of lithographic techniques in the field of fine processing for production of semiconductor elements or liquid crystal elements. As such means for the minimization, generally, the wavelength of irradiation light has been shortened. Specifically, such irradiation light has been changed from the conventional ultraviolet ray including g-line (wavelength: 438 nm) and i-line (wavelength: 365 nm) as typical examples, to DUV (Deep Ultra Violet) of shorter wavelengths.

At present, a KrF excimer laser (wavelength: 248 nm) lithographic technique has been introduced into the market, and an ArF excimer laser (wavelength: 193 nm) lithographic technique and an $F_2$ excimer laser (wavelength: 157 nm) lithographic technique, which are directed towards further shortening the wavelength, are being studied. Furthermore, recently, immersion lithographic techniques thereof are being studied. Moreover, an electron beam lithographic technique, which somewhat differs from the above techniques, is also being intensively studied.

As a resist with high resolution for such irradiation light of a short wavelength or electron beams, a "chemically amplified resist" containing a photoacid generator has been proposed. At present, the improvement and development of this chemically amplified resist have been progressing.

For example, as a chemically amplified resist resin used in the ArF excimer laser lithography, an acrylic resin that is transparent to light of a wavelength of 193 nm has become a focus of attention. As such an acrylic resin, for example, a polymer of (meth)acrylate having an adamantane skeleton at an ester moiety thereof and (meth)acrylate having a lactone skeleton at an ester moiety thereof is disclosed in Patent Document 1, Patent Document 2, and the like.

However, when these acrylic resins are used as resist resins, at the time of development processing by means of an alkali developer for producing resist patterns, defect of development which is referred to as a "defect" may occur. Due to this defect, voids appear in a resist pattern, and as a result, disconnection or defect of a circuit may occur and the yield of the production process of semiconductors may be decreased. These polymers are produced without using a chain transfer agent such as thiols, causing a problem of broad molecular weight distribution.

Patent Document 3 discloses a resin having a carboxylic acid group on at least one terminal of its molecular chain and having the solubility to an alkali developer increased by the action of an acid. However, in the resist composition containing the resin, during storage of the resist composition, a carboxylic acid at the molecular terminal may cause an elimination reaction of functional groups which become alkali-soluble by an acid, the resist performance such as a change in the sensitivity may be deteriorated.

Patent Document 4 discloses a resin containing constituent units having adamanthyl skeletons and constituent units having lactone skeletons, and having a velocity of dissolution in an alkali developer increased by the action of an acid, wherein at least one terminal of its molecular chain is a specific group such as a thiohydroxy group and a thiocarboxy group derived from a sulfur-containing chain transfer agent.

Since such resins are produced using a sulfur-containing chain transfer agent, the molecular weight distribution is narrow. However, while being stored, decomposition of a photoacid generator may be promoted, the resist performance such as a change in the sensitivity may be deteriorated.

Meanwhile, Patent Document 5 discloses a method for manufacturing a polymeric compound for a photoresist containing constituent units having adamanthyl skeletons and constituent units having lactone skeletons, and having a velocity of dissolution in an alkali changed by the action of an acid, wherein polymerization is performed using one or more solvents such as propylene glycol monomethyl ether acetate (hereunder, referred to as PGMEA) and a mixed solvent of propylene glycol monomethyl ether/PGMEA, as a polymerization solvent.

However, a resin obtained by the method for manufacturing a polymeric compound for a photoresist has a superior solubility in a resist solvent but a small number of hydrophilic terminals, and thus a poor compatibility into an alkali developer and a broad molecular weight distribution. Therefore, as well as Patent Document 1 and Patent Document 2, voids appear in a resist pattern due to a defect, and as a result, disconnection or defect of a circuit may occur and the yield of the production process of semiconductors may be decreased.

Furthermore, when a resist polymer containing a constituent unit having a hydrophilic group is to be produced, if reprecipitation is performed using PGMEA as a polymerization solvent, and methanol or a mixed solvent of ethanol/water as a poor solvent, then the precipitated polymer may become a sticky substance, the polymer may be unable to smoothly pass through the production process of polymers.

Patent Document 1: Japanese Unexamined Patent Application, First Publication H 10-319595
Patent Document 2: Japanese Unexamined Patent Application, First Publication H 10-274852
Patent Document 3: Japanese Unexamined Patent Application, First Publication H 10-55069
Patent Document 4: Japanese Unexamined Patent Application, First Publication 2001-117232
Patent Document 5: Japanese Unexamined Patent Application, First Publication 2003-206315

DISCLOSURE OF THE INVENTION

Problems to be Solved by the Invention

The present invention is to provide: a resist polymer, having a high sensitivity, a high resolution, a narrow molecular weight distribution, a superior storage stability of a resist composition produced using the resist polymer, and an excellent passing property in the production process (powder property of reprecipitated wet powder), when the resist polymer is used for a resist composition in DUV excimer laser lithography, electron beam lithography, and the like; a process for production thereof; a resist composition containing the resist polymer; and a process for production of substrates with patterns thereon using this resist composition.

Means for Solving the Problems

The present inventors have intensively studied to solve the above problems, and in particular focused on constituent units of a resist polymer and a polymerization solvent for producing a resist polymer. As a result, they have found that the above problems can be solved by using a resist polymer containing specific constituent units obtained by polymerization using a specific polymerization solvent, for a resist composition, and completed the present invention.

That is, a first aspect of the present invention is a resist polymer (Y') containing a polymer (Y) comprising: a constituent unit (A) having a lactone skeleton, a constituent unit (B) having an acid-eliminable group, a constituent unit (C) having a hydrophilic group, and a constituent unit (E) having a structure represented by the following formula (1) wherein a content of the constituent units (E) is 0.3 mol % or more based on the total number of the constituent units of the resist polymer (Y'):

[Chemical formula 1]

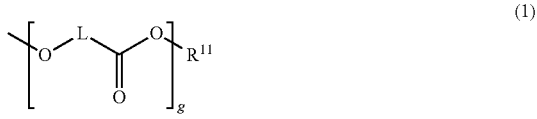

(1)

in the formula 1, L is a divalent linear, branched, or cyclic $C_{1-20}$ hydrocarbon group which may have a substituent and/or a heteroatom; $R^{11}$ is a g-valent linear, branched, or cyclic $C_{1-20}$ hydrocarbon group which may have a substituent and/or a heteroatom; and g represents an integer of 1 to 24.

A second aspect of the present invention is a process for production of a resist polymer by polymerizing a monomer (a) composing the constituent unit (A) having a lactone skeleton, a monomer (b) composing the constituent unit (B) having an acid-eliminable group, and a monomer (c) composing the constituent unit (C) having a hydrophilic group, in a polymerization solvent containing a hydroxy group-containing ester (e) of 25 mass % or more based on the sum total of the polymerization solvent.

A third aspect of the present invention is a resist composition containing the resist polymer or a resist polymer obtained by the process for production.

A fourth aspect of the present invention is a process for production of substrates with patterns thereon, comprising: applying the resist composition onto a substrate, on which a pattern is to be formed; exposing with light of wavelength of 250 nm or less; and developing using a developer.

Effects of the Invention

The resist polymer of the present invention has an excellent passing property in the production process (powder property of reprecipitated wet powder). The resist composition containing the resist polymer has a high sensitivity, a high resolution, less defect at the time of development due to a narrow molecular weight distribution, and superior storage stability when it is made as a resist composition since it does not contain a sulfur atom. Moreover, the process for production of the resist polymer of the present invention enables to produce a resist polymer having such properties with an excellent productivity.

The resist polymer and the resist composition of the present invention can be suitably used for DUV excimer laser lithography, immersion lithography and electron beam lithography thereof, in particular, ArF excimer laser lithography and immersion lithography thereof. By the process for production of patterns of the present invention, highly accurate and fine resist patterns can be formed, and thereby substrates with highly accurate and fine patterns thereon can be produced.

BEST MODE FOR CARRYING OUT THE INVENTION

The resist polymer (Y') of the present invention is described.

The resist polymer (Y') of the present invention contains a polymer (Y). The polymer (Y) comprises a constituent unit (A) having a lactone skeleton, a constituent unit (B) having an acid-eliminable group, a constituent unit (C) having a hydrophilic group, and a constituent unit (E) having a structure represented by the following formula (1):

[Chemical formula 2]

(1)

[In the formula 1, L is a divalent linear, branched, or cyclic $C_{1-20}$ hydrocarbon group which may have a substituent and/or a heteroatom; $R^{11}$ is a g-valent linear, branched, or cyclic $C_{1-20}$ hydrocarbon group which may have a substituent and/or a heteroatom; and g represents an integer of 1 to 24].

The constituent unit (A) having a lactone skeleton is described.

The constituent unit (A) having a lactone skeleton demonstrates an effect of expressing an adhesiveness of the resist composition to a substrate.

The content of the constituent unit (A) is not specifically limited. However, from the point of the adhesiveness to a substrate, it is preferably 30 mol % or more based on the total number of the constituent units of the resist polymer (Y'), and more preferably 35 mol % or more. Moreover, from the point of the sensitivity and the resolution of the resist, it is preferably 60 mol % or less, more preferably 55 mol % or less, and further more preferably 50 mol % or less.

Furthermore, if the constituent unit (A) has a group that is decomposed or eliminated by the action of an acid, it tends to have much more superior sensitivity. In this case, the constituent unit (A) also corresponds to the constituent unit (B) described later. However, in the present invention, such a constituent unit is considered as the constituent unit (A).

Moreover, if the constituent unit (A) has a hydrophilic group, the resist pattern rectangularity tends to be excellent. In this case, the constituent unit (A) also corresponds to the constituent unit (C) described later. However, in the present invention, such a constituent unit is considered as the constituent unit (A).

The constituent unit (A) having a lactone skeleton is not specifically limited. However, from the point of the sensitivity or the dry etching resistance, it is preferably at least one type selected from a group consisting of the following formulae (4-1) to (4-4).

[Chemical formula 3]

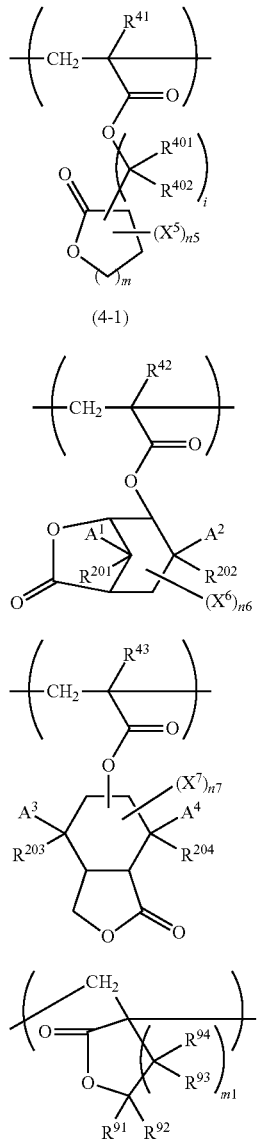

[In the formula (4-1), $R^{41}$ represents a hydrogen atom or a methyl group; $R^{401}$ and $R^{402}$ independently represent a hydrogen atom, a linear or branched $C_{1-6}$ alkyl group, a hydroxy group, a carboxy group, or a carboxy group esterified with $C_{1-6}$ alcohol; or $R^{401}$ and $R^{402}$ together represent —O—, —S—, —NH—, or a $C_{1-6}$ methylene chain [—$(CH_2)_j$— (wherein j represents an integer of 1 to 6)]; i represents 0 or 1; $X^5$ represents a linear or branched $C_{1-6}$ alkyl group, a hydroxy group, a carboxy group, a $C_{1-6}$ acyl group, a $C_{1-6}$ alkoxy group, a carboxy group esterified with $C_{1-6}$ alcohol, or an amino group; the linear or branched $C_{1-6}$ alkyl group may have, as a substituent, at least one group selected from a group consisting of a hydroxy group, a carboxy group, a $C_{1-6}$ acyl group, a $C_{1-6}$ alkoxy group, a carboxy group esterified with $C_{1-6}$ alcohol, a cyano group, and an amino group; n5 represents an integer of 0 to 4; m represents 1 or 2; and $X^5$ may have a plurality of different groups if n5 is 2 or more.

In the formula (4-2), $R^{42}$ represents a hydrogen atom or a methyl group; $R^{201}$ and $R^{202}$ independently represent a hydrogen atom, a linear or branched $C_{1-6}$ alkyl group, a hydroxy group, a carboxy group, or a carboxy group esterified with $C_{1-6}$ alcohol; $A^1$ and $A^2$ independently represents a hydrogen atom, a linear or branched $C_{1-6}$ alkyl group, a hydroxy group, a carboxy group, or a carboxy group esterified with $C_{1-6}$ alcohol; or $A^1$ and $A^2$ together represent —O—, —S—, —NH—, or a $C_{1-6}$ methylene chain [—$(CH_2)_k$— (wherein k represents an integer of 1 to 6)]; $X^6$ represents a linear or branched $C_{1-6}$ alkyl group, a hydroxy group, a carboxy group, a $C_{1-6}$ acyl group, a $C_{1-6}$ alkoxy group, a carboxy group esterified with $C_{1-6}$ alcohol, a cyano group, or an amino group; the linear or branched $C_{1-6}$ alkyl group may have, as a substituent, at least one group selected from a group consisting of a hydroxy group, a carboxy group, a $C_{1-6}$ acyl group, a carboxy group esterified with $C_{1-6}$ alcohol, a cyano group, and an amino group; n6 represents an integer of 0 to 4; and $X^6$ may have a plurality of different groups if n6 is 2 or more.

In the formula (4-3), $R^{43}$ represents a hydrogen atom or a methyl group; $R^{203}$ and $R^{204}$ independently represent a hydrogen atom, a linear or branched $C_{1-6}$ alkyl group, a hydroxy group, a carboxy group, or a carboxy group esterified with $C_{1-6}$ alcohol; $A^3$ and $A^4$ independently represent a hydrogen atom, a linear or branched $C_{1-6}$ alkyl group, a hydroxy group, a carboxy group, or a carboxy group esterified with $C_{1-6}$ alcohol; or $A^3$ and $A^4$ together represent —O—, —S—, —NH—, or a $C_{1-6}$ methylene chain [—$(CH_2)_l$— (wherein l represents an integer of 1 to 6)]; $X^7$ represents a linear or branched $C_{1-6}$ alkyl group, a hydroxy group, a carboxy group, a $C_{1-6}$ acyl group, a $C_{1-6}$ alkoxy group, a carboxy group esterified with $C_{1-6}$ alcohol, a cyano group, or an amino group; the linear or branched $C_{1-6}$ alkyl group may have, as a substituent, at least one group selected from a group consisting of a hydroxy group, a carboxy group, a $C_{1-6}$ acyl group, a carboxy group esterified with $C_{1-6}$ alcohol, a cyano group, and an amino group; n7 represents an integer of 0 to 4; and $X^7$ may have a plurality of different groups if n7 is 2 or more.

In the formula (4-4), $R^{91}$, $R^{92}$, $R^{93}$, and $R^{94}$ independently represent a hydrogen atom, a linear or branched $C_{1-6}$ alkyl group, a hydroxy group, a carboxy group, or a carboxy group esterified with $C_{1-6}$ alcohol; or $R^{91}$ and $R^{92}$ together represent —O—, —S—, —NH—, or a $C_{1-6}$ methylene chain [—$(CH_2)_t$— (wherein t represents an integer of 1 to 6)]; and m1 represents 1 or 2.]

In the formula (4-1), preferably, n5 is 0 from the point of a high dry etching resistance.

In the formula (4-1), preferably, m is 1 from the point of the sensitivity and the resolution.

In the formula (4-2), preferably, $A^1$ and $A^2$ together represent —$CH_2$— or —$CH_2CH_2$— from the point of a high dry etching resistance, and together represent —O— from the point of a high solubility into an organic solvent.

In the formula (4-2), preferably, $R^{201}$ and $R^{202}$ independently represent a hydrogen atom, a methyl group, an ethyl group, or an isopropyl group from the point of a high solubility into an organic solvent.

In the formula (4-2), preferably, n6 is 0 from the point of a high dry etching resistance.

In the formula (4-3), preferably, $A^3$ and $A^4$ together represent —$CH_2$— or —$CH_2CH_2$— from the point of a high dry etching resistance, and together represent —O— from the point of a high solubility into an organic solvent.

In the formula (4-3), preferably, $R^{203}$ and $R^{204}$ independently represent a hydrogen atom, a methyl group, an ethyl group, or an isopropyl group from the point of a high solubility into an organic solvent.

In the formula (4-3), preferably, n7 is 0 from the point of a high dry etching resistance.

In the formula (4-4), preferably, $R^{91}$, $R^{92}$, $R^{93}$, and $R^{94}$ independently represent a hydrogen atom or a methyl group from the point of a high solubility into an organic solvent.

In the formula (4-4), preferably, m1 is 1 from the point of the sensitivity and the resolution.

The constituent unit (A) having a lactone skeleton may be solely used or a plurality of types thereof may be used in combination, as required.

The polymer comprising a constituent unit (A) having a lactone skeleton can be produced by polymerizing monomers containing a monomer (a) composing the constituent unit (A) having a lactone skeleton.

This monomer (a) is not specifically limited. Examples thereof include monomers represented by the following formulae (10-1) to (10-24). In the formulae (10-1) to (10-24), R represents a hydrogen atom or a methyl group.

[Chemical formula 4]

(10-1)
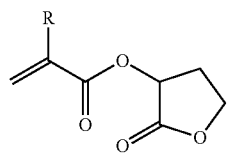

(10-2)
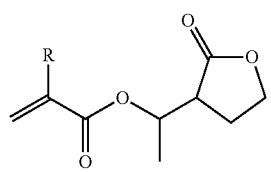

(10-3)
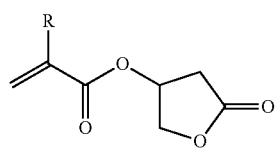

(10-4)
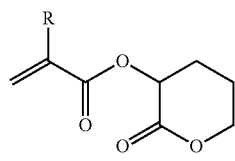

(10-5)
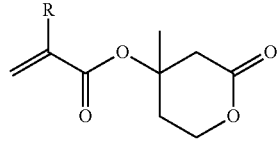

(10-6)
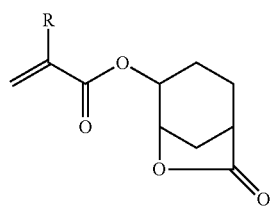

-continued (10-7)
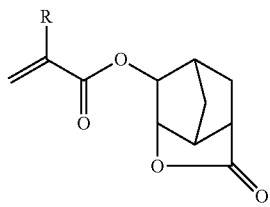

(10-8)
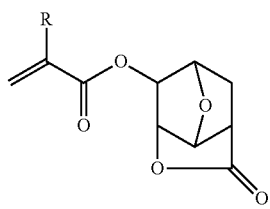

(10-9)
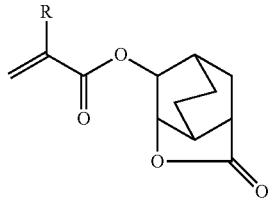

(10-10)
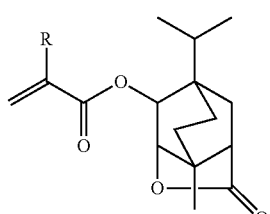

(10-11)
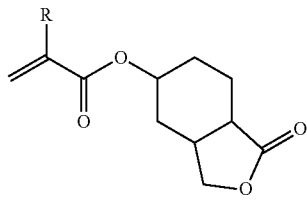

(10-12)
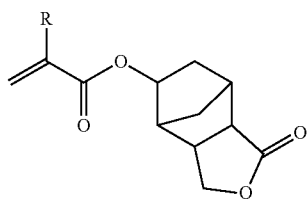

(10-13)
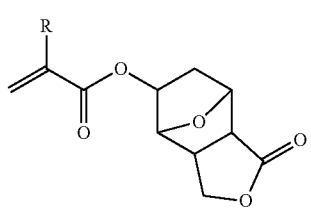

-continued

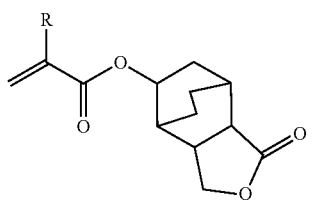
(10-14)

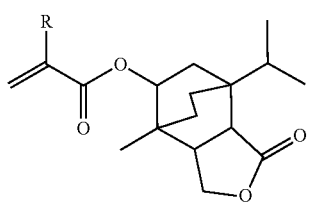
(10-15)

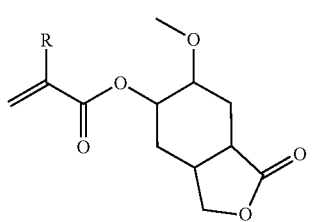
(10-16)

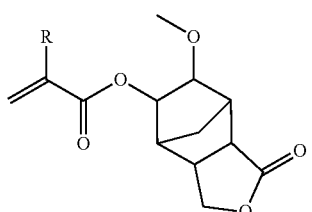
(10-17)

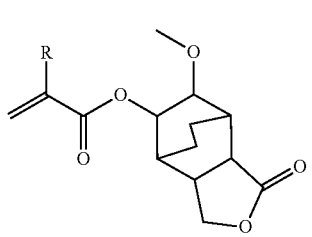
(10-18)

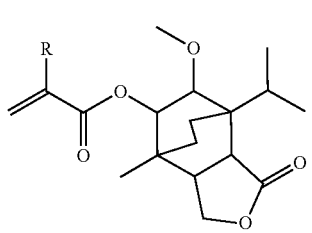
(10-19)

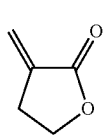
(10-20)

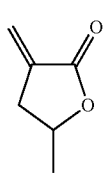
(10-21)

-continued (10-22)

(10-23)

(10-24)

Among them, from the point of the sensitivity, monomers represented by the above formulae (10-1) to (10-3) and (10-5), and geometrical/optical isomers thereof are more preferred. From the point of the dry etching resistance, monomers represented by the above formulae (10-7), (10-9), (10-10), (10-12), (10-14), and (10-24), and geometrical/optical isomers thereof are more preferred. From the point of the solubility into a resist solvent, monomers represented by the above formulae (10-8), (10-13), and (10-16) to (10-23), and geometrical/optical isomers thereof are more preferred.

The constituent unit (B) having an acid-eliminable group is described.

Here, the "acid-eliminable group" means a group that is decomposed or eliminated by the action of an acid.

The constituent unit (B) having an acid-eliminable group is a component that becomes alkali-soluble by an acid, and demonstrates an effect of enabling resist pattern formation.

The content of the constituent unit (B) is not specifically limited. From the point of the sensitivity and the resolution, it is preferably 20 mol % or more based on the total number of the constituent units of the resist polymer (Y'), and more preferably 25 mol % or more. From the point of the adhesiveness onto the substrate surface or the like, it is preferably 60 mol % or less, more preferably 55 mol % or less, and further more preferably 50 mol % or less.

If the constituent unit (B) has a lactone skeleton, the substrate adhesiveness tends to become favorable. In this case, the constituent unit (B) also corresponds to the constituent unit (A). However, in the present invention, such a constituent unit is considered as the constituent unit (A).

Moreover, if the constituent unit (B) has a hydrophilic group, it tends to have much more superior sensitivity. In this case, the constituent unit (B) also corresponds to the constituent unit (C) described later. However, in the present invention, such a constituent unit is considered as the constituent unit (B).

The constituent unit (B) having an acid-eliminable group is not specifically limited. From the point of a high dry etching resistance required for a resist, it is preferably at least one type selected from a group consisting of the following formulae (3-1-1), (3-2-1), (3-3-1), (3-4-1), (3-5-1), (3-6-1), (3-7-1), and (3-8-1).

[Chemical formula 5]

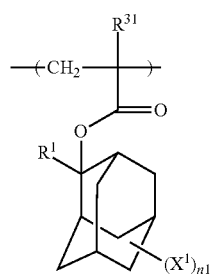 (3-1-1)

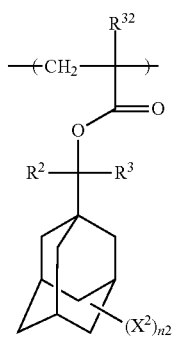 (3-2-1)

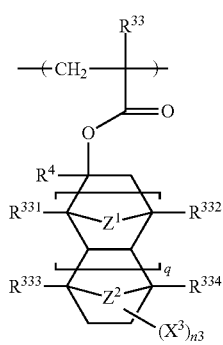 (3-3-1)

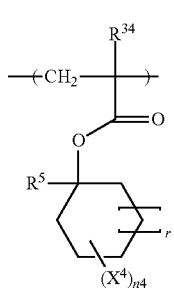 (3-4-1)

-continued

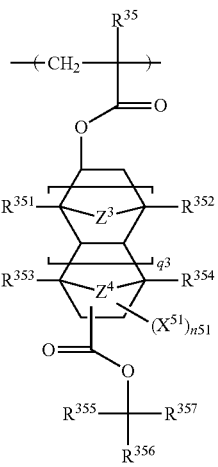 (3-5-1)

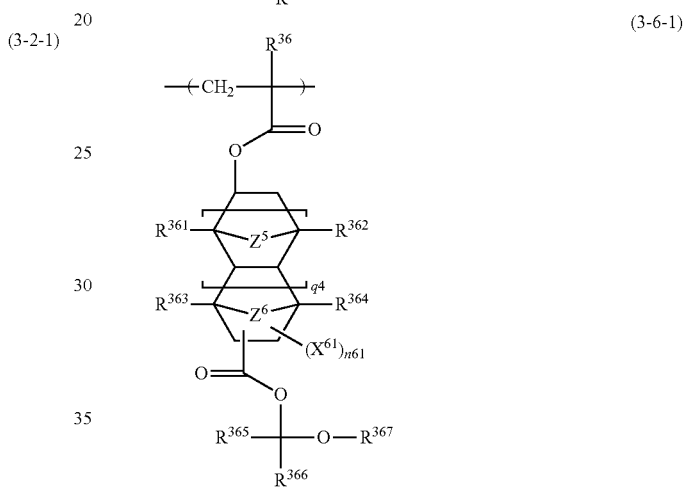 (3-6-1)

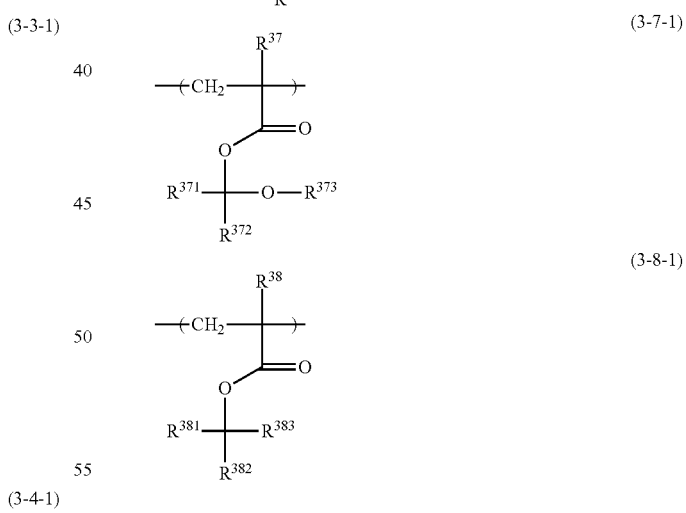 (3-7-1)

(3-8-1)

[In the formula (3-1-1), $R^{31}$ represents a hydrogen atom or a methyl group; $R^1$ represents a $C_{1-3}$ alkyl group; $X^1$ represents a linear or branched $C_{1-6}$ alkyl group; n1 represents an integer of 0 to 4; and $X^1$ may have a plurality of different groups if n1 is 2 or more.

In the formula (3-2-1), $R^{32}$ represents a hydrogen atom or a methyl group; $R^2$ and $R^3$ independently represent a $C_{1-3}$ alkyl group; $X^2$ represents a linear or branched $C_{1-6}$ alkyl group; n2 represents an integer of 0 to 4; and $X^2$ may have a plurality of different groups if n2 is 2 or more.

In the formula (3-3-1), $R^{33}$ represents a hydrogen atom or a methyl group; $R^4$ represents a $C_{1-3}$ alkyl group; $R^{331}$, $R^{332}$, $R^{333}$, and $R^{334}$ independently represent a hydrogen atom or a linear or branched $C_{1-6}$ alkyl group; $Z^1$ and $Z^2$ independently represent —O—, —S—, —NH—, or a $C_{1-6}$ methylene chain $[-(CH_2)_{u1}-]$ (wherein u1 represents an integer of 1 to 6)]; $X^3$ represents a linear or branched $C_{1-6}$ alkyl group; n3 represents an integer of 0 to 4; q represents 0 or 1; and $X^3$ may have a plurality of different groups if n3 is 2 or more.

In the formula (3-4-1), $R^{34}$ represents a hydrogen atom or a methyl group; $R^5$ represents a $C_{1-3}$ alkyl group; $X^4$ represents a linear or branched $C_{1-6}$ alkyl group; n4 represents an integer of 0 to 4; r represents an integer of 0 to 2; and $X^4$ may have a plurality of different groups if n4 is 2 or more.

In the formula (3-5-1), $R^{35}$ represents a hydrogen atom or a methyl group; $R^{351}$, $R^{352}$, $R^{353}$, and $R^{354}$ independently represent a hydrogen atom or a linear or branched $C_{1-6}$ alkyl group; $Z^3$ and $Z^4$ independently represent —O—, —S—, —NH—, or a $C_{1-6}$ methylene chain $[-(CH_2)_{u11}-]$ (wherein u11 represents an integer of 1 to 6)]; $X^{51}$ represents a linear or branched $C_{1-6}$ alkyl group; n51 represents an integer of 0 to 4; and q3 represents 0 or 1. $R^{355}$, $R^{356}$, and $R^{357}$ independently represent a monovalent $C_{4-20}$ alicyclic hydrocarbon group or the derivative thereof, or a linear or branched $C_{1-4}$ alkyl group; and at least one of $R^{355}$, $R^{356}$, and $R^{357}$ is the alicyclic hydrocarbon group or the derivative thereof; or any two of $R^{355}$, $R^{356}$, and $R^{357}$ are bonded to each other to form a divalent $C_{4-20}$ alicyclic hydrocarbon group or the derivative thereof, together with the carbon atoms bonded to the respective groups, and the other one of $R^{355}$, $R^{356}$ and $R^{357}$ which was not bonded represents a linear or branched $C_{1-4}$ alkyl group or a monovalent $C_{4-20}$ alicyclic hydrocarbon group or the derivative thereof. $X^{51}$ may have a plurality of different groups if n51 is 2 or more.

In the formula (3-6-1), $R^{36}$ represents a hydrogen atom or a methyl group; $R^{361}$, $R^{362}$, $R^{363}$, and $R^{364}$ independently represent a hydrogen atom or a linear or branched $C_{1-6}$ alkyl group; $Z^5$ and $Z^6$ independently represent —O—, —S—, —NH—, or a $C_{1-6}$ methylene chain $[-(CH_2)_{u12}-]$ (wherein u12 represents an integer of 1 to 6)]; $X^{61}$ represents a linear or branched $C_{1-6}$ alkyl group; n61 represents an integer of 0 to 4; and q4 represents 0 or 1. $R^{367}$ represents a monovalent $C_{4-20}$ alicyclic hydrocarbon group or the derivative thereof, or a linear or branched $C_{1-4}$ alkyl group; $R^{365}$ and $R^{366}$ independently represent a hydrogen atom or a linear or branched $C_{1-4}$ alkyl group; or $R^{365}$ and $R^{367}$, or $R^{366}$, and $R^{367}$ are bonded to each other to form a divalent $C_{4-20}$ alicyclic hydrocarbon group or the derivative thereof, together with the carbon atoms bonded to the respective groups, and the other one of $R^{365}$ and $R^{366}$ which was not bonded represents a hydrogen atom. $X^{61}$ may have a plurality of different groups if n61 is 2 or more.

In the formula (3-7-1), $R^{37}$ represents a hydrogen atom or a methyl group; $R^{373}$ represents a monovalent $C_{4-20}$ alicyclic hydrocarbon group or the derivative thereof, or a linear or branched $C_{1-4}$ alkyl group; $R^{371}$ and $R^{372}$ independently represent a hydrogen atom or a linear or branched $C_{1-4}$ alkyl group; or $R^{371}$ and $R^{373}$, or $R^{372}$ and $R^{373}$ are bonded to each other to form a divalent $C_{4-20}$ alicyclic hydrocarbon group or the derivative thereof, together with the carbon atoms bonded to the respective groups, and the other one of $R^{371}$ and $R^{372}$ which was not bonded represents a hydrogen atom.

In the formula (3-8-1), $R^{38}$ represents a hydrogen atom or a methyl group. $R^{381}$, $R^{382}$, and $R^{383}$ independently represent a linear or branched $C_{1-4}$ alkyl group.]

In the formula (3-1-1), preferably, $R^1$ represents a methyl group, an ethyl group, or an isopropyl group from the point of the sensitivity and the resolution.

In the formula (3-1-1), preferably, n1 is 0 from the point of a high dry etching resistance.

In the formula (3-2-1), preferably, $R^2$ and $R^3$ independently represent a methyl group, an ethyl group, or an isopropyl group from the point of the sensitivity and the resolution.

In the formula (3-2-1), preferably, n2 is 0 from the point of a high dry etching resistance.

In the formula (3-3-1), preferably, $R^4$ represents a methyl group, an ethyl group, or an isopropyl group from the point of the sensitivity and the resolution.

In the formula (3-3-1), preferably, $Z^1$ and $Z^2$ independently represent —$CH_2$— or —$CH_2CH_2$— from the point of a high dry etching resistance.

In the formula (3-3-1), preferably, $R^{331}$, $R^{332}$, $R^{333}$, and $R^{334}$ independently represent a hydrogen atom, a methyl group, an ethyl group, or an isopropyl group from the point of a high solubility into an organic solvent.

In the formula (3-3-1), preferably, n3 is 0 from the point of a high dry etching resistance.

In the formula (3-3-1), preferably, q is 1 from the point of a high dry etching resistance, and q is 0 from the point of a high solubility into an organic solvent.

In the formula (3-4-1), preferably, $R^5$ represents a methyl group, an ethyl group, or an isopropyl group from the point of the sensitivity and the resolution.

In the formula (3-4-1), preferably, n4 is 0 from the point of a high dry etching resistance.

In the formula (3-4-1), preferably, r is 1 from the point of a high dry etching resistance, and r is 0 from the point of a high solubility into an organic solvent.

In the formula (3-5-1), preferably, $Z^3$ and $Z^4$ independently represent —$CH_2$— or —$CH_2CH_2$— from the point of a high dry etching resistance.

In the formula (3-5-1), preferably, $R^{351}$, $R^{352}$, $R^{353}$, and $R^{354}$ independently represent a hydrogen atom, a methyl group, an ethyl group, or an isopropyl group from the point of a high solubility into an organic solvent.

In the formula (3-5-1), preferably, n51 is 0 from the point of a high dry etching resistance.

In the formula (3-5-1), preferably, q3 is 1 from the point of a high dry etching resistance, and q3 is 0 from the point of a high solubility into an organic solvent.

In the formula (3-5-1), preferably, —$C(R^{355})(R^{356})(R^{357})$ has a structure represented by the following formulae (K-1) to (K-6) from the point of a superior line edge roughness, and has a structure represented by the following formulae (K-7) to (K-17) from the point of a high dry etching resistance.

[Chemical formula 6]

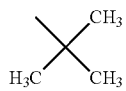

(K-1)

(K-2)

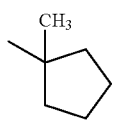 (K-3)

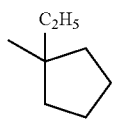 (K-4)

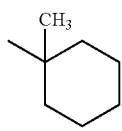 (K-5)

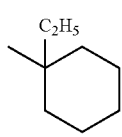 (K-6)

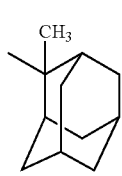 (K-7)

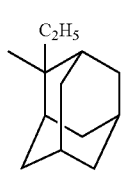 (K-8)

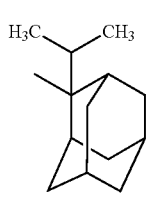 (K-9)

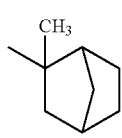 (K-10)

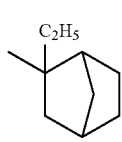 (K-11)

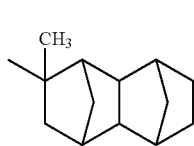 (K-12)

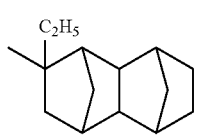 (K-13)

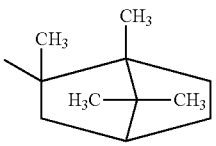 (K-14)

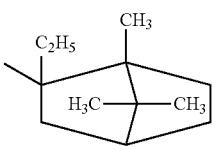 (K-15)

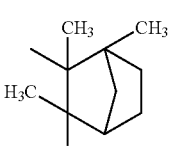 (K-16)

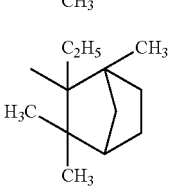 (K-17)

In the formula (3-6-1), preferably, $Z^5$ and $Z^6$ independently represent —$CH_2$— or —$CH_2CH_2$— from the point of a high dry etching resistance.

In the formula (3-6-1), preferably, $R^{361}$, $R^{362}$, $R^{363}$, and $R^{364}$ independently represent a hydrogen atom, a methyl group, an ethyl group, or an isopropyl group from the point of a high solubility into an organic solvent.

In the formula (3-6-1), preferably, n61 is 0 from the point of a high dry etching resistance.

In the formula (3-6-1), preferably, q4 is 1 from the point of a high dry etching resistance, and q4 is 0 from the point of a high solubility into an organic solvent.

In the formula (3-6-1), preferably, —$C(R^{365})(R^{366})$—O—$R^{367}$ has a structure represented by the following formulae (J-1) to (J-24) from the point of a superior line edge roughness, and has a structure represented by the following formulae (J-25) to (J-52) from the point of a high dry etching resistance.

[Chemical formula 7]

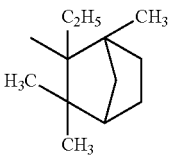

(J-1), (J-2), (J-3), (J-4), (J-5)

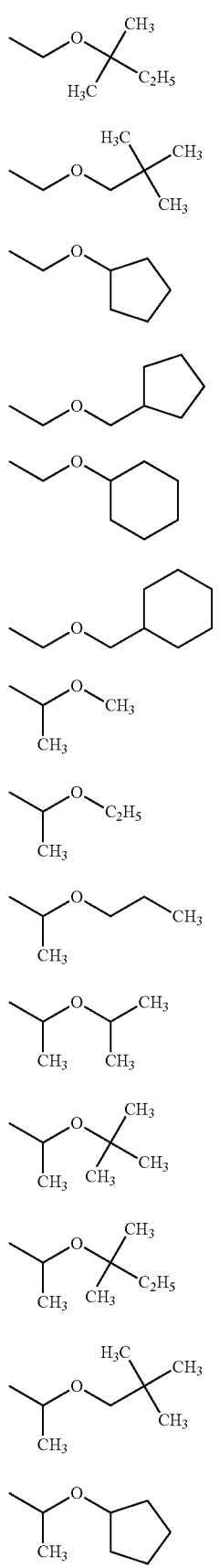
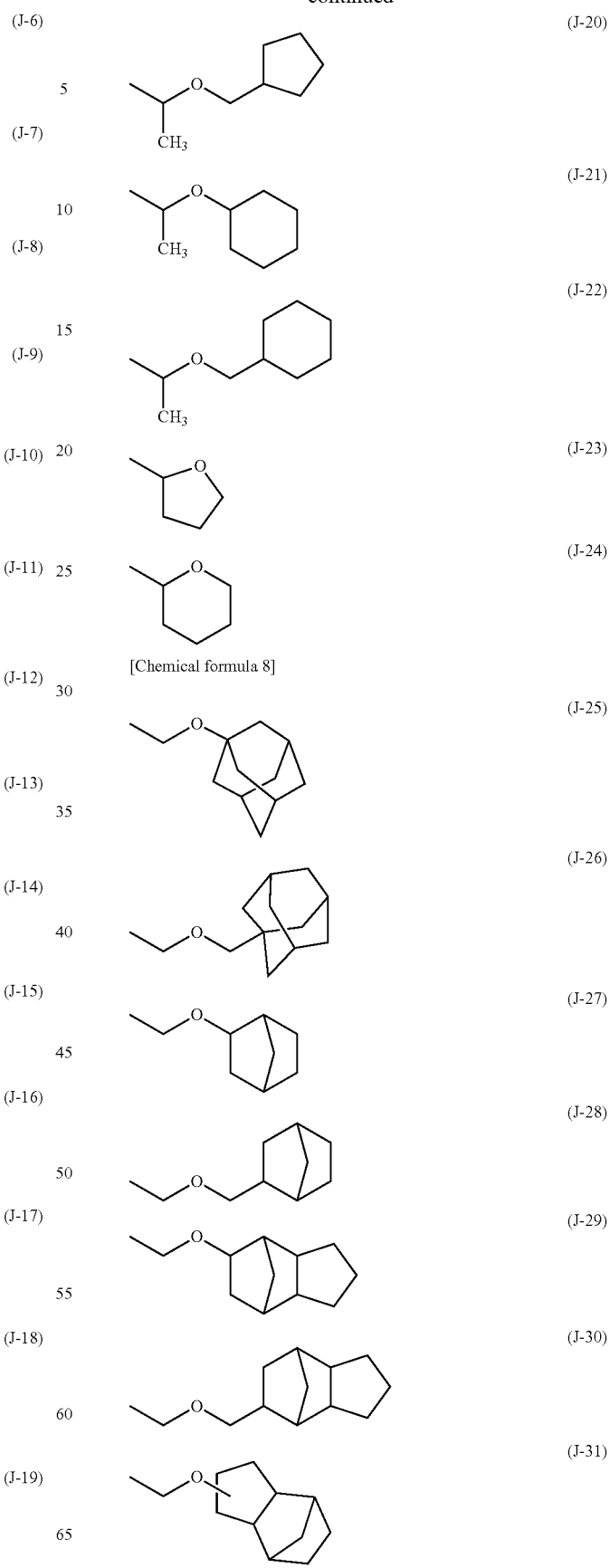

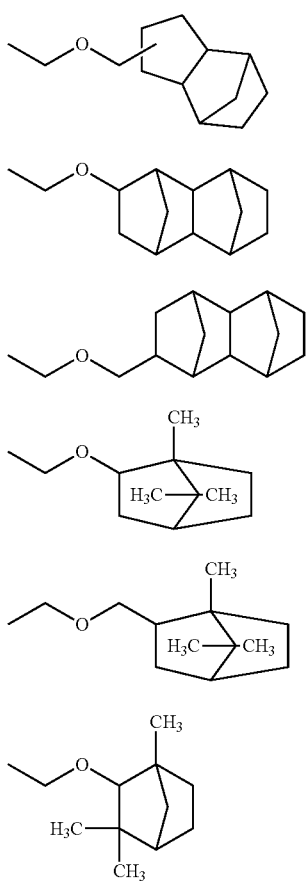
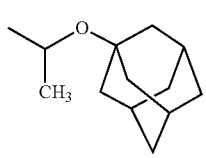
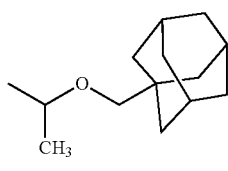
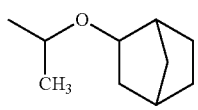
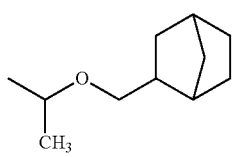
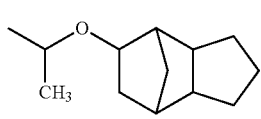
In the formula (3-7-1), preferably, —C(R³⁷¹)(R³⁷²)—O—R³⁷³ has a structure represented by the above formulae (J-1) to (J-24) from the point of a superior line edge roughness, and has a structure represented by the above formulae (J-25) to (J-52) from the point of a high dry etching resistance.

The constituent unit (B) having an acid-eliminable group may be solely used or a plurality of types thereof may be used in combination, as required.

The polymer comprising a constituent unit (B) having an acid-eliminable group can be produced by polymerizing monomers containing a monomer (b) composing the constituent unit (B) having an acid-eliminable group.

This monomer (b) is not specifically limited. However, examples thereof include monomers represented by the following formulae (9-1) to (9-224). In the formulae (9-1) to (9-224), R and R' independently represent a hydrogen atom or a methyl group.

[Chemical formula 10]

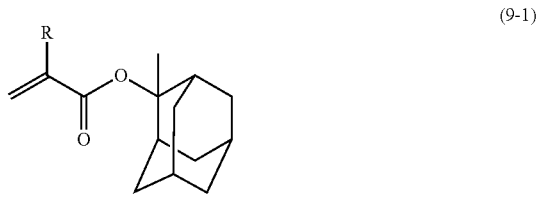

(9-1)

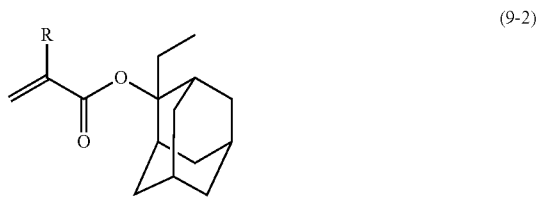

(9-2)

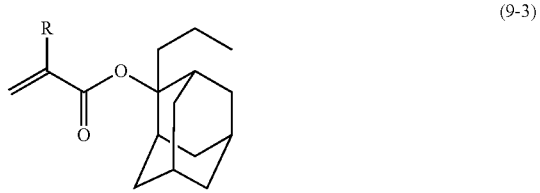

(9-3)

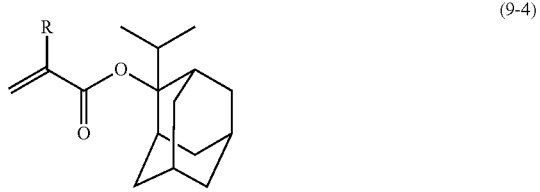

(9-4)

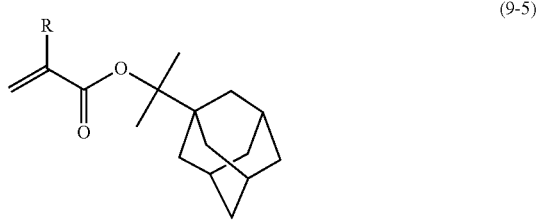

(9-5)

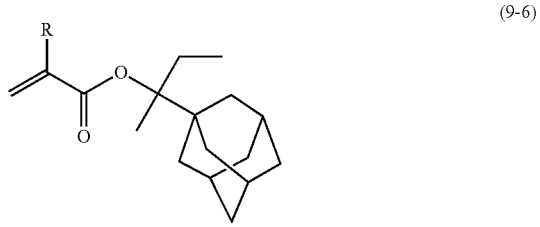

(9-6)

-continued
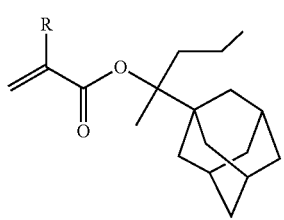
(9-7)
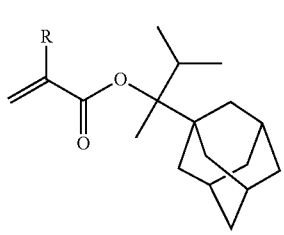
(9-8)
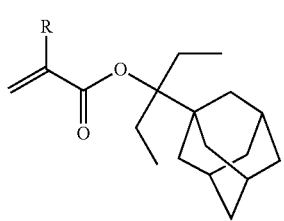
(9-9)
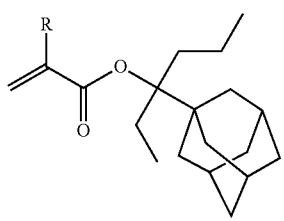
(9-10)
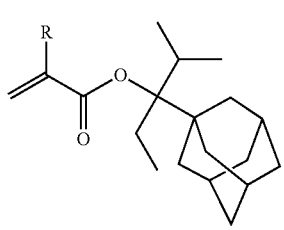
(9-11)
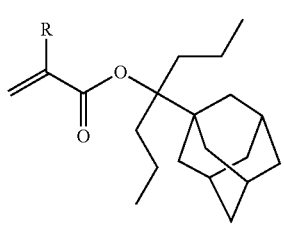
(9-12)

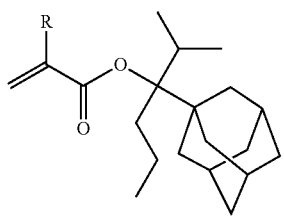
(9-13)
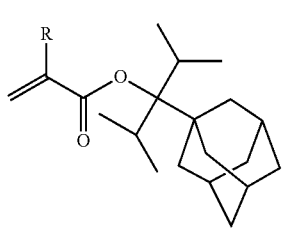
(9-14)
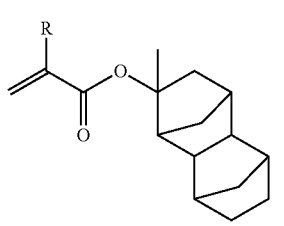
(9-15)
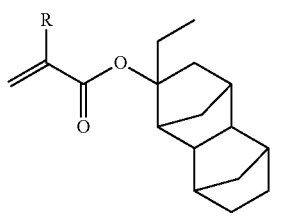
(9-16)
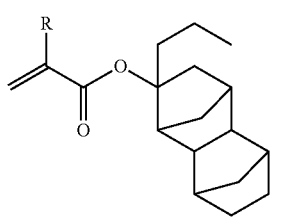
(9-17)
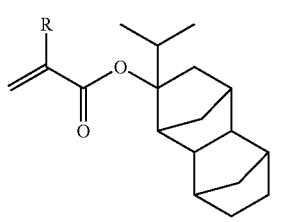
(9-18)
[Chemical formula 11]
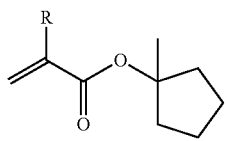
(9-19)

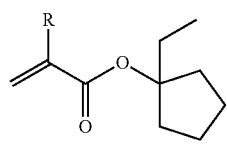
(9-20)
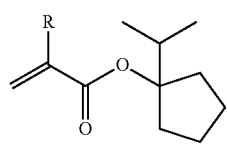
(9-21)
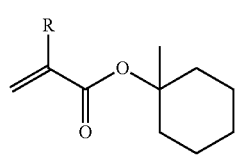
(9-22)
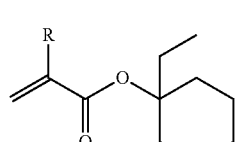
(9-23)
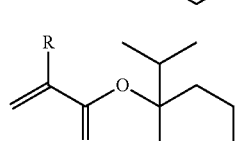
(9-24)
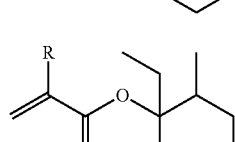
(9-25)
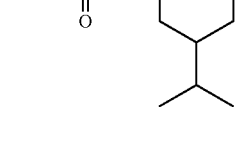
(9-26)
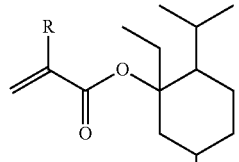
(9-27)
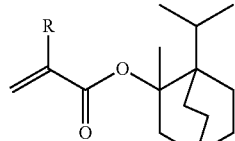
(9-28)
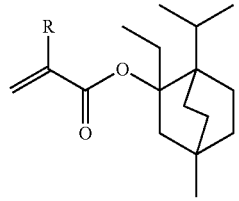

-continued
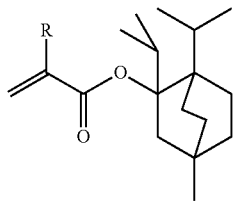 (9-29)
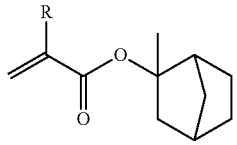 (9-30)
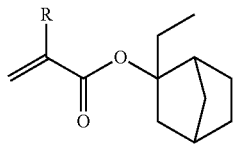 (9-31)
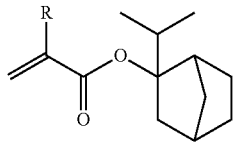 (9-32)
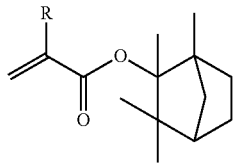 (9-33)
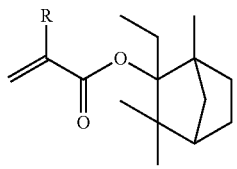 (9-34)
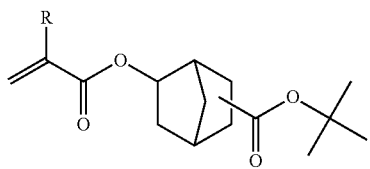 (9-35)
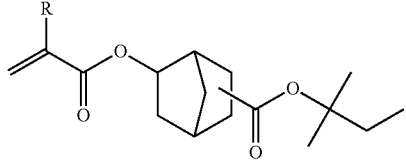 (9-36)
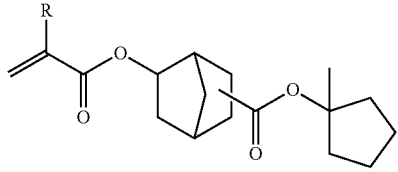 (9-37)

-continued
(9-38)
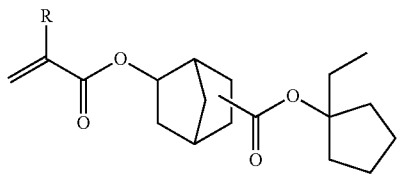
(9-39)
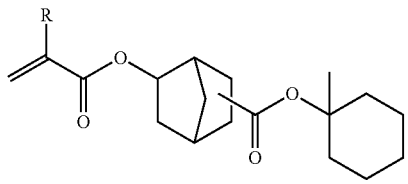
(9-40)
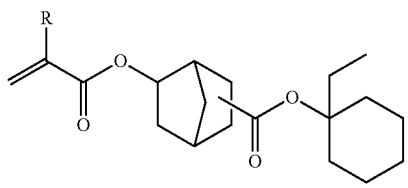
[Chemical formula 12]
(9-41)
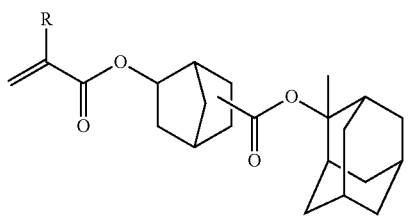
(9-42)
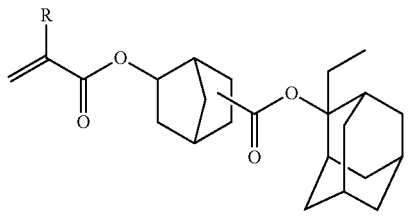
(9-43)
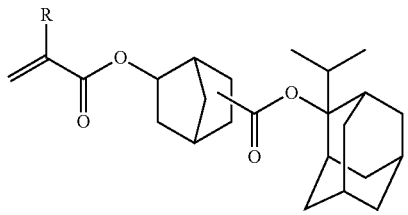
(9-44)
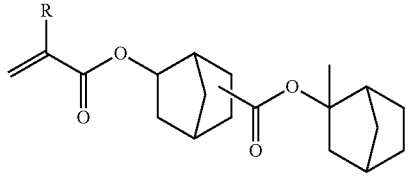
(9-45)
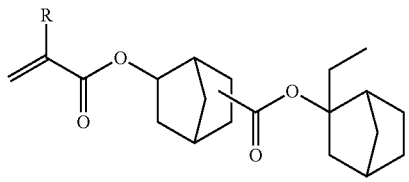

(9-46)
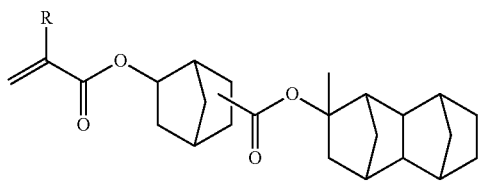
(9-47)
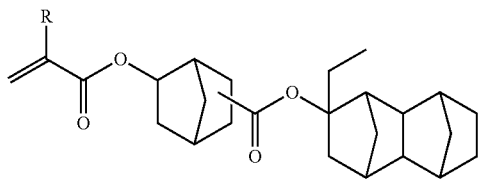
(9-48)
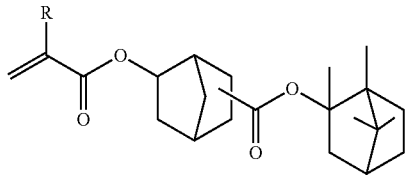
(9-49)
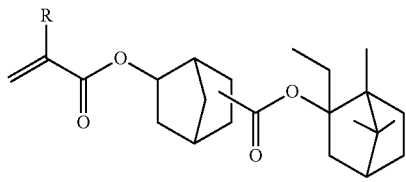
(9-50)
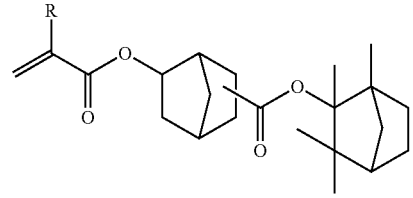
(9-51)
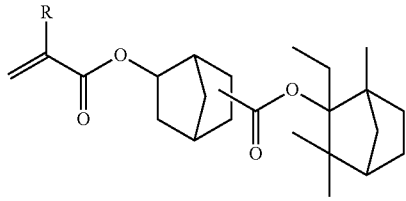
(9-52)
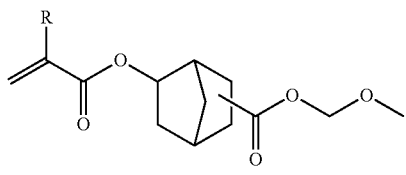
(9-53)
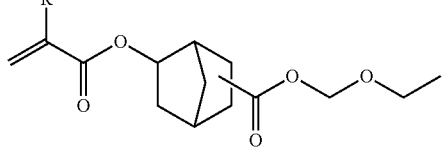

-continued
(9-54)
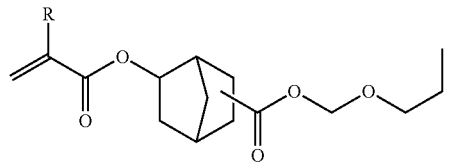
(9-55)
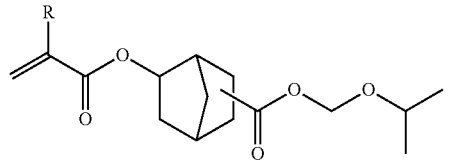
(9-56)
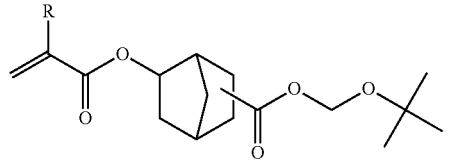
(9-57)
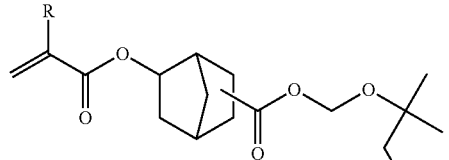
(9-58)
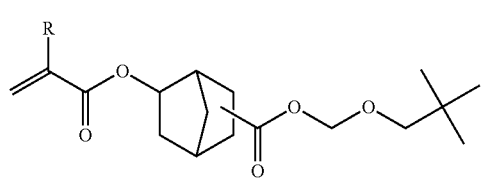
[Chemical formula 13]
(9-59)
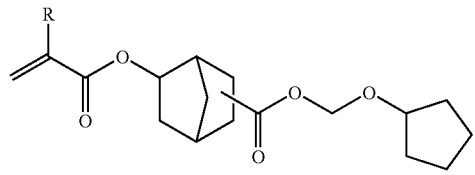
(9-60)
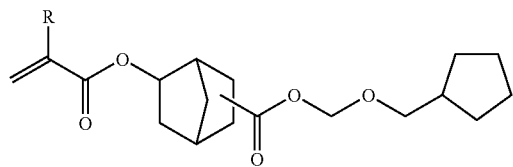
(9-61)
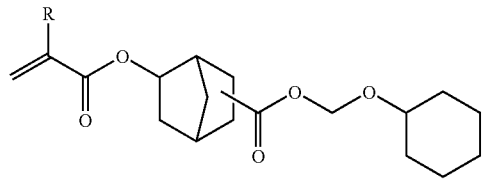

-continued
(9-62)
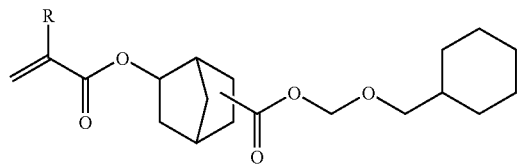
(9-63)
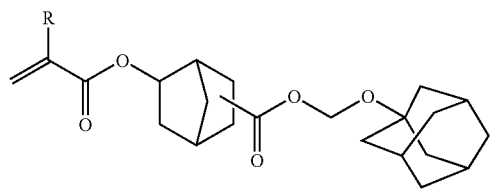
(9-64)
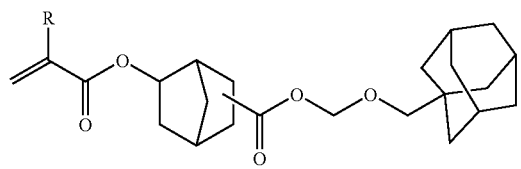
(9-65)
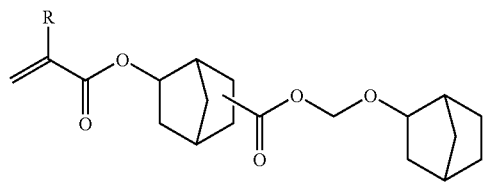
(9-66)
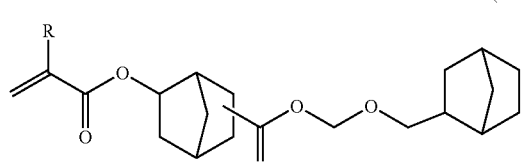
(9-67)
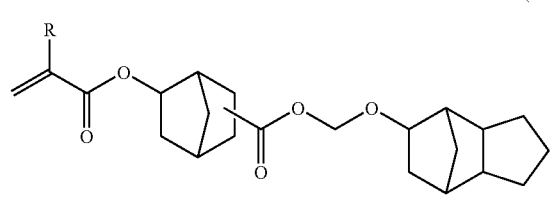
(9-68)
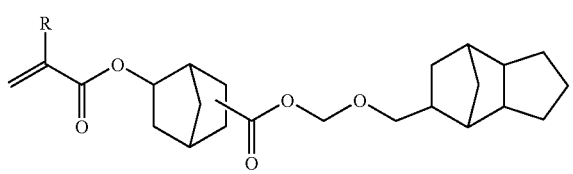
(9-69)
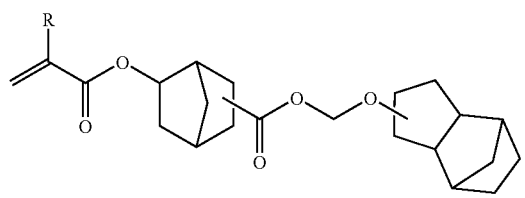

(9-70)
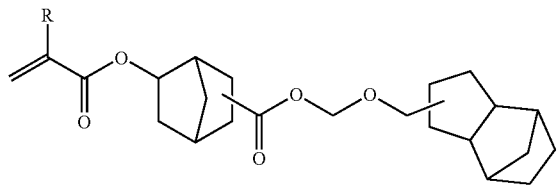
[Chemical formula 14]
(9-71)
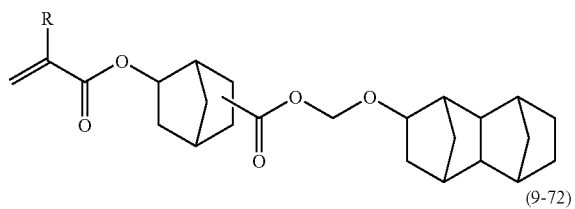
(9-72)
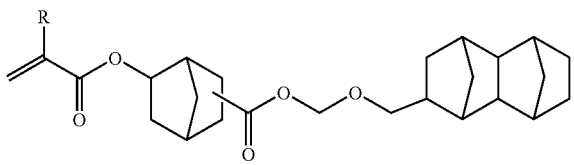
(9-73)
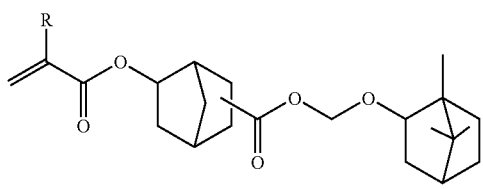
(9-74)
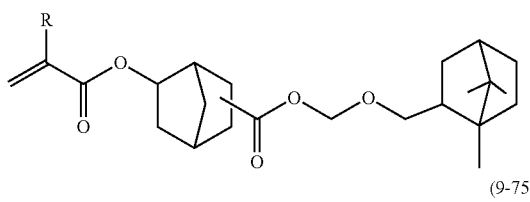
(9-75)
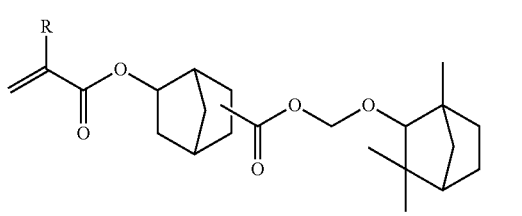
(9-76)
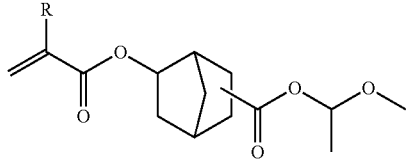
(9-77)
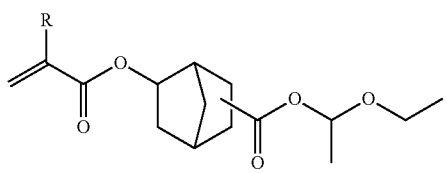

(9-78)
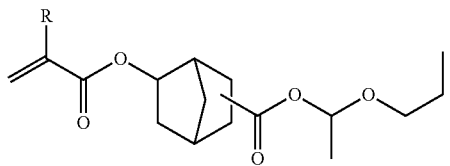
(9-79)
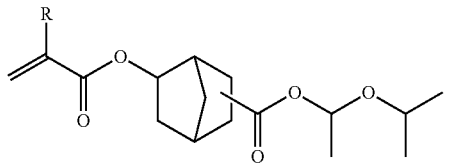
(9-80)
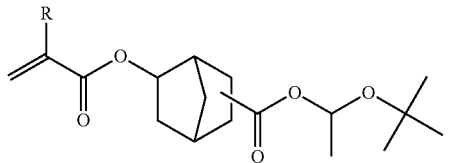
(9-81)
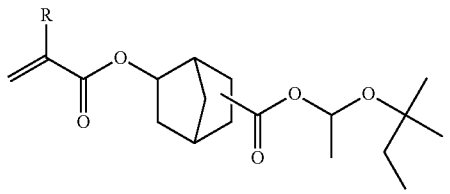
(9-82)
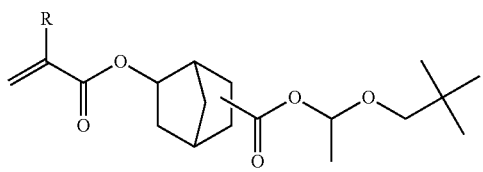
(9-83)
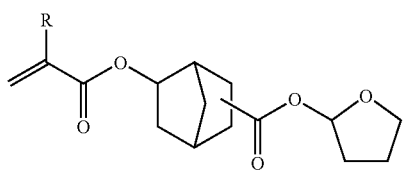
(9-84)
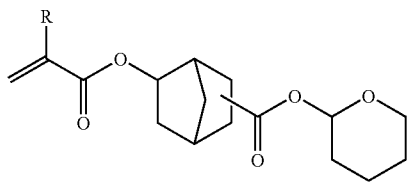
(9-85)
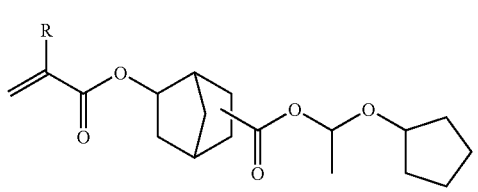

(9-86)
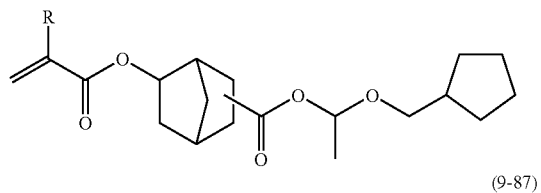
(9-87)
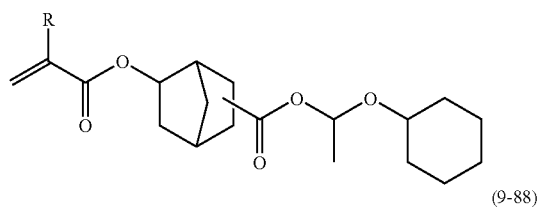
(9-88)
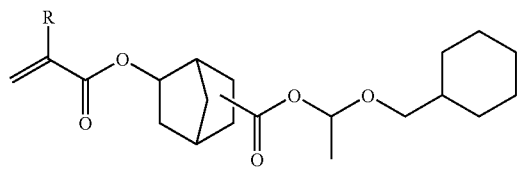
[Chemical formula 15]
(9-89)
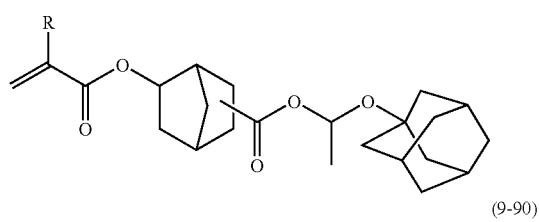
(9-90)
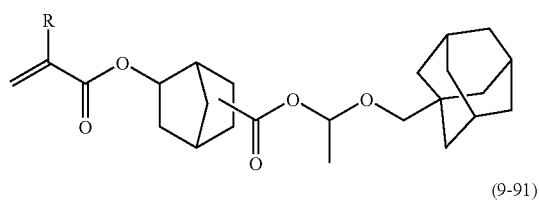
(9-91)
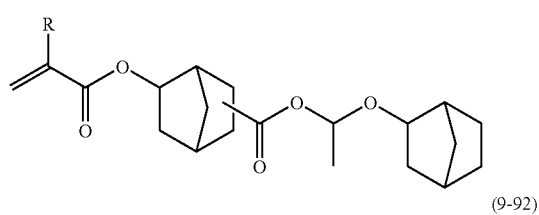
(9-92)
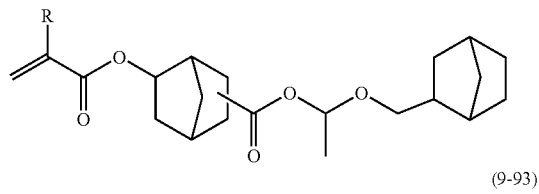
(9-93)
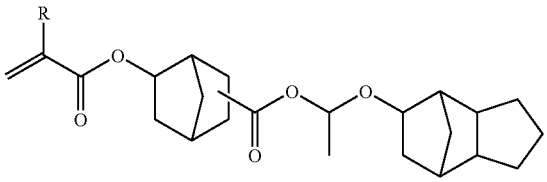

-continued
(9-94)
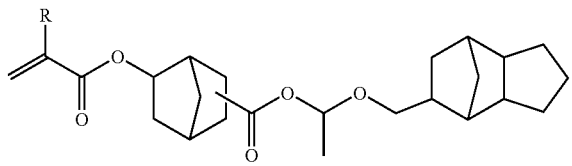
(9-95)
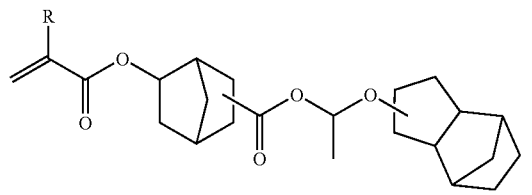
(9-96)
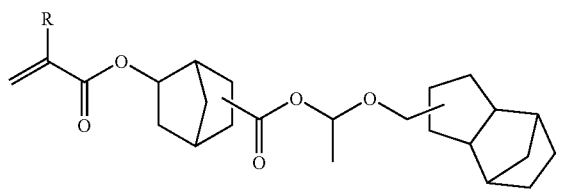
(9-97)
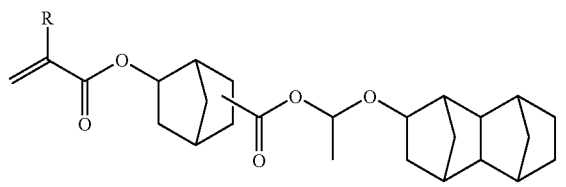
(9-98)
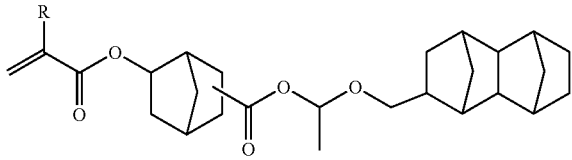
(9-99)
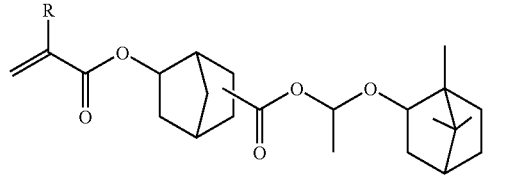
(9-100)
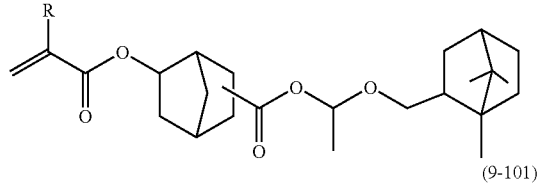
(9-101)
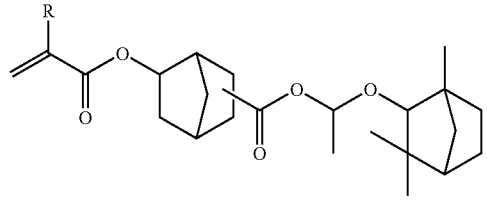

[Chemical formula 16]
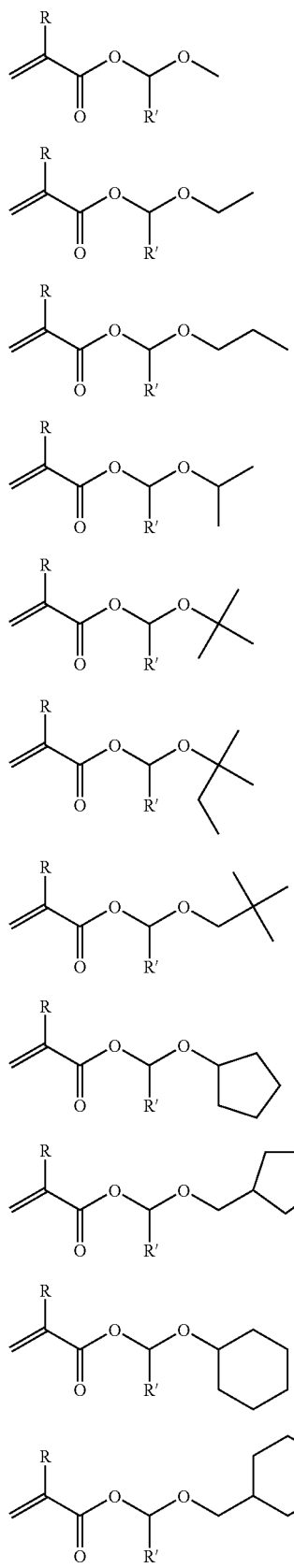

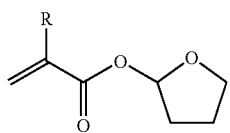
(9-113)
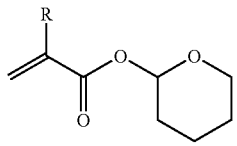
(9-114)
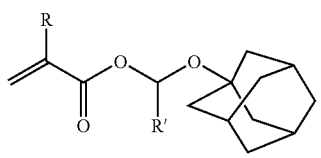
(9-115)
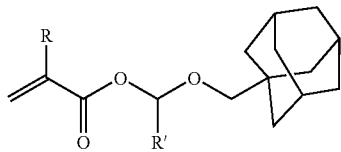
(9-116)
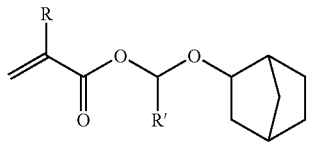
(9-117)
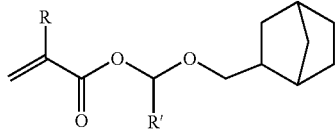
(9-118)
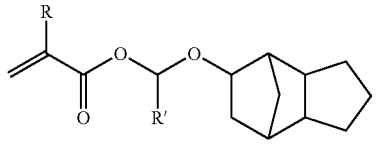
(9-119)
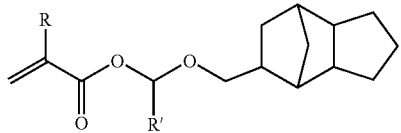
(9-120)
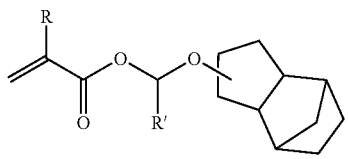
(9-121)

-continued
(9-122)
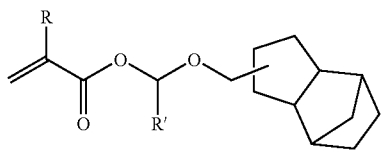
[Chemical formula 17]
(9-123)
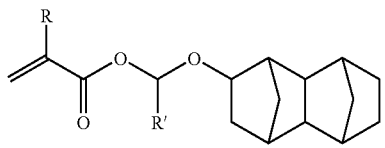
(9-124)
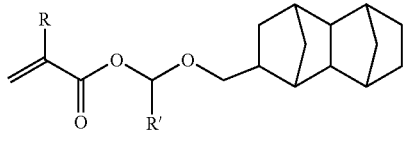
(9-125)
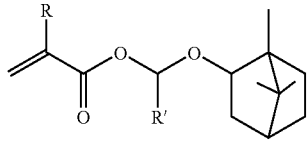
(9-126)
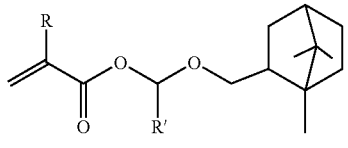
(9-127)
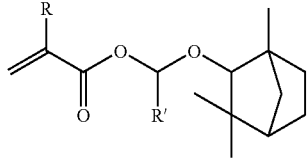
(9-128)
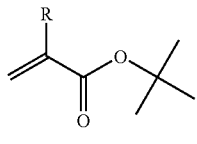
(9-129)
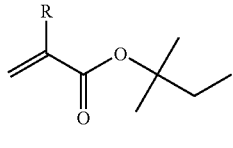
(9-130)
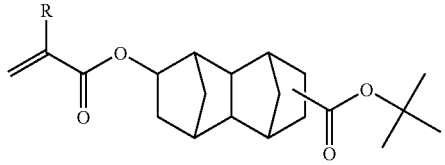
(9-131)
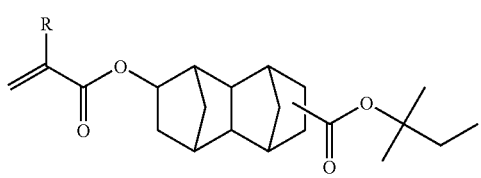

-continued
(9-132)
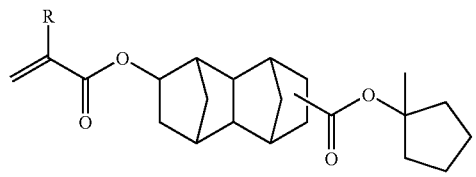
(9-133)
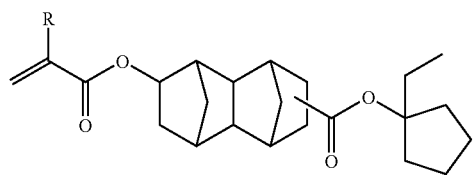
(9-134)
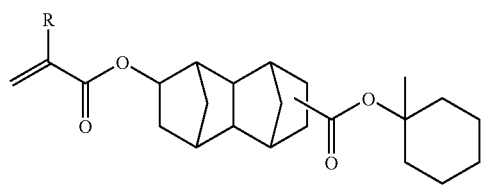
(9-135)
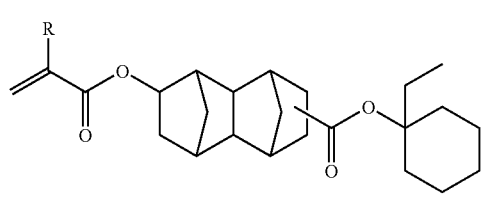
[Chemical formula 18]
(9-136)
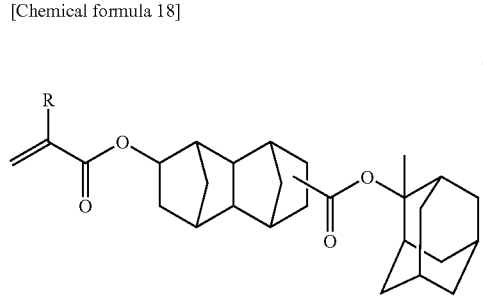
(9-137)
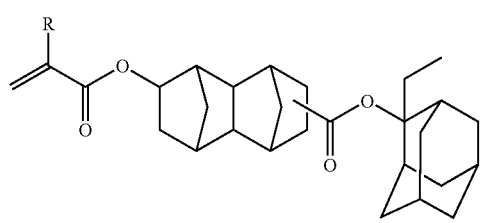
(9-138)
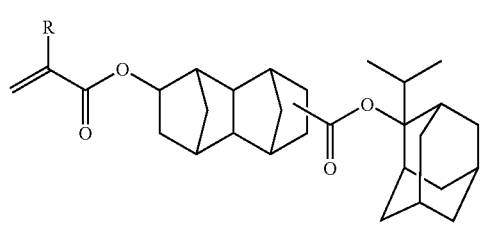

(9-139)
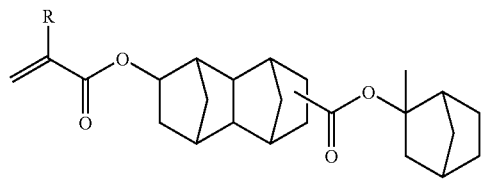
(9-140)
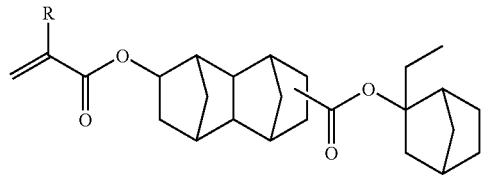
(9-141)
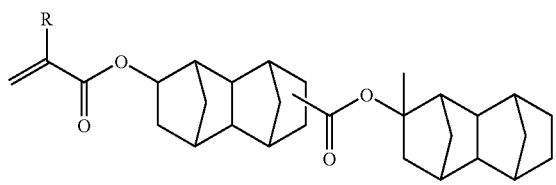
(9-142)
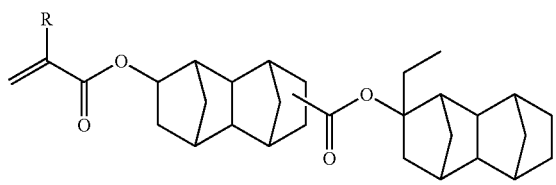
(9-143)
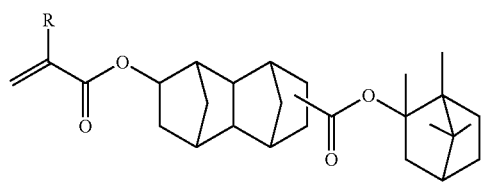
(9-144)
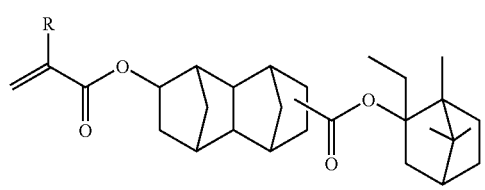
(9-145)
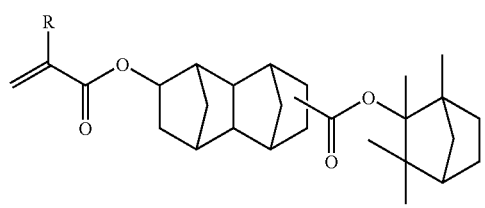

-continued
(9-146)
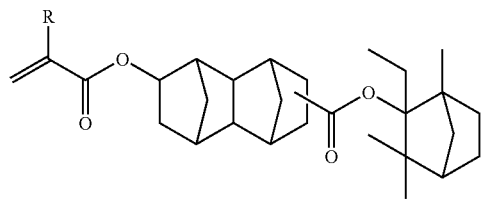
[Chemical formula 19]
(9-147)
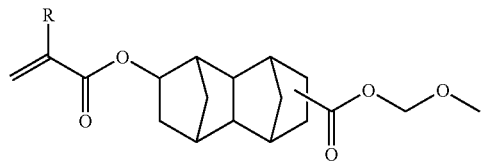
(9-148)
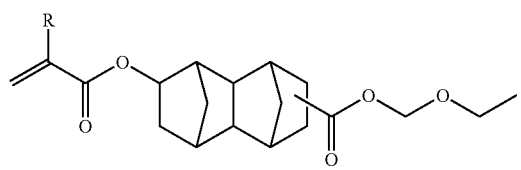
(9-149)
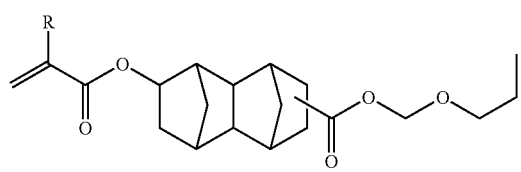
(9-150)
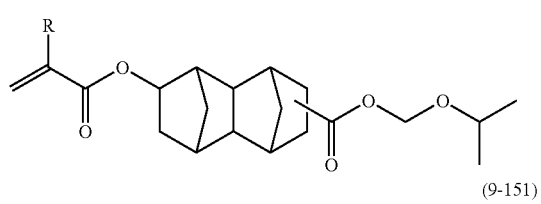
(9-151)
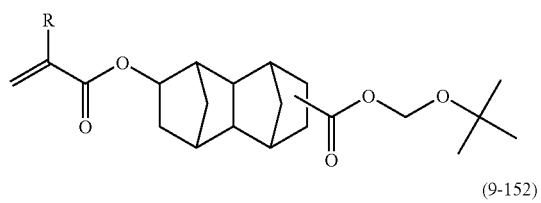
(9-152)
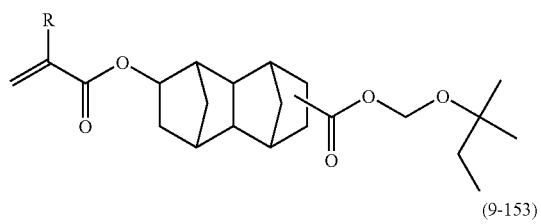
(9-153)
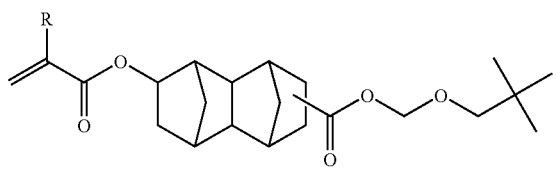

-continued
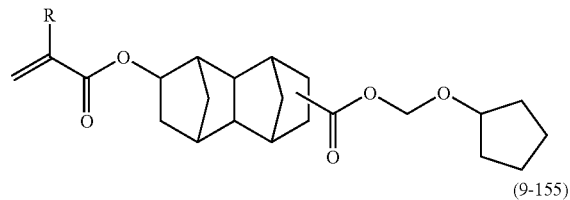
(9-154)
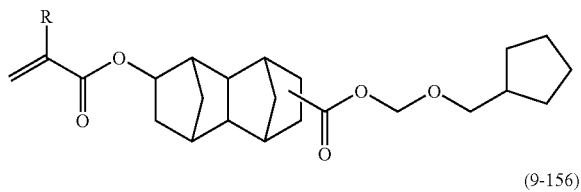
(9-155)
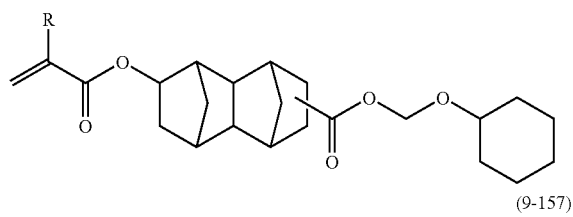
(9-156)
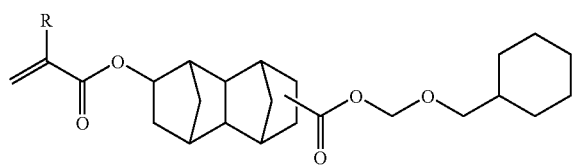
(9-157)
[Chemical formula 20]
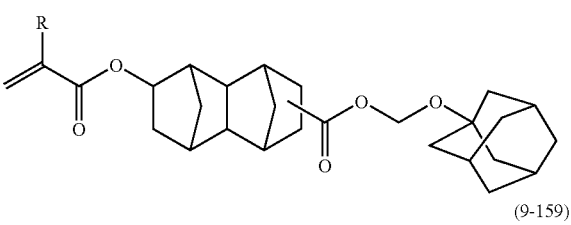
(9-158)
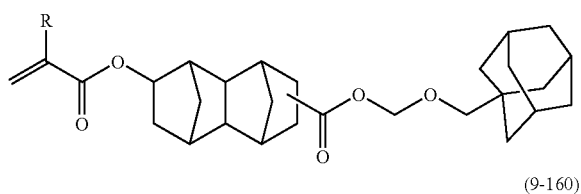
(9-159)
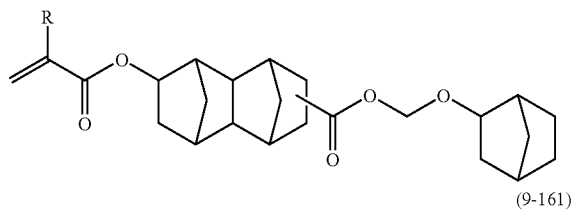
(9-160)
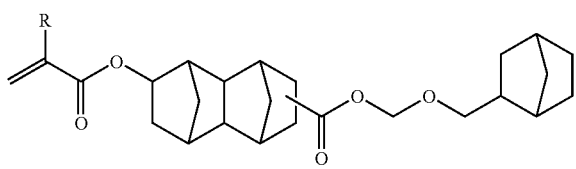
(9-161)

-continued
(9-162)
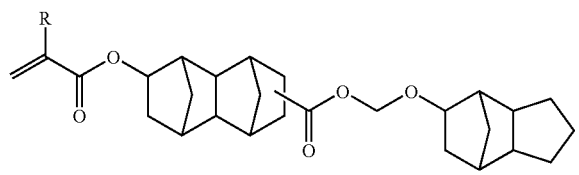
(9-163)
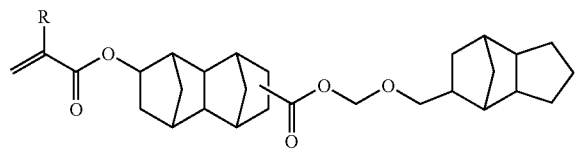
(9-164)
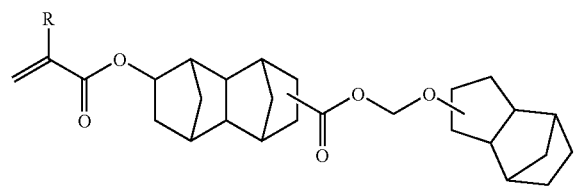
(9-165)
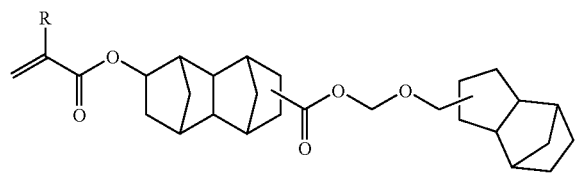
(9-166)
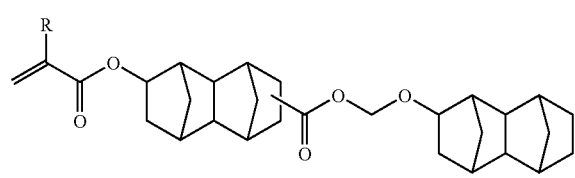
(9-167)
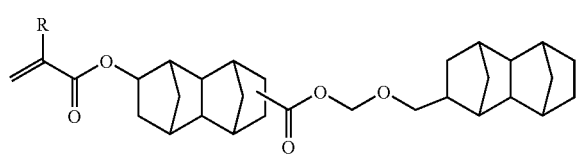
(9-168)
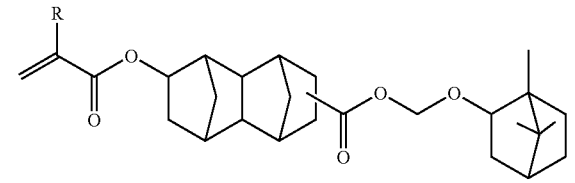
(9-169)
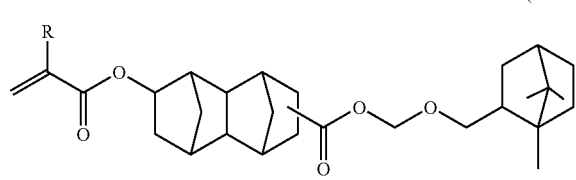

(9-170)
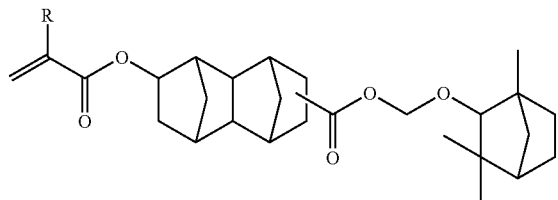
[Chemical formula 21]
(9-171)
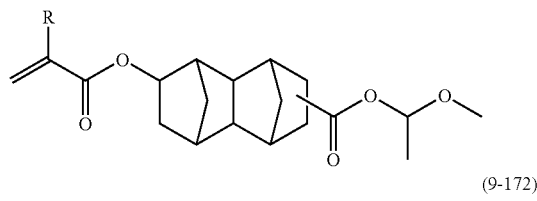
(9-172)
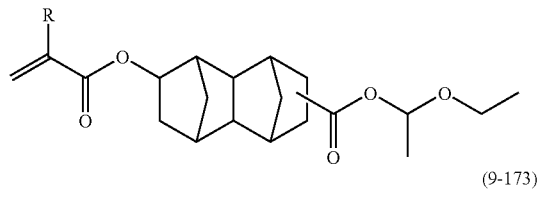
(9-173)
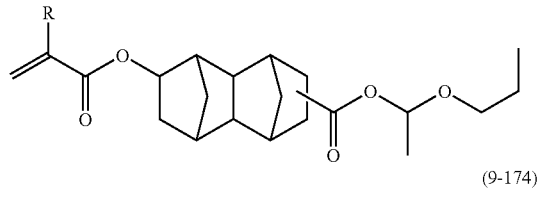
(9-174)
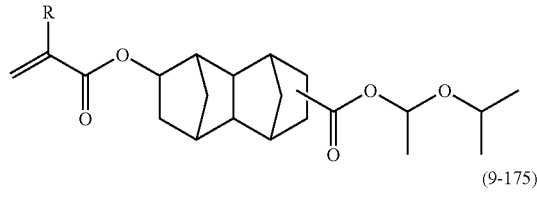
(9-175)
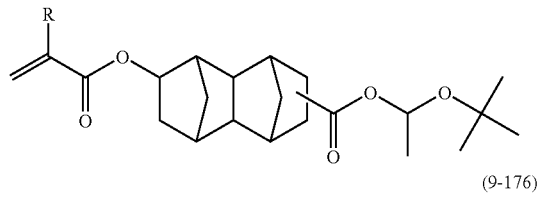
(9-176)
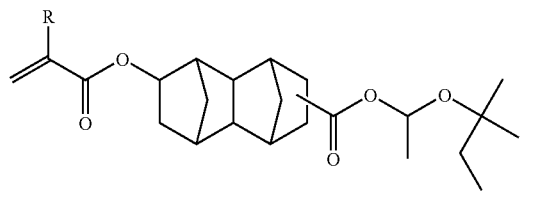
(9-177)
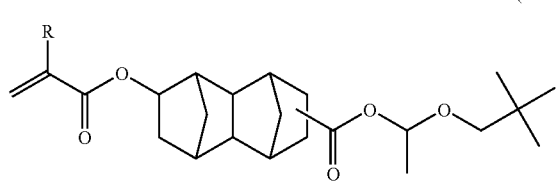

-continued
(9-178)
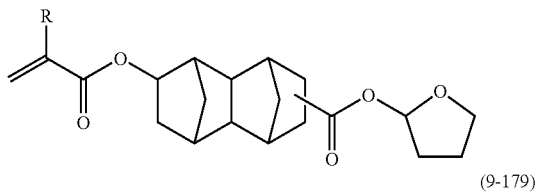
(9-179)
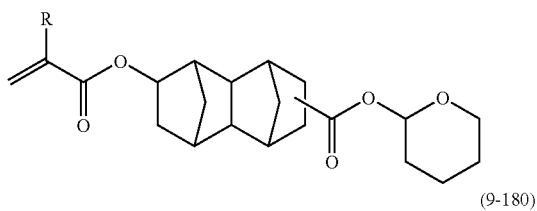
(9-180)
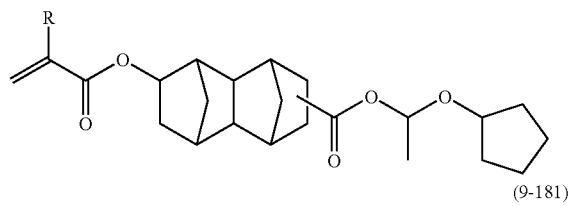
(9-181)
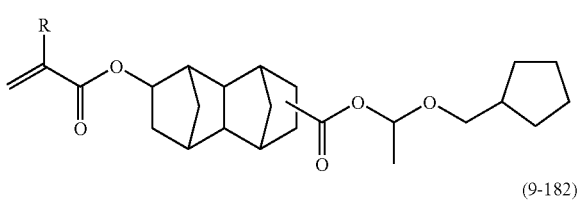
(9-182)
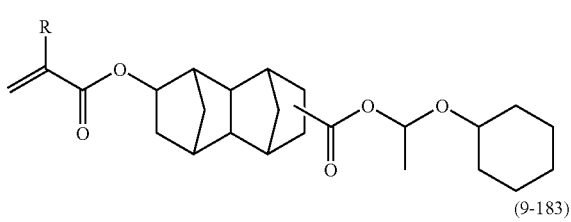
(9-183)
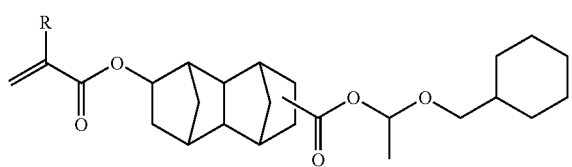
[Chemical formula 22]
(9-184)
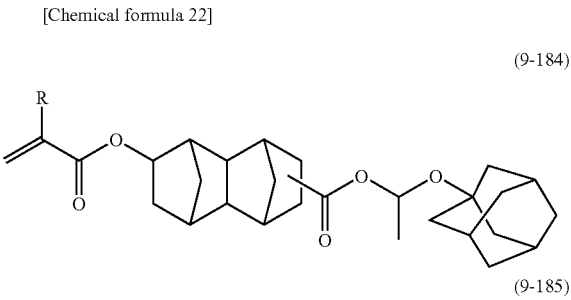
(9-185)
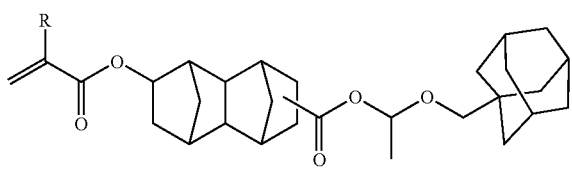

(9-186)
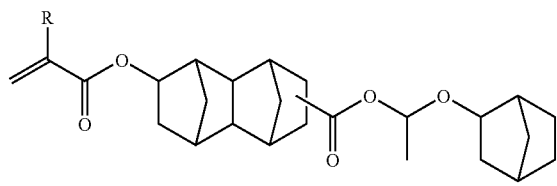
(9-187)
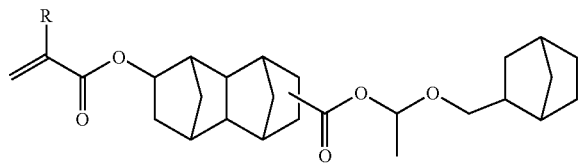
(9-188)
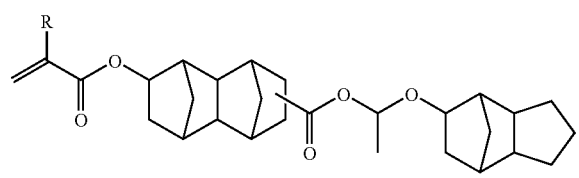
(9-189)
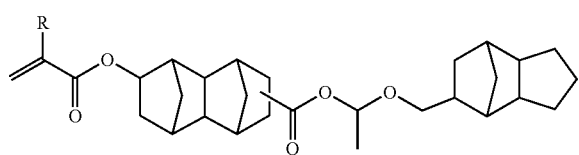
(9-190)
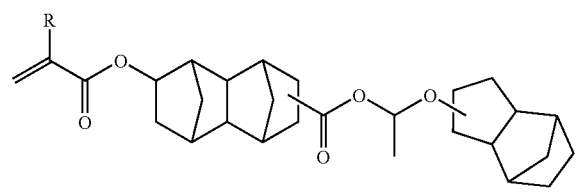
(9-191)
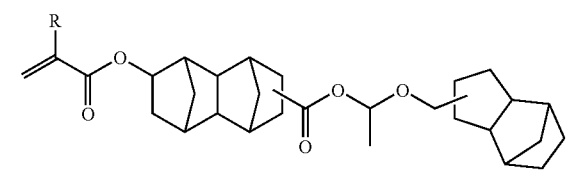
(9-192)
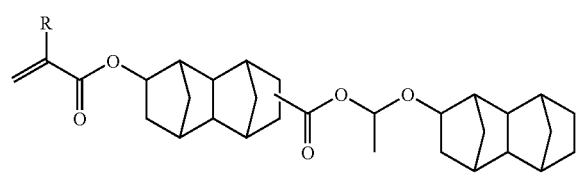
(9-193)
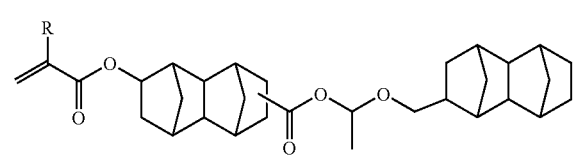

-continued
(9-194)
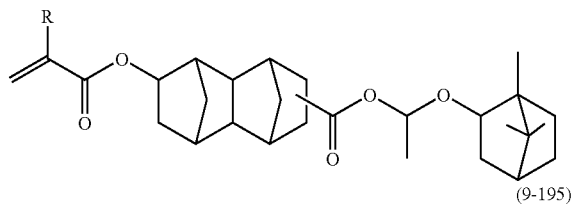
(9-195)
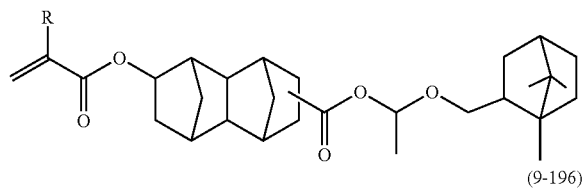
(9-196)
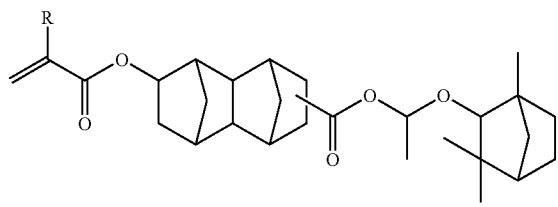
[Chemical formula 23]
(9-197)
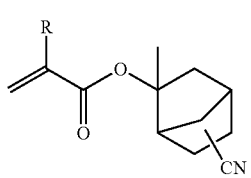
(9-198)
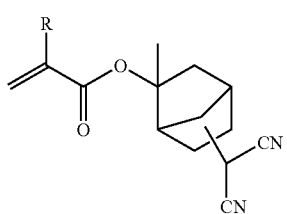
(9-199)
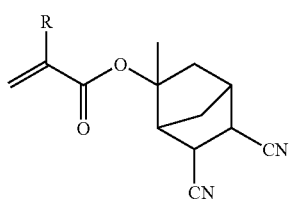
(9-200)
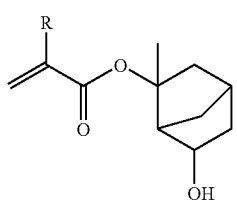
(9-201)
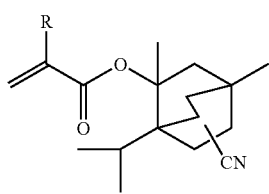

(9-202)
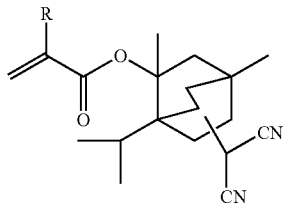
(9-203)
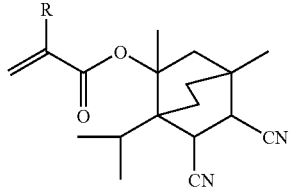
(9-204)
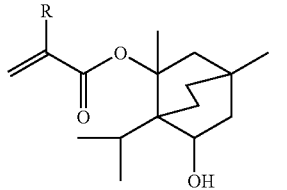
(9-205)
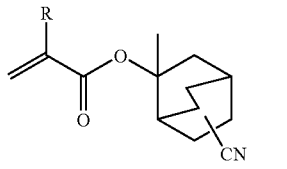
(9-206)
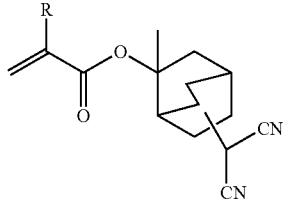
(9-207)
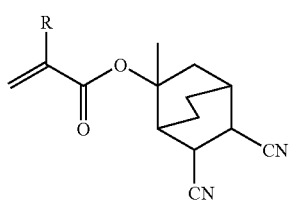
(9-208)
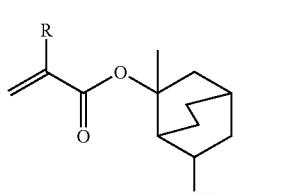
(9-209)
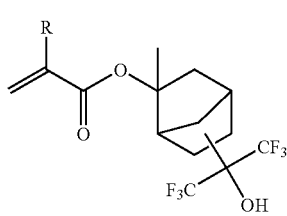

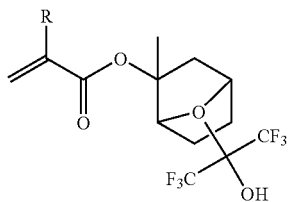
(9-210)
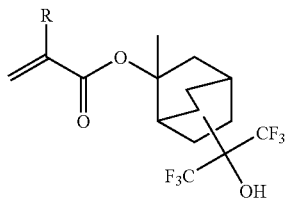
(9-211)
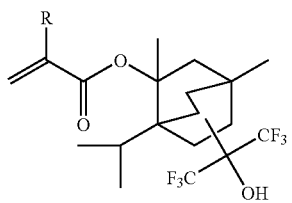
(9-212)
[Chemical formula 24]
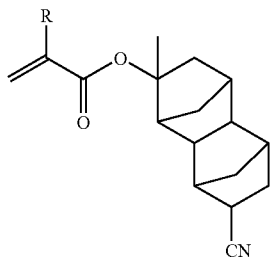
(9-213)
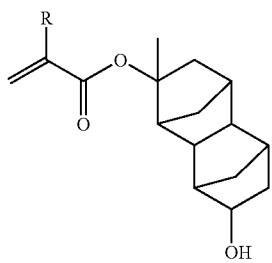
(9-214)
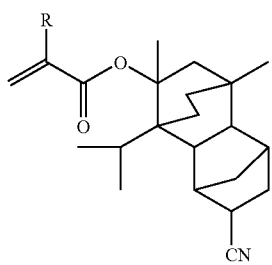
(9-215)

-continued
(9-216)
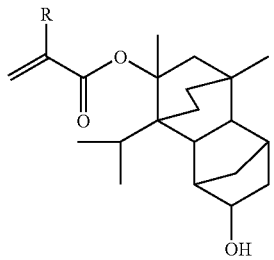
(9-217)
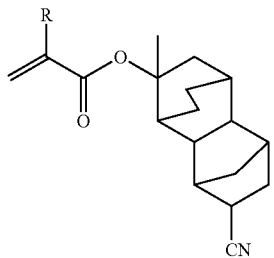
(9-218)
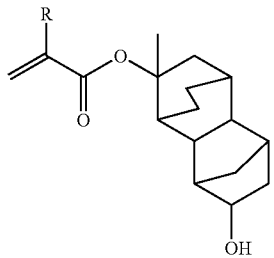
(9-219)
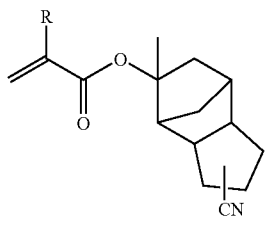
(9-220)
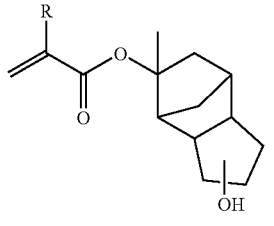
(9-221)
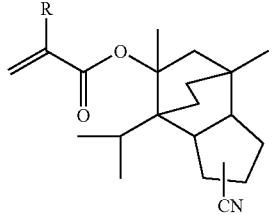

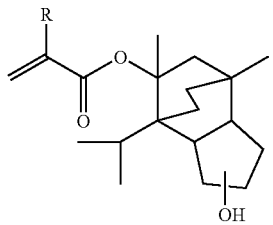
(9-222)

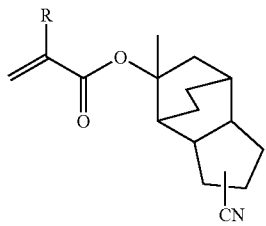
(9-223)

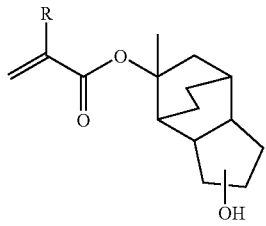
(9-224)

Among them, from the point of the sensitivity and the resolution, monomers represented by the above formulae (9-1) to (9-3), (9-5), (9-16), (9-19), (9-20), (9-22), (9-23), (9-25) to (9-28), (9-30), (9-31), (9-33), (9-34), and (9-102) to (9-129), and geometrical/optical isomers thereof are more preferred, and monomers represented by the above formulae (9-1), (9-2), (9-16), (9-20), (9-23), (9-28), (9-31), (9-34), (9-109), (9-111), (9-114) to (9-117), (9-125), (9-128), and (9-129) are particularly preferred.

Moreover, from the point of a superior line edge roughness, monomers represented by the above formulae (9-35) to (9-40), (9-52) to (9-62), (9-76) to (9-88), (9-130) to (9-135), (9-147) to (9-157), and (9-171) to (9-183), and geometrical/optical isomers thereof are more preferred.

Furthermore, from the point of a superior dry etching resistance, monomers represented by the above formulae (9-41) to (9-51), (9-63) to (9-75), (9-89) to (9-101), (9-136) to (9-146), (9-158) to (9-170), and (9-184) to (9-196), and geometrical/optical isomers thereof are more preferred.

From the point of an excellent pattern rectangularity, monomers represented by the above formulae (9-197) to (9-224), and geometrical/optical isomers thereof are more preferred.

The constituent unit (C) having a hydrophilic group is described.

The "hydrophilic group" means at least one type selected from the group consisting of —C(CF$_3$)$_2$—OH, a hydroxy group, a cyano group, a methoxy group a carboxy group, and an amino group.

The constituent unit (C) having a hydrophilic group demonstrates an effect of decreasing defects of a resist composition, and improving the pattern rectangularity.

From the point of the pattern rectangularity, the content of the constituent unit (C) is preferably 5 to 30 mol % based on the total number of the constituent units of the resist polymer (Y'), and more preferably 10 to 25 mol %.

If the constituent unit (C) has a group that is decomposed or eliminated by the action of an acid, it tends to have much more superior sensitivity. In this case, the constituent unit (C) also corresponds to the constituent unit (B). However, in the present invention, such a constituent unit is considered as the constituent unit (B).

Moreover, if the constituent unit (C) has a lactone skeleton, it tends to have much more superior sensitivity. In this case, the constituent unit (C) also corresponds to the constituent unit (A). However, in the present invention, such a constituent unit is considered as the constituent unit (A).

The constituent unit (C) having a hydrophilic group is not specifically limited. However, from the point of a high dry etching resistance required for a resist, it is preferably at least one type selected from a group consisting of the following formulae (5-1) to (5-7).

[Chemical formula 25]

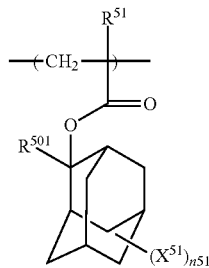
(5-1)

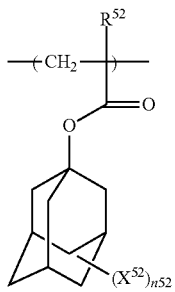 (5-2)

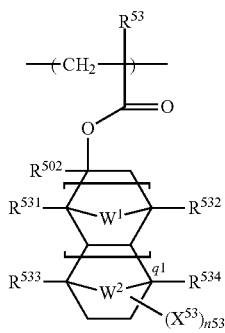 (5-3)

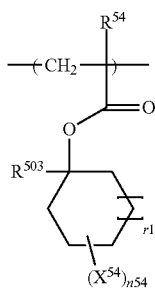 (5-4)

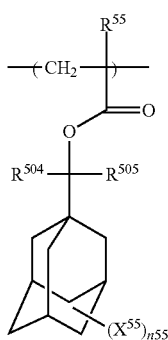 (5-5)

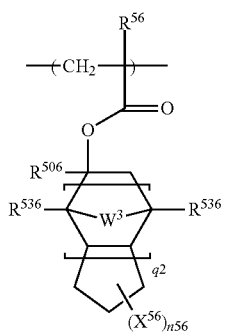 (5-6)

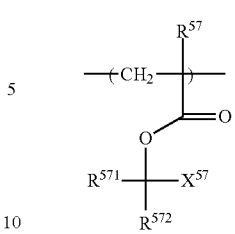 (5-7)

[In the formula (5-1), $R^{51}$ represents a hydrogen atom or a methyl group; $R^{501}$ represents a hydrogen atom or a $C_{1-3}$ alkyl group; $X^{51}$ represents a linear or branched $C_{1-6}$ alkyl group, —$C(CF_3)_2$—OH, a hydroxy group, a cyano group, a carboxy group, a $C_{1-6}$ acyl group, a $C_{1-6}$ alkoxy group, a carboxy group esterified with $C_{1-6}$ alcohol, or an amino group; the linear or branched $C_{1-6}$ alkyl group may have, as a substituent, at least one group selected from a group consisting of —$C(CF_3)_2$—OH, a hydroxy group, a cyano group, a carboxy group, a $C_{1-6}$ acyl group, a carboxy group esterified with $C_{1-6}$ alcohol, and an amino group; n51 represents an integer of 1 to 4; and $X^{51}$ may have a plurality of different groups if n51 is 2 or more.

In the formula (5-2), $R^{52}$ represents a hydrogen atom or a methyl group; $X^{52}$ represents a linear or branched $C_{1-6}$ alkyl group, —$C(CF_3)_2$—OH, a hydroxy group, a cyano group, a carboxy group, a $C_{1-6}$ acyl group, a $C_{1-6}$ alkoxy group, a carboxy group esterified with $C_{1-6}$ alcohol, or an amino group; the linear or branched $C_{1-6}$ alkyl group may have, as a substituent, at least one group selected from a group consisting of —$C(CF_3)_2$—OH, a hydroxy group, a cyano group, a carboxy group, a $C_{1-6}$ acyl group, a carboxy group esterified with $C_{1-6}$ alcohol, and an amino group; n52 represents an integer of 1 to 4; and $X^{52}$ may have a plurality of different groups if n52 is 2 or more.

In the formula (5-3), $R^{53}$ represents a hydrogen atom or a methyl group; $R^{502}$ represents a hydrogen atom or a $C_{1-3}$ alkyl group; $R^{531}$ to $R^{534}$ independently represent a hydrogen atom or a linear or branched $C_{1-6}$ alkyl group; $W^1$ and $W^2$ independently represent —O—, —S—, —NH—, or a $C_{1-6}$ methylene chain [—$(CH_2)_{u2}$— (wherein u2 represents an integer of 1 to 6)]; $X^{53}$ represents a linear or branched $C_{1-6}$ alkyl group, —$C(CF_3)_2$—OH—, a hydroxy group, a cyano group, a carboxy group, a $C_{1-6}$ acyl group, a $C_{1-6}$ alkoxy group, a carboxy group esterified with $C_{1-6}$ alcohol, or an amino group; n53 represents an integer of 1 to 4; the linear or branched $C_{1-6}$ alkyl group may have, as a substituent, at least one group selected from a group consisting of —$C(CF_3)_2$—OH—, a hydroxy group, a cyano group, a carboxy group, a $C_{1-6}$ acyl group, a carboxy group esterified with $C_{1-6}$ alcohol, and an amino group; q1 represents 0 or 1; and $X^{53}$ may have a plurality of different groups if n53 is 2 or more.

In the formula (5-4), $R^{54}$ represents a hydrogen atom or a methyl group; $R^{503}$ represents a hydrogen atom or a $C_{1-3}$ alkyl group; $X^{54}$ represents a linear or branched $C_{1-6}$ alkyl group, —$C(CF_3)_2$—OH, a hydroxy group, a cyano group, a carboxy group, a $C_{1-6}$ acyl group, a $C_{1-6}$ alkoxy group, a carboxy group esterified with $C_{1-6}$ alcohol, or an amino group; the linear or branched $C_{1-6}$ alkyl group may have, as a substituent, at least one group selected from a group consisting of —$C(CF_3)_2$—OH, a hydroxy group, a cyano group, a carboxy group, a $C_{1-6}$ acyl group, a carboxy group esterified with $C_{1-6}$ alcohol, and an amino group; n54 represents an integer of 1 to 4; r1 represents 0 to 2; and $X^{54}$ may have a plurality of different groups if n54 is 2 or more.

In the formula (5-5), $R^{55}$ represents a hydrogen atom or a methyl group; $R^{504}$ and $R^{505}$ independently represent a $C_{1-3}$ alkyl group; $X^{55}$ represents a linear or branched $C_{1-6}$ alkyl group, —$C(CF_3)_2$—OH—, a hydroxy group, a cyano group, a carboxy group, a $C_{1-6}$ acyl group, a $C_{1-6}$ alkoxy group, a carboxy group esterified with $C_{1-6}$ alcohol, or an amino group; the linear or branched $C_{1-6}$ alkyl group may have, as a substituent, at least one group selected from a group consisting of —$C(CF_3)_2$—OH—, a hydroxy group, a cyano group, a carboxy group, a $C_{1-6}$ acyl group, a carboxy group esterified with $C_{1-6}$ alcohol, and an amino group; n55 represents an integer of 1 to 4; and $X^{55}$ may have a plurality of different groups if n55 is 2 or more.

In the formula (5-6), $R^{56}$ represents a hydrogen atom or a methyl group; $R^{506}$ represents a hydrogen atom or a $C_{1-3}$ alkyl group; $R^{535}$ and $R^{536}$ independently represent a hydrogen atom or a linear or branched $C_{1-6}$ alkyl group; $W^3$ represents —O—, —S—, —NH—, or a $C_{1-6}$ methylene chain [—$(CH_2)_{u3}$— (wherein u3 represents an integer of 1 to 6)]; $X^{56}$ represents a linear or branched $C_{1-6}$ alkyl group, —$C(CF_3)_2$—OH—, a hydroxy group, a cyano group, a carboxy group, a $C_{1-6}$ acyl group, a $C_{1-6}$ alkoxy group, a carboxy group esterified with $C_{1-6}$ alcohol, or an amino group; the linear or branched $C_{1-6}$ alkyl group may have, as a substituent, at least one group selected from a group consisting of —$C(CF_3)_2$—OH—, a hydroxy group, a cyano group, a carboxy group, a $C_{1-6}$ acyl group, a carboxy group esterified with $C_{1-6}$ alcohol, and an amino group; n56 represents an integer of 1 to 4; q2 represents 0 or 1; and $X^{56}$ may have a plurality of different groups if n56 is 2 or more.

In the formula (5-7), $R^{57}$ represents a hydrogen atom or a methyl group; $R^{571}$ represents a linear or branched $C_{1-6}$ alkyl group, a bridged cyclic $C_{4-16}$ hydrocarbon group, or a linear or branched $C_{1-6}$ alkyl group having a cross-linking cyclic $C_{4-16}$ hydrocarbon group; $R^{572}$ represents a linear or branched $C_{1-6}$ alkyl group; or $R^{571}$ and $R^{572}$ may form a cross-linking cyclic $C_{4-16}$ hydrocarbon group, together with the carbon atoms bonded to the respective groups. Here, the alkyl group may have a hydroxy group, a carboxy group, a $C_{2-6}$ acyl group, or a carboxy group esterified with $C_{1-6}$ alcohol; and the cross-linking cyclic hydrocarbon group may have a linear or branched $C_{1-6}$ alkyl group; and the alkyl group may have a hydroxy group, a carboxy group, a $C_{2-6}$ acyl group, or a carboxy group esterified with $C_{1-6}$ alcohol. $X^{57}$ represents a linear or branched $C_{1-6}$ alkyl group, —$C(CF_3)_2$—OH—, a hydroxy group, a cyano group, a carboxy group, a $C_{1-6}$ acyl group, a $C_{1-6}$ alkoxy group, a carboxy group esterified with $C_{1-6}$ alcohol, or an amino group; and the linear or branched $C_{1-6}$ alkyl group may have, as a substituent, at least one group selected from a group consisting of —$C(CF_3)_2$—OH—, a hydroxy group, a cyano group, a carboxy group, a $C_{1-6}$ acyl group, a carboxy group esterified with $C_{1-6}$ alcohol, and an amino group.]

In the formula (5-1), preferably, $R^{501}$ represents a methyl group, an ethyl group, or an isopropyl group from the point of the sensitivity and the resolution, and a hydrogen atom from the point of a high solubility into an organic solvent.

In the formula (5-1), preferably, n51 is 1 from the point of a high dry etching resistance.

In the formula (5-1), preferably, $X^{51}$ represents —$C(CF_3)_2$—OH, a hydroxy group, a cyano group, or a methoxy group from the point of an excellent pattern shape.

In the formula (5-2), preferably, n52 is 1 from the point of a high dry etching resistance.

In the formula (5-2), preferably, $X^{52}$ represents —$C(CF_3)_2$—OH, a hydroxy group, a cyano group, or a methoxy group from the point of an excellent pattern shape.

In the formula (5-3), preferably, $R^{502}$ represents a methyl group, an ethyl group, or an isopropyl group from the point of the sensitivity and the resolution, and a hydrogen atom from the point of a high solubility into an organic solvent.

In the formula (5-3), preferably, $W^1$ and $W^2$ represent —$CH_2$— and —$CH_2CH_2$— from the point of a high dry etching resistance.

In the formula (5-3), preferably, $R^{531}$, $R^{532}$, $R^{533}$, and $R^{534}$ independently represent a hydrogen atom, a methyl group, an ethyl group, or an isopropyl group from the point of a high solubility into an organic solvent.

In the formula (5-3), preferably, n53 is 1 from the point of a high dry etching resistance.

In the formula (5-3), preferably, $X^{53}$ represents —$C(CF_3)_2$—OH, a hydroxy group, a cyano group, or a methoxy group from the point of an excellent pattern shape.

In the formula (5-3), preferably, q1 is 1 from the point of a high dry etching resistance, and q1 is 0 from the point of a high solubility into an organic solvent.

In the formula (5-4), preferably, $R^{503}$ represents a methyl group, an ethyl group, or an isopropyl group from the point of the sensitivity and the resolution, and a hydrogen atom from the point of a high solubility into an organic solvent.

In the formula (5-4), preferably, n54 is 1 from the point of a high dry etching resistance.

In the formula (5-4), preferably, $X^{54}$ represents —$C(CF_3)_2$—OH, a hydroxy group, a cyano group, or a methoxy group from the point of an excellent pattern shape.

In the formula (5-4), preferably, r1 is 1 from the point of a high dry etching resistance, and r1 is 0 from the point of a high solubility into an organic solvent.

In the formula (5-5), preferably, $R^{504}$ and $R^{505}$ independently represent a methyl group, an ethyl group, or an isopropyl group from the point of the sensitivity and the resolution.

In the formula (5-5), preferably, n55 is 1 from the point of a high dry etching resistance.

In the formula (5-5), preferably, $X^{55}$ represents —$C(CF_3)_2$—OH, a hydroxy group, a cyano group, or a methoxy group from the point of an excellent pattern shape.

In the formula (5-6), preferably, $R^{506}$ represents a methyl group, an ethyl group, or an isopropyl group from the point of the sensitivity and the resolution, and a hydrogen atom from the point of a high solubility into an organic solvent.

In the formula (5-6), preferably, $W^3$ represents —$CH_2$— or —$CH_2CH_2$— from the point of a high dry etching resistance.

In the formula (5-6), preferably, $R^{535}$ and $R^{536}$ represent a hydrogen atom, a methyl group, an ethyl group, or an isopropyl group from the point of a high solubility into an organic solvent.

In the formula (5-6), preferably, n56 is 1 from the point of a high dry etching resistance.

In the formula (5-6), preferably, $X^{56}$ represents —$C(CF_3)_2$—OH, a hydroxy group, a cyano group, or a methoxy group from the point of an excellent pattern shape.

In the formula (5-6), preferably, q2 is 1 from the point of a high dry etching resistance, and q2 is 0 from the point of a high solubility into an organic solvent.

In the formula (5-7), preferably, from the point of a high dry etching resistance, $R^{571}$ and $R^{572}$ have a structure to form a cross-linking cyclic $C_{4-16}$ hydrocarbon group, together with the carbon atoms bonded to the respective groups. Moreover, preferably, from the point of an excellent heat resistance and stability, a ring contained in the cross-linking cyclic hydrocarbon group formed by $R^{571}$ and $R^{572}$ together with the carbon atoms bonded to the respective groups, has a camphor ring, an adamantane ring, a norbornane ring, a pinane ring, a bicyclo[2.2.2]octane ring, a tetracyclododecane ring, a tricyclodecane ring, or a decahydronaphthalene ring.

In the formula (5-7), preferably, $X^{57}$ represents —$CH_2$—$C(CF_3)_2$—OH, a —$CH_2$—OH group, a —$CH_2$—CN group, a —$CH_2$—O—$CH_3$ group, or a —$(CH_2)_2$—O—$CH_3$ group.

In the formulae (5-1) to (5-7), the positions of substitutions by $X^{51}$, $X^{52}$, $X^{53}$, $X^{54}$, $X^{55}$, $X^{56}$, and $X^{57}$ may be any position in the cyclic structure.

The constituent unit (C) having a hydrophilic group may be solely used or a plurality of types thereof may be used in combination, as required.

The polymer comprising a constituent unit (C) having a hydrophilic group can be produced by polymerizing monomers containing a monomer (c) composing the constituent unit (C) having a hydrophilic group.

This monomer (c) is not specifically limited. However, examples thereof include monomers represented by the following formulae (13-1) to (13-79). In the formulae (13-1) to (13-79), R represents a hydrogen atom or a methyl group.

[Chemical formula 27]

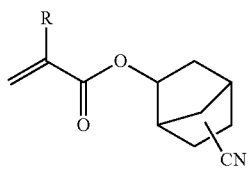 (13-1)

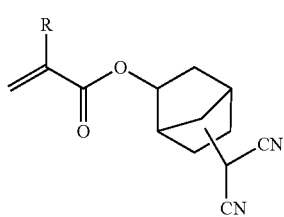 (13-2)

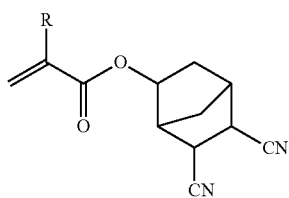 (13-3)

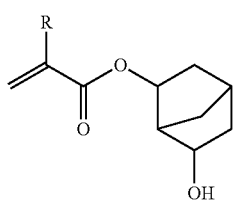 (13-4)

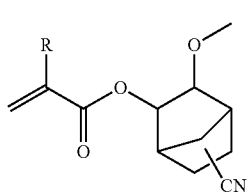 (13-5)

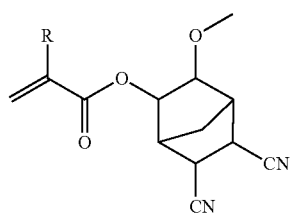 (13-6)

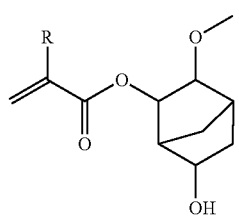 (13-7)

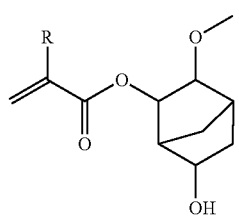 (13-8)

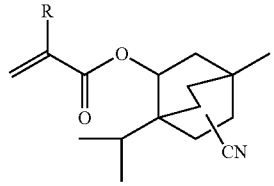 (13-9)

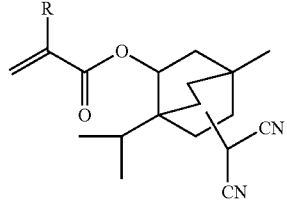 (13-10)

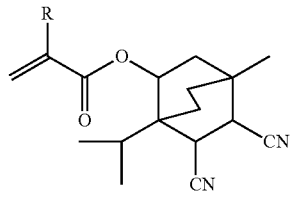 (13-11)

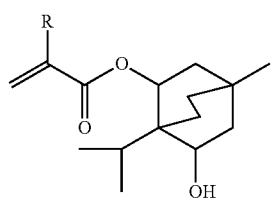 (13-12)

(13-13) 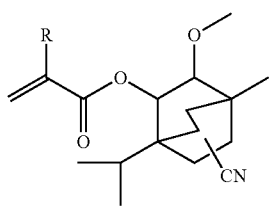
(13-14) 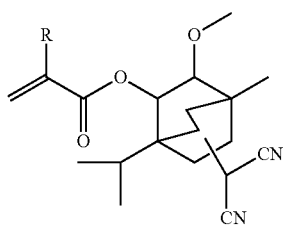
(13-15) 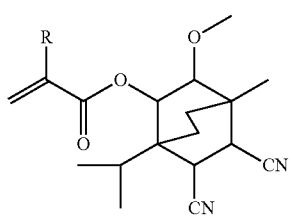
(13-16) 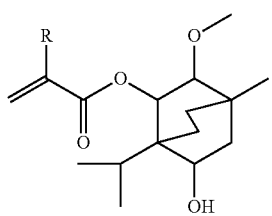
(13-17) 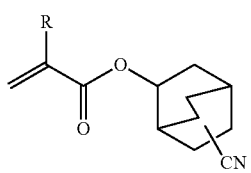
(13-18) 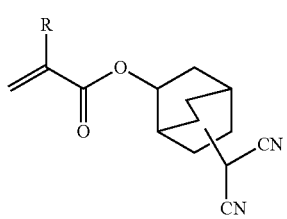
(13-19) 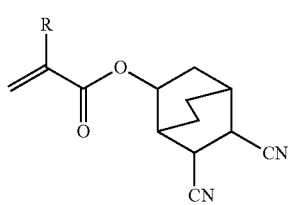
(13-20) 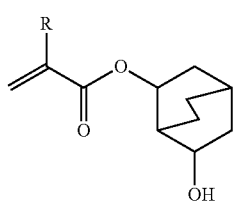
(13-21) 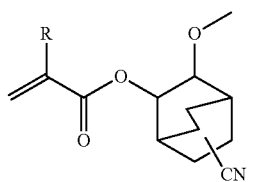
(13-22) 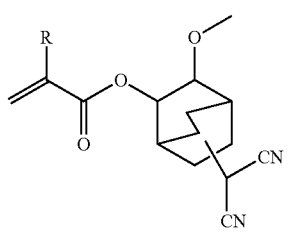
(13-23) 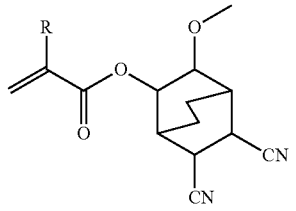
(13-24) 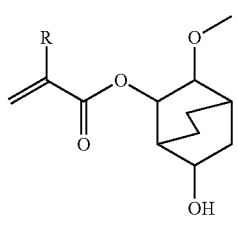
[Chemical formula 27]
(13-25) 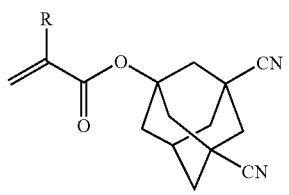
(13-26) 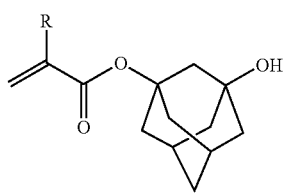

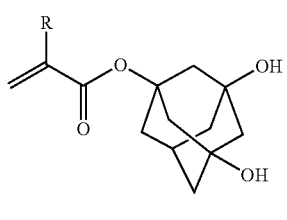
(13-27)
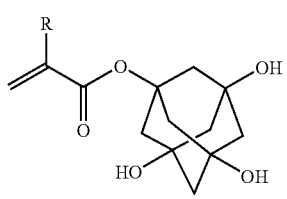
(13-28)
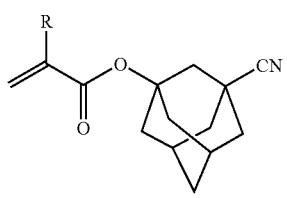
(13-29)
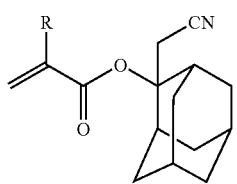
(13-30)
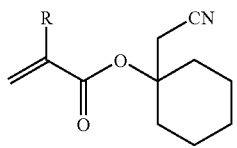
(13-31)
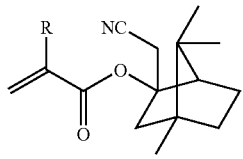
(13-32)
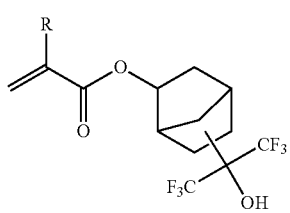
(13-33)
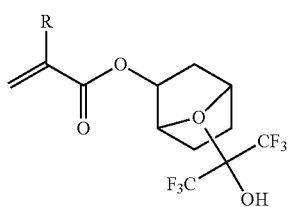
(13-34)
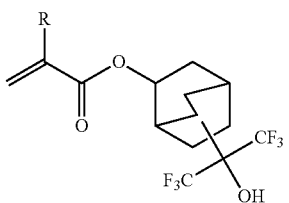
(13-35)
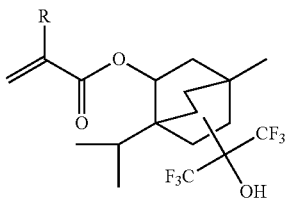
(13-36)
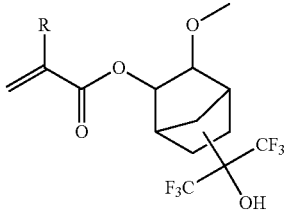
(13-37)
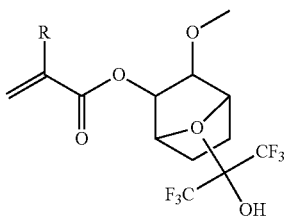
(13-38)
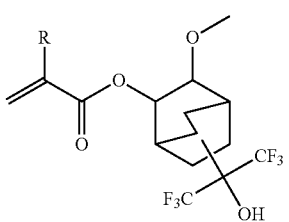
(13-39)
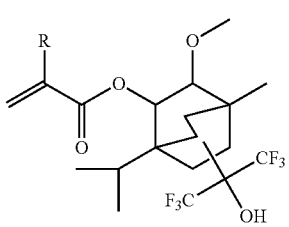
(13-40)
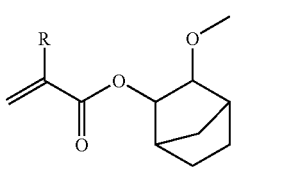
(13-41)

(13-42)
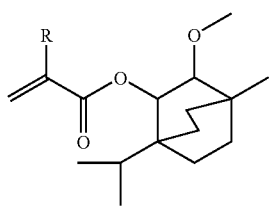
(13-43)
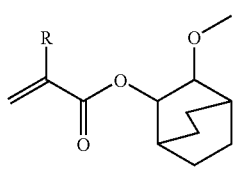
[Chemical formula 28]
(13-44)
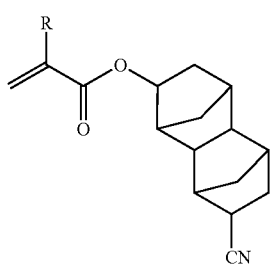
(13-45)
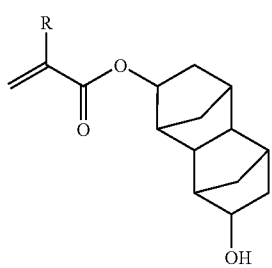
(13-46)
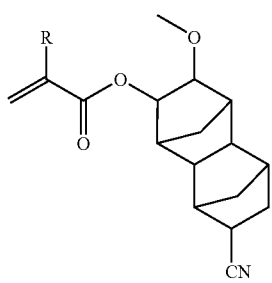
(13-47)
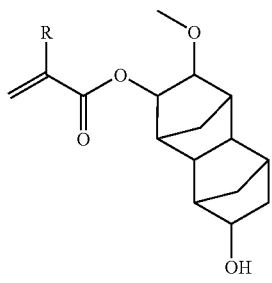
(13-48)
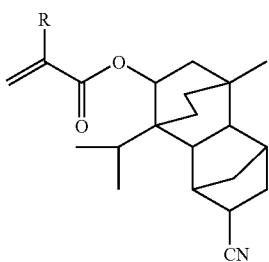
(13-49)
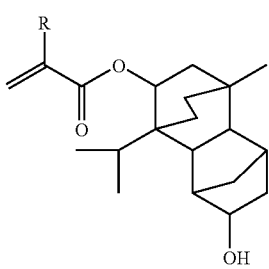
(13-50)
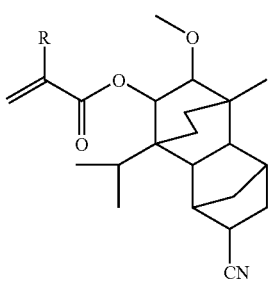
(13-51)
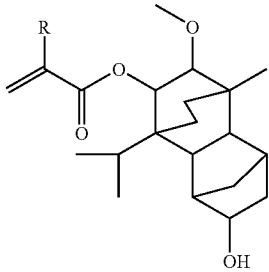
(13-52)
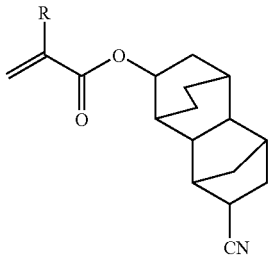
(13-53)
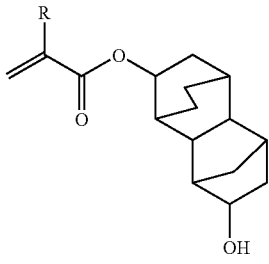

(13-54)
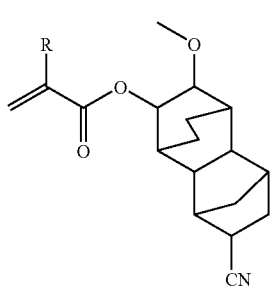
(13-55)
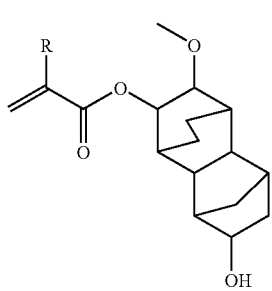
(13-56)
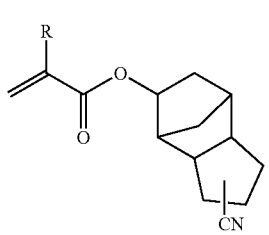
(13-57)
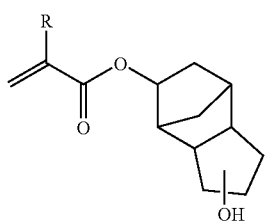
(13-58)
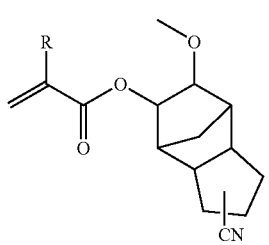
(13-59)
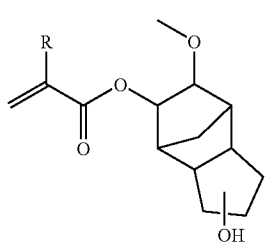
(13-60)
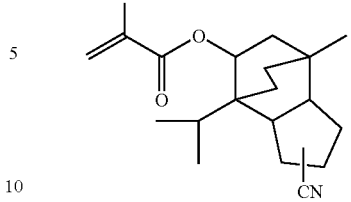
(13-61)
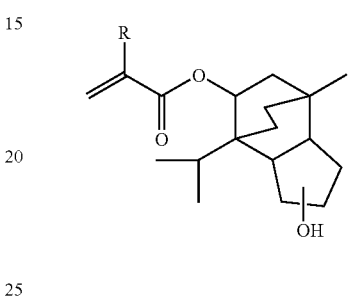
(13-62)
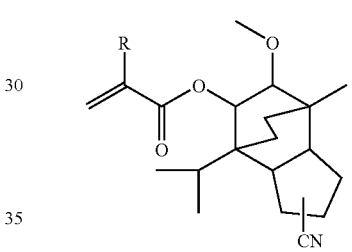
(13-63)
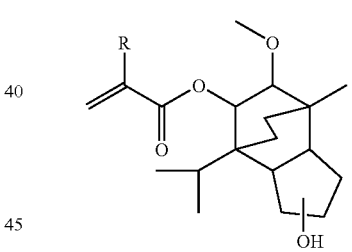
[Chemical formula 29]
(13-64)
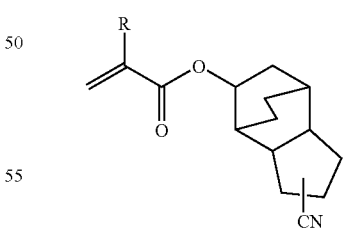
(13-65)
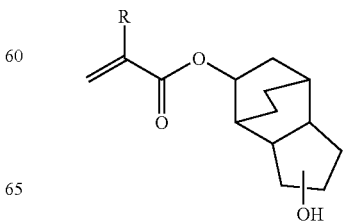

(13-66)
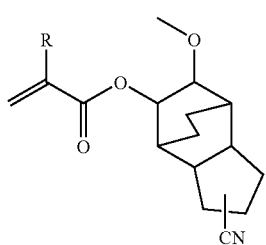

(13-67)
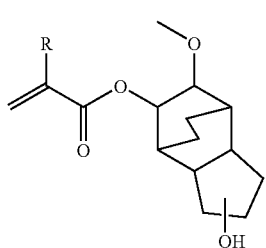

(13-68)
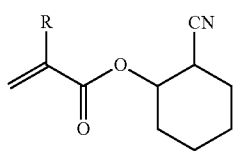

(13-69)
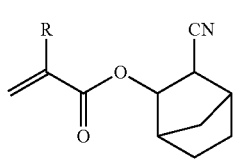

(13-70)
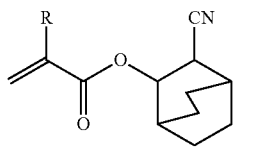

(13-71)
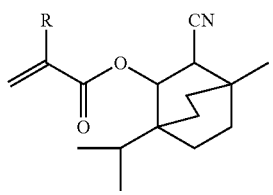

(13-72)
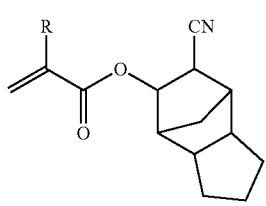

(13-73)
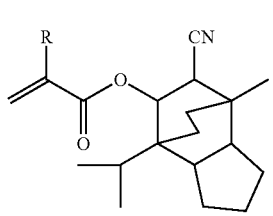

(13-74)
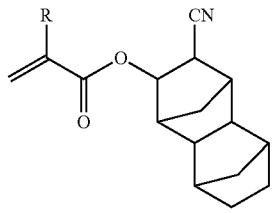

(13-75)
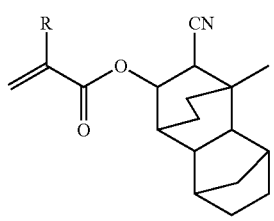

(13-76)
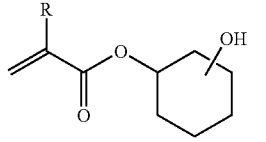

(13-77)
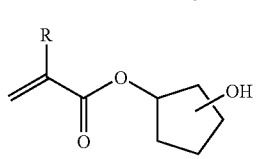

(13-78)
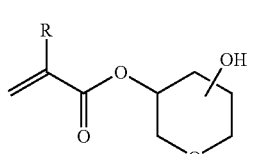

(13-79)
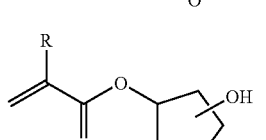

Among them, from the point of an excellent solubility into a resist solvent, monomers represented by the above formulae (13-1) to (13-9), (13-13) to (13-16), (13-21) to (13-24), (13-30) to (13-34), (13-37) to (13-43), (13-56) to (13-59), (13-62), (13-63), (13-66) to (13-69), (13-72), and (13-76) to (13-79), and geometrical/optical isomers thereof are more preferred.

From the point of a high dry etching resistance, monomers represented by the above formulae (13-25) to (13-30), (13-44) to (13-55), (13-60), (13-61), (13-64), (13-65), (13-71), and (13-73) to (13-75), and geometrical/optical isomers thereof are more preferred.

A polymer (Y) may have the abovementioned constituent units (A) to (C), and the constituent unit (E) described later. Besides these constituent units, it may also have a constituent unit (D).

Such a constituent unit (D) may contain a constituent unit (D1) having an alicyclic skeleton (nonpolar alicyclic skeleton) that does not have an acid-eliminable group or a hydrophilic group. Here, the alicyclic skeleton means a skeleton which has one or more saturated cyclic hydrocarbon groups. The constituent unit (D1) may be solely used or a plurality of types thereof may be used in combination, as required.

The constituent unit (D1) tends to demonstrate an effect of expressing the dry etching resistance of the resist composition.

The constituent unit (D1) is not specifically limited. However, from the point of a high dry etching resistance required for a resist, it is preferably a constituent unit represented by the following formulae (11-1) to (11-4).

[Chemical formula 30]

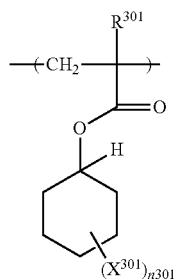

(11-1)

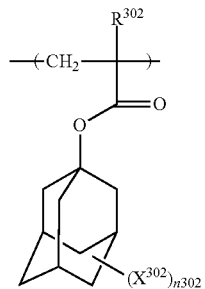

(11-2)

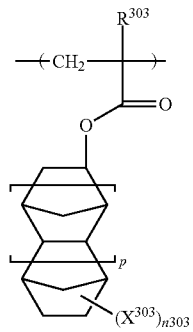

(11-3)

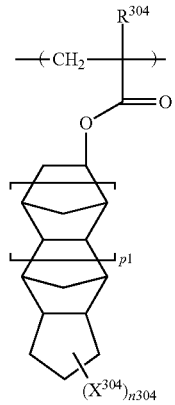

(11-4)

[In the formula (11-1), $R^{301}$ represents a hydrogen atom or a methyl group; $X^{301}$ represents a linear or branched $C_{1-6}$ alkyl group; n301 represents an integer of 0 to 4; and $X^{301}$ may have a plurality of different groups if n301 is 2 or more.

In the formula (11-2), $R^{302}$ represents a hydrogen atom or a methyl group; $X^{302}$ represents a linear or branched $C_{1-6}$ alkyl group; n302 represents an integer of 0 to 4; and $X^{302}$ may have a plurality of different groups if n302 is 2 or more.

In the formula (11-3), $R^{303}$ represents a hydrogen atom or a methyl group; $X^{303}$ represents a linear or branched $C_{1-6}$ alkyl group; n303 represents an integer of 0 to 4; $X^{303}$ may have a plurality of different groups if n303 is 2 or more; and p represents an integer of 0 to 2.

In the formula (11-4), $R^{304}$ represents a hydrogen atom or a methyl group; $X^{304}$ represents a linear or branched $C_{1-6}$ alkyl group; n304 represents an integer of 0 to 4; $X^{304}$ may have a plurality of different groups if n304 is 2 or more; and p1 represents an integer of 0 to 2.

In the formulae (11-1) to (11-4), the positions bonded by $X^{301}$, $X^{302}$, $X^{303}$, and $X^{304}$ may be any position in the cyclic structure.

In the formula (11-1), preferably, n301 is 0 from the point of a high dry etching resistance.

In the formula (11-2), preferably, n302 is 0 from the point of a high dry etching resistance.

In the formula (11-3), preferably, n303 is 0 from the point of a high dry etching resistance.

In the formula (11-3), preferably, p is 0 from the point of a high solubility into an organic solvent, and p is 1 from the point of a high dry etching resistance.

In the formula (11-4), preferably, n304 is 0 from the point of a high dry etching resistance.

In the formula (11-4), preferably, p1 is 0 from the point of a high solubility into an organic solvent, and p1 is 1 from the point of a high dry etching resistance.

In order to introduce such a constituent unit (D1) into the polymer (Y), a monomer (d1) having a nonpolar alicyclic skeleton may be copolymerized with the above-mentioned monomers (a) to (c). The monomer (d1) having a nonpolar alicyclic skeleton may be solely used or a plurality of types thereof may be used in combination, as required.

The monomer (d1) having a nonpolar alicyclic skeleton is not specifically limited. Preferred examples thereof include cyclohexyl (meth)acrylate, isobornyl (meth)acrylate, norbornyl (meth)acrylate, adamantyl (meth)acrylate, tricyclodecanyl (meth)acrylate, dicyclopentadienyl (meth)acrylate, and derivatives having a linear or branched $C_{1-6}$ alkyl group on the alicyclic skeleton of these compounds.

Specific examples include monomers represented by the following formulae (14-1) to (14-5). In the formulae (14-1) to (14-5), R represents a hydrogen atom or a methyl group.

[Chemical formula 31]

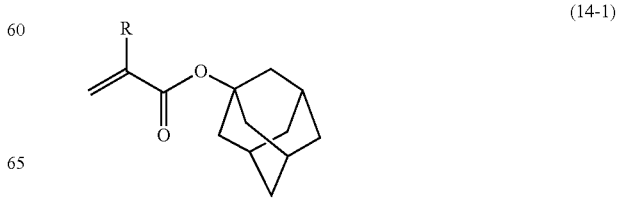

(14-1)

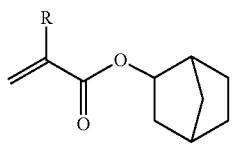
(14-2)

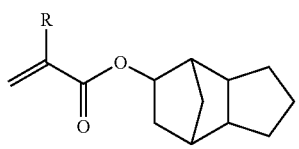
(14-3)

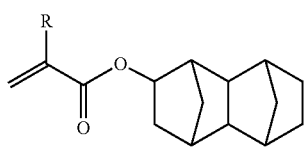
(14-4)

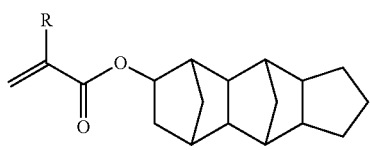
(14-5)

The polymer (Y) may also have a constituent unit (D2) besides the above.

In order to introduce such a constituent unit (D2) into the polymer (Y), a monomer (d2) may be copolymerized with the abovementioned monomers (a) to (c). The monomer (d2) may be solely used or a plurality of types thereof may be used in combination, as required.

The monomer (d2) is not specifically limited. However, preferred examples thereof include: (meth)acrylic acid esters with a linear or branched structure such as methyl (meth)acrylate, ethyl (meth)acrylate, 2-ethylhexyl (meth)acrylate, n-propyl (meth)acrylate, isopropyl (meth)acrylate, butyl (meth)acrylate, isobutyl (meth)acrylate, methoxymethyl (meth)acrylate, n-propoxyethyl (meth)acrylate, iso-propoxyethyl (meth)acrylate, n-butoxyethyl (meth)acrylate, iso-butoxyethyl (meth)acrylate, tert-butoxyethyl (meth)acrylate, 2-hydroxyethyl (meth)acrylate, 3-hydroxypropyl (meth)acrylate, 2-hydroxy-n-propyl (meth)acrylate, 4-hydroxy-n-butyl (meth)acrylate, 2-ethoxyethyl (meth)acrylate, 1-ethoxyethyl (meth)acrylate, 2,2,2-trifluoroethyl (meth)acrylate, 2,2,3,3-tetrafluoro-n-propyl (meth)acrylate, 2,2,3,3,3-pentafluoro-n-propyl (meth)acrylate, methyl α-(tri)fluoromethylacrylate, ethyl α-(tri)fluoromethylacrylate, 2-ethylhexyl α-(tri)fluoromethylacrylate, n-propyl α-(tri)fluoromethylacrylate, iso-propyl α-(tri)fluoromethylacrylate, n-butyl α-(tri)fluoromethylacrylate, iso-butyl α-(tri)fluoromethylacrylate, tert-butyl α-(tri)fluoromethylacrylate, methoxymethyl α-(tri)fluoromethylacrylate, ethoxyethyl α-(tri)fluoromethylacrylate, n-propoxyethyl α-(tri)fluoromethylacrylate, iso-propoxyethyl α-(tri)fluoromethylacrylate, n-butoxyethyl α-(tri)fluoromethylacrylate, iso-butoxyethyl α-(tri)fluoromethylacrylate, and tert-butoxyethyl α-(tri)fluoromethylacrylate;

aromatic alkenyl compounds such as styrene, α-methylstyrene, vinyltoluene, p-hydroxystyrene, p-tert-butoxycarbonylhydroxystyrene, 3,5-di-tert-butyl-4-hydroxystyrene, 3,5-dimethyl-4-hydroxystyrene, p-tert-perfluorobutylstyrene, and p-(2-hydroxy-iso-propyl)styrene;

unsaturated carboxylic acids and carboxylic anhydrides such as (meth)acrylic acid, maleic acid, maleic anhydride, itaconic acid, and itaconic anhydride; and ethylene, propylene, norbornene, tetrafluoroethylene, acrylamide, N-methylacrylamide, N,N-dimethylacrylamide, vinyl chloride, vinyl fluoride, vinylidene fluoride, and vinylpyrrolidone.

The contents of the constituent unit (D1) and constituent unit (D2) are not specifically limited. However, they are preferably within a range of 20 mol % or less based on the total number of the constituent units of the resist polymer (Y').

Preferred combinations of the constituent unit (A) and the constituent unit (B) in the polymer (Y) are enumerated in Tables 1 to 4.

TABLE 1

| Combination Example | Constituent unit (A) | Constituent unit (B) |
|---|---|---|
| 1 | Formula (10-1) | Formula (9-1) |
| 2 | Formula (10-1) | Formula (9-2) |
| 3 | Formula (10-1) | Formula (9-5) |
| 4 | Formula (10-1) | Formula (9-16) |
| 5 | Formula (10-1) | Formula (9-20) |
| 6 | Formula (10-1) | Formula (9-23) |
| 7 | Formula (10-1) | Formula (9-35) |
| 8 | Formula (10-1) | Formula (9-38) |
| 9 | Formula (10-1) | Formula (9-40) |
| 10 | Formula (10-1) | Formula (9-52) |
| 11 | Formula (10-1) | Formula (9-61) |
| 12 | Formula (10-1) | Formula (9-65) |
| 13 | Formula (10-1) | Formula (9-76) |
| 14 | Formula (10-1) | Formula (9-87) |
| 15 | Formula (10-1) | Formula (9-91) |
| 16 | Formula (10-1) | Formula (9-111) |
| 17 | Formula (10-1) | Formula (9-116) |
| 18 | Formula (10-1) | Formula (9-128) |
| 19 | Formula (10-1) | Formula (9-129) |
| 20 | Formula (10-1) | Formula (9-130) |
| 21 | Formula (10-1) | Formula (9-133) |
| 22 | Formula (10-1) | Formula (9-135) |
| 23 | Formula (10-1) | Formula (9-147) |
| 24 | Formula (10-1) | Formula (9-156) |
| 25 | Formula (10-1) | Formula (9-160) |
| 26 | Formula (10-1) | Formula (9-171) |
| 27 | Formula (10-1) | Formula (9-182) |
| 28 | Formula (10-1) | Formula (9-186) |
| 29 | Formula (10-3) | Formula (9-1) |
| 30 | Formula (10-3) | Formula (9-2) |
| 31 | Formula (10-3) | Formula (9-5) |
| 32 | Formula (10-3) | Formula (9-16) |
| 33 | Formula (10-3) | Formula (9-20) |
| 34 | Formula (10-3) | Formula (9-23) |
| 35 | Formula (10-3) | Formula (9-35) |
| 36 | Formula (10-3) | Formula (9-38) |
| 37 | Formula (10-3) | Formula (9-40) |
| 38 | Formula (10-3) | Formula (9-52) |
| 39 | Formula (10-3) | Formula (9-61) |
| 40 | Formula (10-3) | Formula (9-65) |
| 41 | Formula (10-3) | Formula (9-76) |
| 42 | Formula (10-3) | Formula (9-87) |
| 43 | Formula (10-3) | Formula (9-91) |
| 44 | Formula (10-3) | Formula (9-111) |
| 45 | Formula (10-3) | Formula (9-116) |
| 46 | Formula (10-3) | Formula (9-128) |
| 47 | Formula (10-3) | Formula (9-129) |
| 48 | Formula (10-3) | Formula (9-130) |
| 49 | Formula (10-3) | Formula (9-133) |
| 50 | Formula (10-3) | Formula (9-135) |
| 51 | Formula (10-3) | Formula (9-147) |
| 52 | Formula (10-3) | Formula (9-156) |
| 53 | Formula (10-3) | Formula (9-160) |
| 54 | Formula (10-3) | Formula (9-171) |
| 55 | Formula (10-3) | Formula (9-182) |
| 56 | Formula (10-3) | Formula (9-186) |

TABLE 2

| Combination Example | Constituent unit (A) | Constituent unit (B) |
|---|---|---|
| 57 | Formula (10-7) | Formula (9-1) |
| 58 | Formula (10-7) | Formula (9-2) |
| 59 | Formula (10-7) | Formula (9-5) |
| 60 | Formula (10-7) | Formula (9-16) |
| 61 | Formula (10-7) | Formula (9-20) |
| 62 | Formula (10-7) | Formula (9-23) |
| 63 | Formula (10-7) | Formula (9-35) |
| 64 | Formula (10-7) | Formula (9-38) |
| 65 | Formula (10-7) | Formula (9-40) |
| 66 | Formula (10-7) | Formula (9-52) |
| 67 | Formula (10-7) | Formula (9-61) |
| 68 | Formula (10-7) | Formula (9-65) |
| 69 | Formula (10-7) | Formula (9-76) |
| 70 | Formula (10-7) | Formula (9-87) |
| 71 | Formula (10-7) | Formula (9-91) |
| 72 | Formula (10-7) | Formula (9-111) |
| 73 | Formula (10-7) | Formula (9-116) |
| 74 | Formula (10-7) | Formula (9-128) |
| 75 | Formula (10-7) | Formula (9-129) |
| 76 | Formula (10-7) | Formula (9-130) |
| 77 | Formula (10-7) | Formula (9-133) |
| 78 | Formula (10-7) | Formula (9-135) |
| 79 | Formula (10-7) | Formula (9-147) |
| 80 | Formula (10-7) | Formula (9-156) |
| 81 | Formula (10-7) | Formula (9-160) |
| 82 | Formula (10-7) | Formula (9-171) |
| 83 | Formula (10-7) | Formula (9-182) |
| 84 | Formula (10-7) | Formula (9-186) |
| 85 | Formula (10-8) | Formula (9-1) |
| 86 | Formula (10-8) | Formula (9-2) |
| 87 | Formula (10-8) | Formula (9-5) |
| 88 | Formula (10-8) | Formula (9-16) |
| 89 | Formula (10-8) | Formula (9-20) |
| 90 | Formula (10-8) | Formula (9-23) |
| 91 | Formula (10-8) | Formula (9-35) |
| 92 | Formula (10-8) | Formula (9-38) |
| 93 | Formula (10-8) | Formula (9-40) |
| 94 | Formula (10-8) | Formula (9-52) |
| 95 | Formula (10-8) | Formula (9-61) |
| 96 | Formula (10-8) | Formula (9-65) |
| 97 | Formula (10-8) | Formula (9-76) |
| 98 | Formula (10-8) | Formula (9-87) |
| 99 | Formula (10-8) | Formula (9-91) |
| 100 | Formula (10-8) | Formula (9-111) |
| 101 | Formula (10-8) | Formula (9-116) |
| 102 | Formula (10-8) | Formula (9-128) |
| 103 | Formula (10-8) | Formula (9-129) |
| 104 | Formula (10-8) | Formula (9-130) |
| 105 | Formula (10-8) | Formula (9-133) |
| 106 | Formula (10-8) | Formula (9-135) |
| 107 | Formula (10-8) | Formula (9-147) |
| 108 | Formula (10-8) | Formula (9-156) |
| 109 | Formula (10-8) | Formula (9-160) |
| 110 | Formula (10-8) | Formula (9-171) |
| 111 | Formula (10-8) | Formula (9-182) |
| 112 | Formula (10-8) | Formula (9-186) |

TABLE 3

| Combination Example | Constituent unit (A) | Constituent unit (B) |
|---|---|---|
| 113 | Formula (10-10) | Formula (9-1) |
| 114 | Formula (10-10) | Formula (9-2) |
| 115 | Formula (10-10) | Formula (9-5) |
| 116 | Formula (10-10) | Formula (9-16) |
| 117 | Formula (10-10) | Formula (9-20) |
| 118 | Formula (10-10) | Formula (9-23) |
| 119 | Formula (10-10) | Formula (9-35) |
| 120 | Formula (10-10) | Formula (9-38) |
| 121 | Formula (10-10) | Formula (9-40) |
| 122 | Formula (10-10) | Formula (9-52) |
| 123 | Formula (10-10) | Formula (9-61) |
| 124 | Formula (10-10) | Formula (9-65) |
| 125 | Formula (10-10) | Formula (9-76) |
| 126 | Formula (10-10) | Formula (9-87) |
| 127 | Formula (10-10) | Formula (9-91) |
| 128 | Formula (10-10) | Formula (9-111) |
| 129 | Formula (10-10) | Formula (9-116) |
| 130 | Formula (10-10) | Formula (9-128) |
| 131 | Formula (10-10) | Formula (9-129) |
| 132 | Formula (10-10) | Formula (9-130) |
| 133 | Formula (10-10) | Formula (9-133) |
| 134 | Formula (10-10) | Formula (9-135) |
| 135 | Formula (10-10) | Formula (9-147) |
| 136 | Formula (10-10) | Formula (9-156) |
| 137 | Formula (10-10) | Formula (9-160) |
| 138 | Formula (10-10) | Formula (9-171) |
| 139 | Formula (10-10) | Formula (9-182) |
| 140 | Formula (10-10) | Formula (9-186) |
| 141 | Formula (10-12) | Formula (9-1) |
| 142 | Formula (10-12) | Formula (9-2) |
| 143 | Formula (10-12) | Formula (9-5) |
| 144 | Formula (10-12) | Formula (9-16) |
| 145 | Formula (10-12) | Formula (9-20) |
| 146 | Formula (10-12) | Formula (9-23) |
| 147 | Formula (10-12) | Formula (9-35) |
| 148 | Formula (10-12) | Formula (9-38) |
| 149 | Formula (10-12) | Formula (9-40) |
| 150 | Formula (10-12) | Formula (9-52) |
| 151 | Formula (10-12) | Formula (9-61) |
| 152 | Formula (10-12) | Formula (9-65) |
| 153 | Formula (10-12) | Formula (9-76) |
| 154 | Formula (10-12) | Formula (9-87) |
| 155 | Formula (10-12) | Formula (9-91) |
| 156 | Formula (10-12) | Formula (9-111) |
| 157 | Formula (10-12) | Formula (9-116) |
| 158 | Formula (10-12) | Formula (9-128) |
| 159 | Formula (10-12) | Formula (9-129) |
| 160 | Formula (10-12) | Formula (9-130) |
| 161 | Formula (10-12) | Formula (9-133) |
| 162 | Formula (10-12) | Formula (9-135) |
| 163 | Formula (10-12) | Formula (9-147) |
| 164 | Formula (10-12) | Formula (9-156) |
| 165 | Formula (10-12) | Formula (9-160) |
| 166 | Formula (10-12) | Formula (9-171) |
| 167 | Formula (10-12) | Formula (9-182) |
| 168 | Formula (10-12) | Formula (9-186) |

TABLE 4

| Combination example | Constituent unit (A) | Constituent unit (B) |
|---|---|---|
| 168 | Formula (10-17) | Formula (9-1) |
| 169 | Formula (10-17) | Formula (9-2) |
| 170 | Formula (10-17) | Formula (9-5) |
| 171 | Formula (10-17) | Formula (9-16) |
| 172 | Formula (10-17) | Formula (9-20) |
| 173 | Formula (10-17) | Formula (9-23) |
| 174 | Formula (10-17) | Formula (9-35) |
| 175 | Formula (10-17) | Formula (9-38) |
| 176 | Formula (10-17) | Formula (9-40) |
| 177 | Formula (10-17) | Formula (9-52) |
| 178 | Formula (10-17) | Formula (9-61) |
| 179 | Formula (10-17) | Formula (9-65) |
| 180 | Formula (10-17) | Formula (9-76) |
| 181 | Formula (10-17) | Formula (9-87) |
| 182 | Formula (10-17) | Formula (9-91) |
| 183 | Formula (10-17) | Formula (9-111) |

TABLE 4-continued

| Combination example | Constituent unit (A) | Constituent unit (B) |
|---|---|---|
| 184 | Formula (10-17) | Formula (9-116) |
| 185 | Formula (l0-17) | Formula (9-128) |
| 186 | Formula (10-17) | Formula (9-129) |
| 187 | Formula (10-17) | Formula (9-130) |
| 188 | Formula (10-17) | Formula (9-133) |
| 189 | Formula (10-17) | Formula (9-135) |
| 190 | Formula (10-17) | Formula (9-147) |
| 191 | Formula (10-17) | Formula (9-156) |
| 192 | Formula (10-17) | Formula (9-150) |
| 193 | Formula (10-17) | Formula (9-171) |
| 194 | Formula (10-17) | Formula (9-182) |
| 195 | Formula (10-17) | Formula (9-186) |
| 196 | Formula (10-19) | Formula (9-1) |
| 197 | Formula (10-19) | Formula (9-2) |
| 198 | Formula (10-19) | Formula (9-5) |
| 199 | Formula (10-19) | Formula (9-16) |
| 200 | Formula (10-19) | Formula (9-20) |
| 201 | Formula (10-19) | Formula (9-23) |
| 202 | Formula (10-19) | Formula (9-35) |
| 203 | Formula (10-19) | Formula (9-38) |
| 204 | Formula (10-19) | Formula (940) |
| 205 | Formula (10-19) | Formula (9-52) |
| 206 | Formula (10-19) | Formula (9-61) |
| 207 | Formula (10-19) | Formula (9-65) |
| 208 | Formula (10-19) | Formula (9-76) |
| 209 | Formula (10-19) | Formula (9-87) |
| 210 | Formula (10-19) | Formula (9-91) |
| 211 | Formula (10-19) | Formula (9-111) |
| 212 | Formula (10-19) | Formula (9-116) |
| 213 | Formula (10-19) | Formula (9-128) |
| 214 | Formula (10-19) | Formula (9-129) |
| 215 | Formula (10-19) | Formula (9-130) |
| 216 | Formula (10-19) | Formula (9-133) |
| 217 | Formula (10-19) | Formula (9-135) |
| 218 | Formula (10-19) | Formula (9-147) |
| 219 | Formula (10-19) | Formula (9-156) |
| 220 | Formula (10-19) | Formula (9-160) |
| 221 | Formula (10-19) | Formula (9-171) |
| 222 | Formula (10-19) | Formula (9-182) |
| 223 | Formula (10-19) | Formula (9-186) |

Moreover, for the constituent unit (A), one type or more selected from a group consisting of the above formulae (10-1) and (10-3), and one type or more selected from a group consisting of the above formulae (10-7), (10-8), (10-10), (10-12), (10-17), and (10-19) may be used together. Furthermore, in addition to the combinations enumerated in Table 1, as the constituent unit (C), combinations (hereunder, referred to as "combinations A") added with a monomer selected from a group consisting of the above formulae (13-1), (13-26), (13-27), (13-30), (13-31), and (13-68) are also preferred. With respect to the combinations enumerated in Table 1 or the combinations A, as the constituent unit (D1), combinations added with monomers of one type or more selected from a group consisting of the above formulae (14-1) and (14-3) are also preferred.

The constituent unit (E) is described. The constituent unit (E) is a constituent unit having the structure of the following formula (1).

[Chemical Formula 32]

[Chemical formula 32]

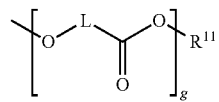

(1)

[In the formula (1), L is a divalent linear, branched, or cyclic $C_{1-20}$ hydrocarbon group which may have a substituent and/or a heteroatom; $R^{11}$ is a g-valent linear, branched, or cyclic $C_{1-20}$ hydrocarbon group which may have a substituent and/or a heteroatom; and g represents an integer of 1 to 24.

The divalent hydrocarbon group of L in the formula (1) includes linear, branched, or cyclic hydrocarbon groups such as a methylene group, an ethylene group, a propylene group, an iso-propylene group, an n-butylene group, a sec-butylene group, a pentylene group, a neo-pentylene group, an octylene group, a nonylene group, a decylene group, a cyclopentylene group, and a cyclohexylene group.

From the point of increasing the introduction rate into the polymer, L in the formula (1) is preferably a divalent linear, branched, or cyclic $C_{1-6}$ hydrocarbon group, more preferably a divalent linear, branched, or cyclic $C_{1-4}$ hydrocarbon group, and particularly preferably a divalent $C_2$ hydrocarbon group.

From the point of increasing the introduction rate into the polymer, if g is 1 or 2, $R^{11}$ in the formula (1) is preferably a g-valent linear, branched, or cyclic $C_{1-10}$ hydrocarbon group, and more preferably a g-valent linear, branched, or cyclic $C_{1-4}$ hydrocarbon group, which may have a substituent and/or a heteroatom.

From the point of an excellent line edge roughness, if g is 3 to 24, $R^{11}$ in the formula (1) is preferably a g-valent linear, branched, or cyclic $C_{1-12}$ hydrocarbon group, which may have a substituent and/or a heteroatom.

From the point of increasing the introduction rate into the polymer, g in the formula (1) is preferably 1 or 2. From the point of an excellent line edge roughness, g is preferably 3 to 8.

In L or $R^{11}$, the "substituent" means a linear, branched, or cyclic $C_{1-6}$ alkyl group, a thiol group, a hydroxy group, a carboxy group, a $C_{1-6}$ acyl group, a $C_{1-6}$ alkoxy group, a carboxy group esterified with $C_{1-6}$ alcohol, a carboxy group thioesterified with $C_{1-6}$ thiol, a cyano group, an amino group, halogen, or a nitroxy group; and the "hetero atom" means a sulfur atom, a nitrogen atom, an oxygen atom, or a phosphorus atom.

Here, the linear, branched, or cyclic $C_{1-6}$ alkyl group of the "substituent" may have a group of one type or more selected from a group consisting of a thiol group, a hydroxy group, a carboxy group, a $C_{1-6}$ acyl group, a carboxy group esterified with $C_{1-6}$ alcohol, a carboxy group thioesterified with $C_{1-6}$ thiol, a cyano group, an amino group, halogen, and a nitroxy group.

Moreover, in the formula (1), the hetero atom contained in L or $R^{11}$ includes a sulfur atom, a nitrogen atom, an oxygen atom, and a phosphorus atom. In this case, electrovalence of the hetero atom changes according to the valence of the hetero atom.

Examples of the basic structure of $R^{11}$ include structures represented by the following formulae (6-1) to (6-198), which does not mean that all of the uncombined bonds are bonded with —O—C(O)-L-O—, but means that, after hydrogen atoms or the above substituents are bonded, the rest of uncombined bonds are bonded to —O—C(O)-L-O—.
[Chemical formula 33]
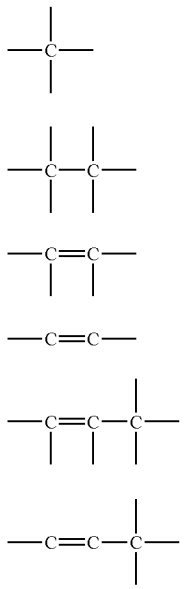
(6-1)
(6-2)
(6-3)
(6-4)
(6-5)
(6-6)
(6-7)
(6-8)
(6-9)
(6-10)
(6-11)
(6-12)
(6-13)
(6-14)
(6-15)
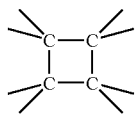 (6-16)
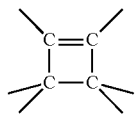 (6-17)
(6-18)
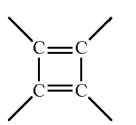 (6-19)
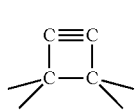 (6-20)
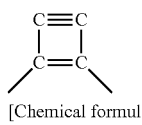
[Chemical formula 34]
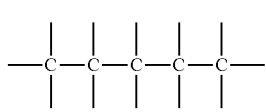 (6-21)
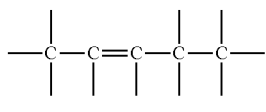 (6-22)
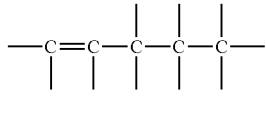 (6-23)
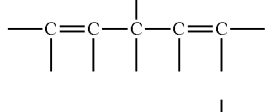 (6-24)
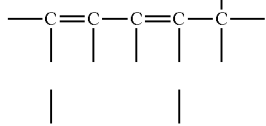 (6-25)
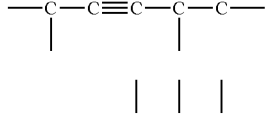 (6-26)
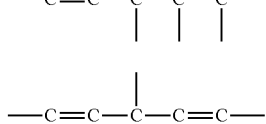 (6-27)
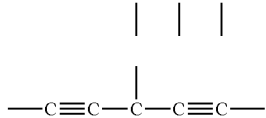 (6-28)
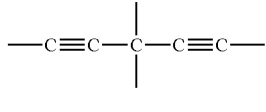 (6-29)

(6-30)
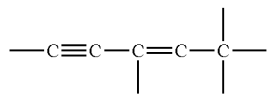
(6-31)
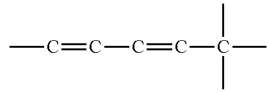
[Chemical formula 35]
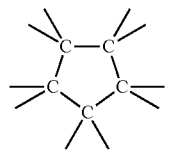
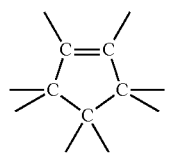
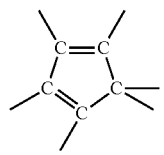
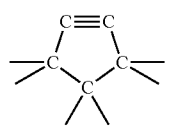
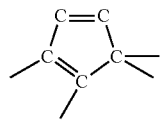
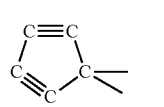
[Chemical formula 35]
(6-38)
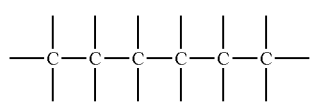
(6-39)
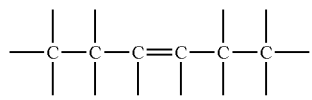
(6-40)
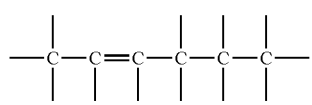
(6-41)
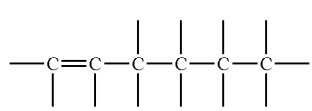
(6-42)
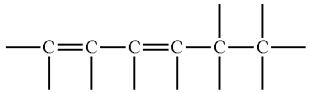
(6-43)
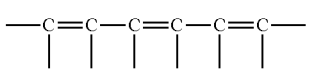
(6-44)
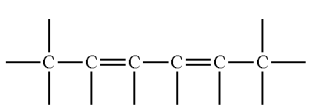
(6-45)
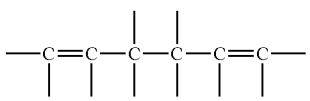
(6-46)
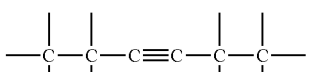
(6-47)
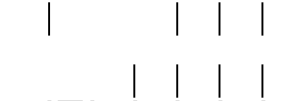
(6-48)
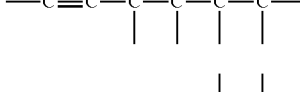
(6-49)
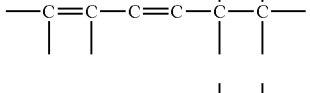
(6-50)
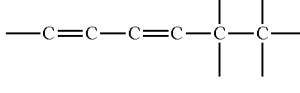
(6-51)
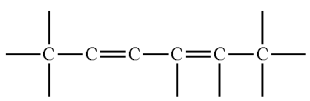
(6-52)
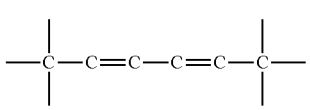
(6-53)
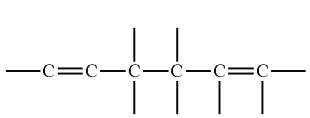
(6-54)
(6-55)
(6-56)
(6-57)

[Chemical formula 36]
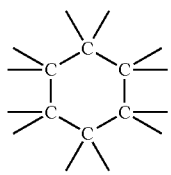
(6-58)
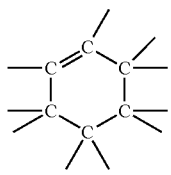
(6-59)
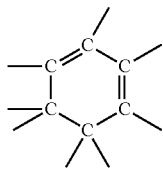
(6-60)
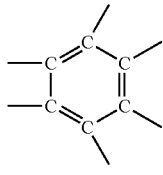
(6-61)
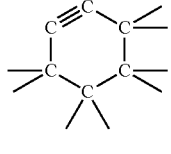
(6-62)
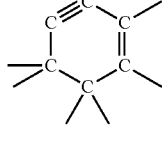
(6-63)
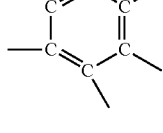
(6-64)
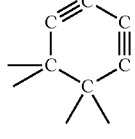
(6-65)
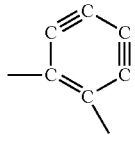
(6-66)
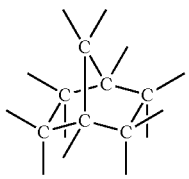
(6-67)
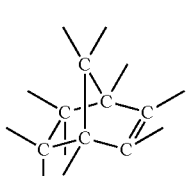
(6-68)
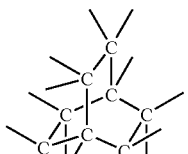
(6-69)
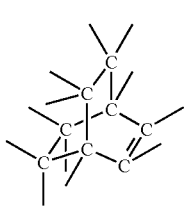
(6-70)
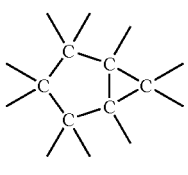
(6-71)
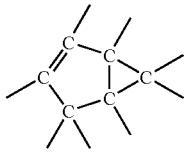
(6-72)
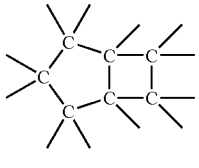
(6-73)
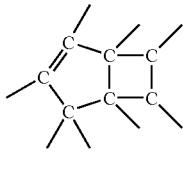
(6-74)
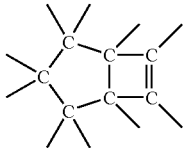
(6-75)

(6-76)
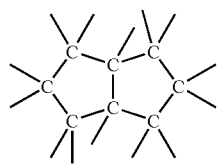
(6-77)
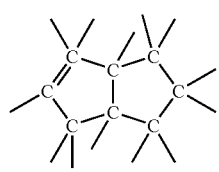
(6-78)
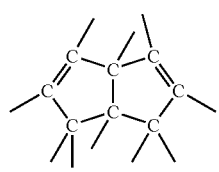
(6-79)
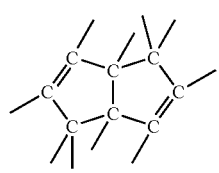
[Chemical formula 37]
(6-80)
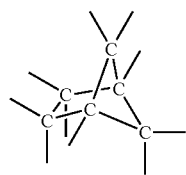
(6-81)
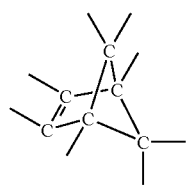
(6-82)
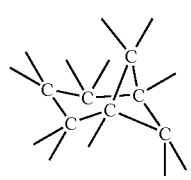
(6-83)
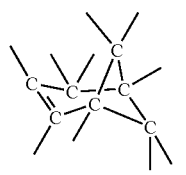
(6-84)
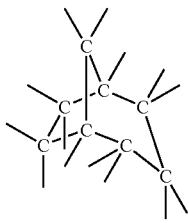
(6-85)
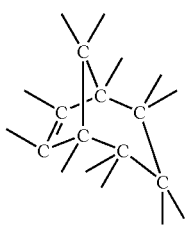
(6-86)
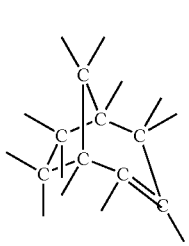
(6-87)
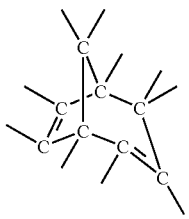
(6-88)
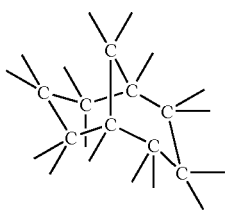
(6-89)
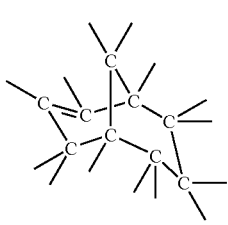
(6-90)
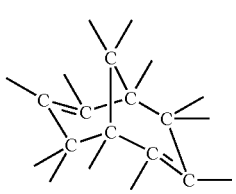

(6-91)
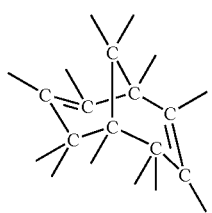
(6-92)
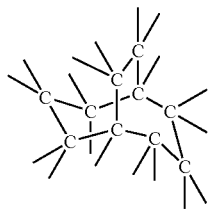
(6-93)
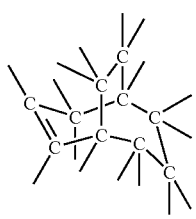
(6-94)
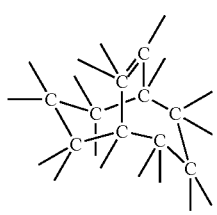
(6-95)
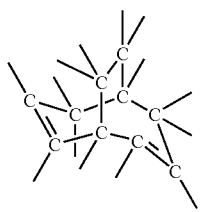
(6-96)
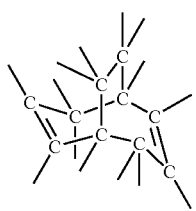
(6-97)
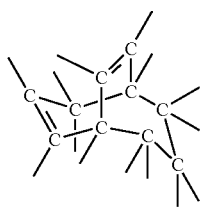
[Chemical formula 38]
(6-98)
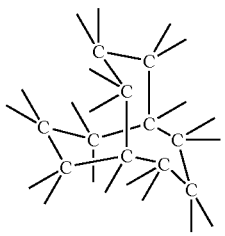
(6-99)
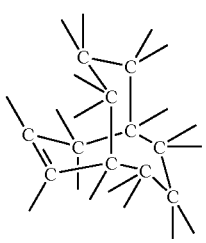
(6-100)
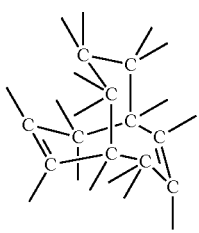
(6-101)
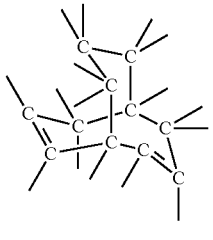
(6-102)
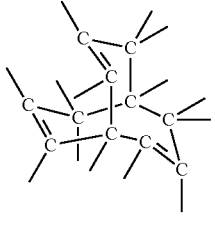
(6-103)
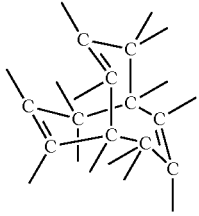

-continued
(6-104)
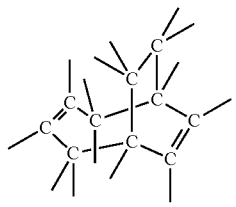
(6-105)
[Chemical formula 39]
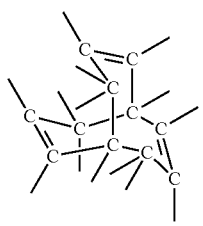
(6-106)
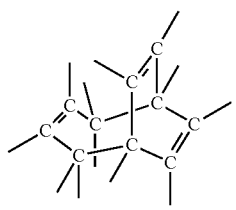
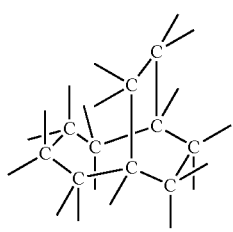
(6-107)
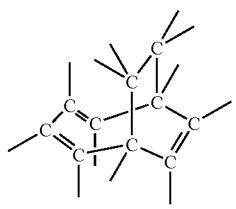
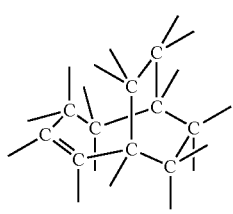
[Chemical formula 40]
(6-108)
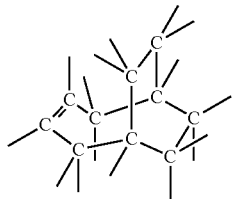
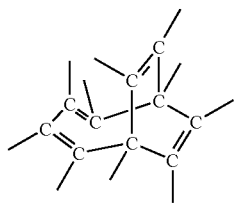
(6-109)
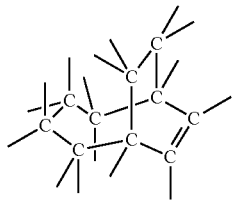
(6-110)
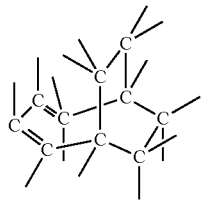
(6-111)
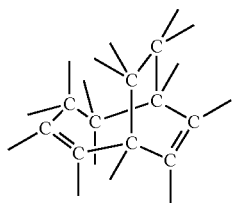
(6-112)
(6-113)
(6-114)
(6-115)
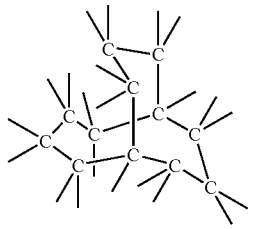
(6-116)
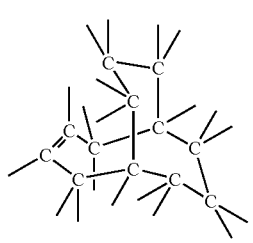
(6-117)
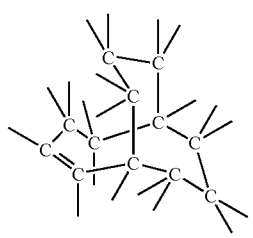

(6-118)
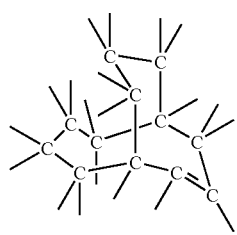
(6-119)
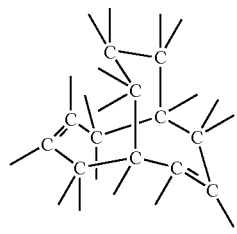
(6-120)
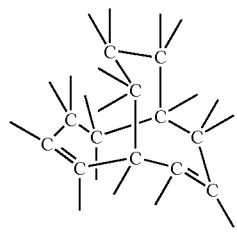
(6-121)
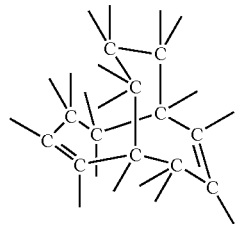
(6-122)
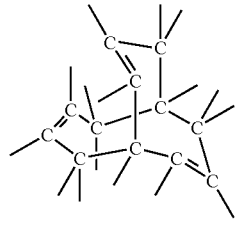
(6-123)
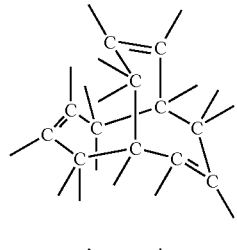
(6-124)
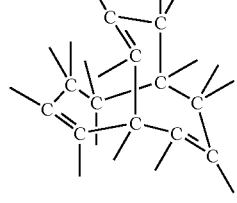
(6-125)
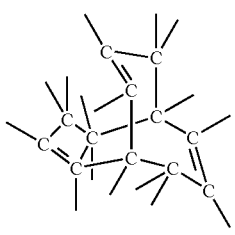
(6-126)
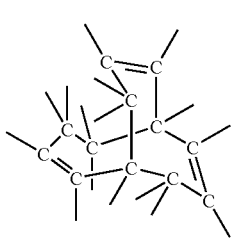
[Chemical formula 41]
(6-127)
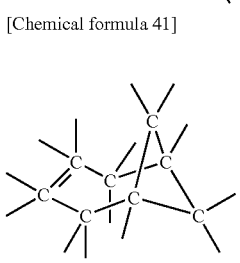
(6-128)
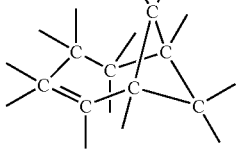
(6-129)
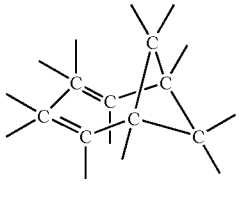
(6-130)
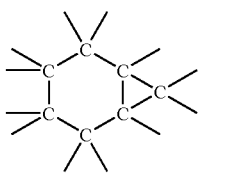
(6-131)
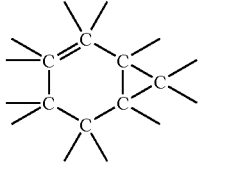
(6-132)
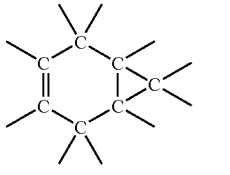

(6-133)
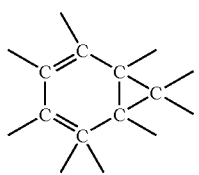
(6-134)
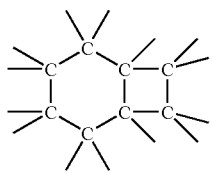
(6-135)
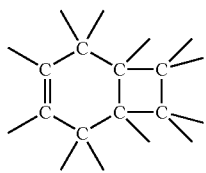
(6-136)
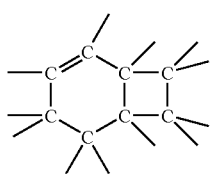
(6-137)
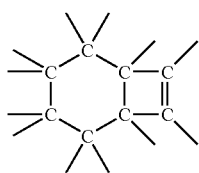
(6-138)
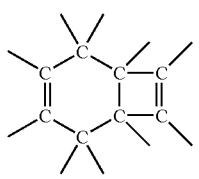
(6-139)
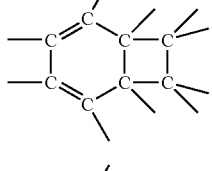
(6-140)
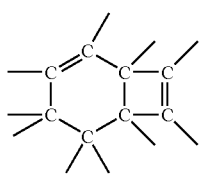
(6-141)
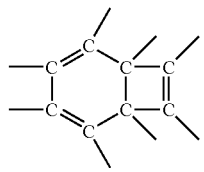
[Chemical formula 42]
(6-142)
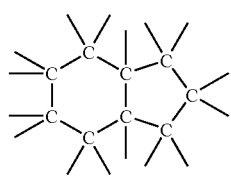
(6-143)
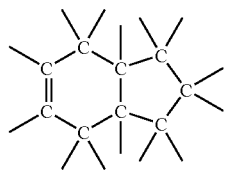
(6-144)
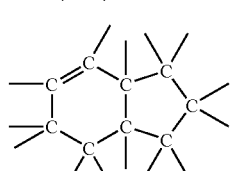
(6-145)
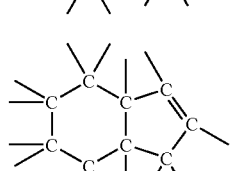
(6-146)
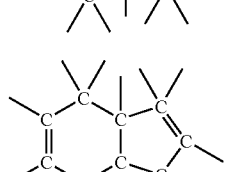
(6-147)
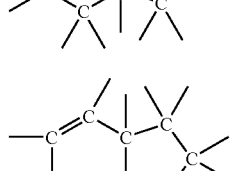
(6-148)
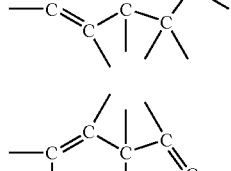
(6-149)

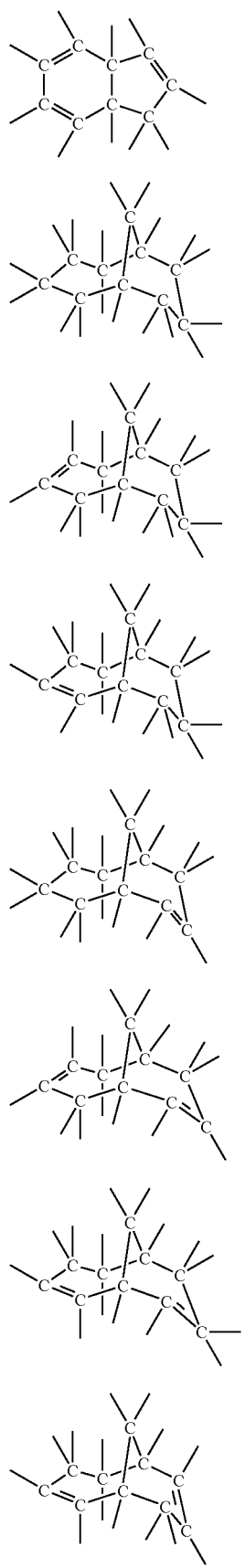
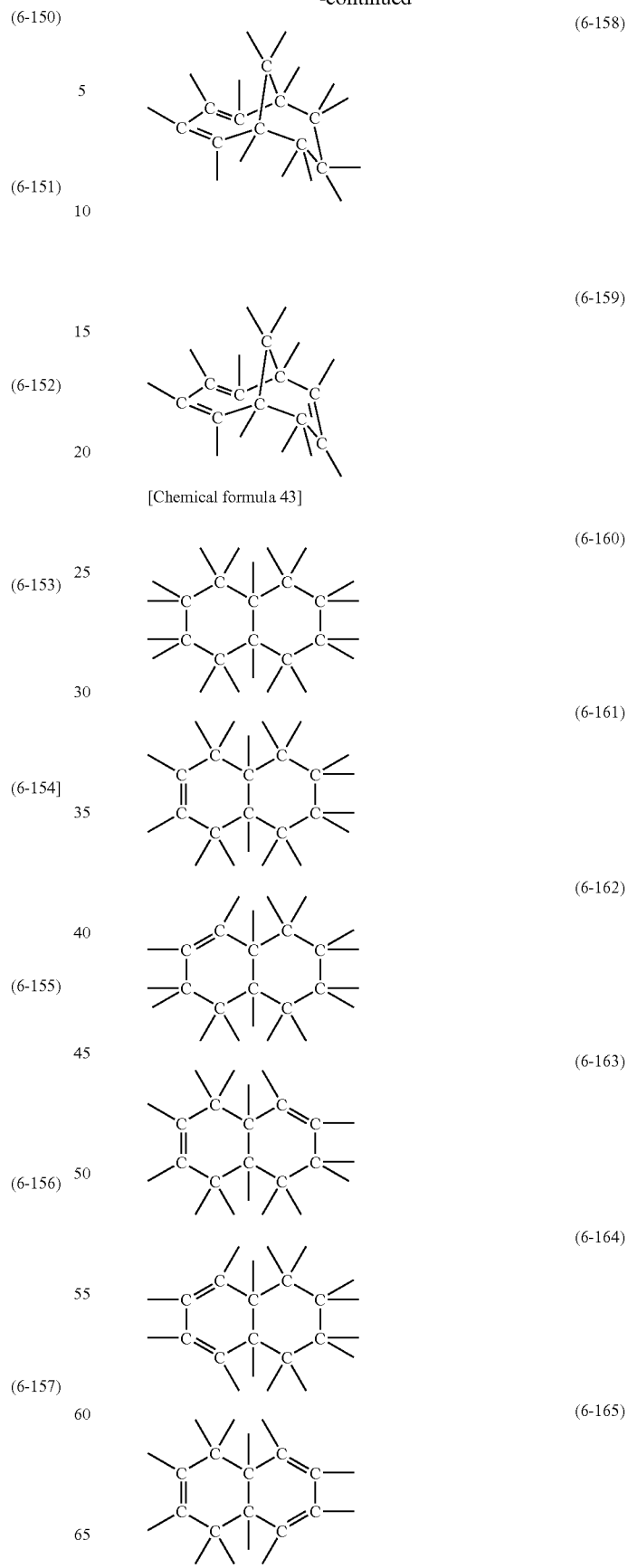

(6-166)
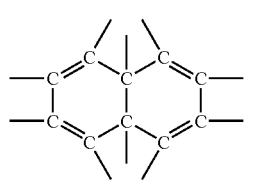
(6-167)
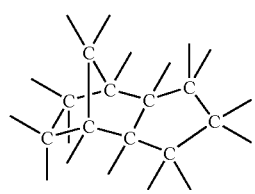
(6-168)
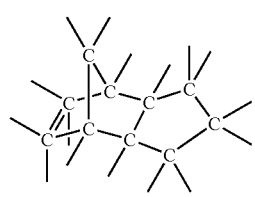
(6-169)
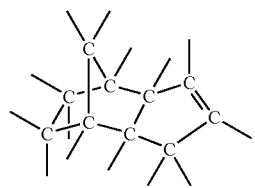
(6-170)
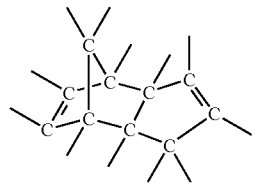
(6-171)
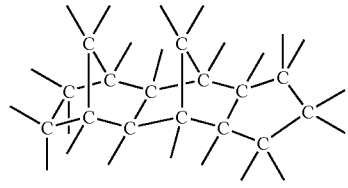
(6-172)
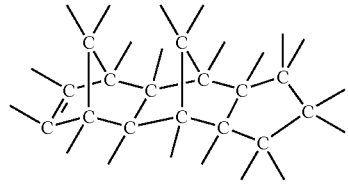
(6-173)
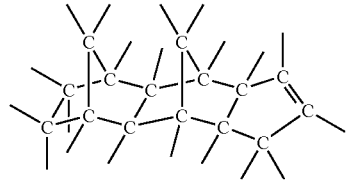
(6-174)
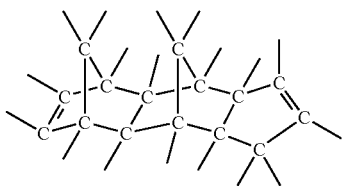
[Chemical formula 44]
(6-175)
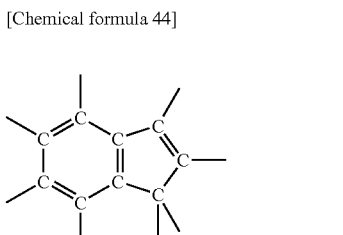
(6-176)
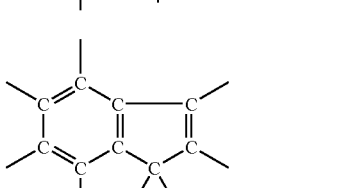
(6-177)
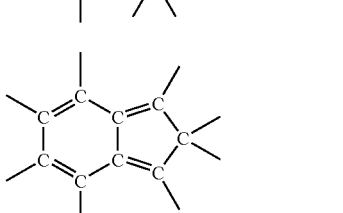
(6-178)
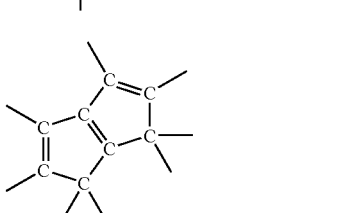
(6-179)
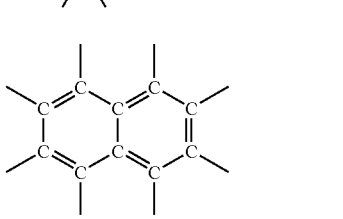
(6-180)
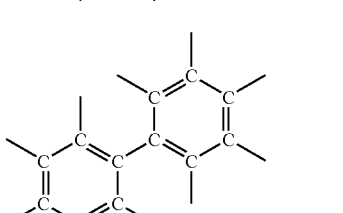
(6-181)
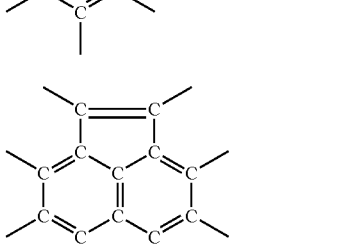

(6-182)
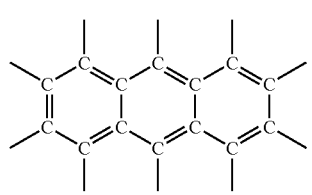
(6-183)
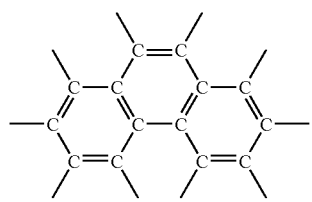
(6-184)
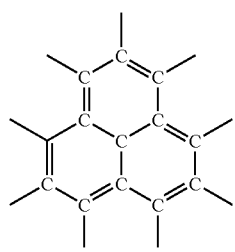
(6-185)
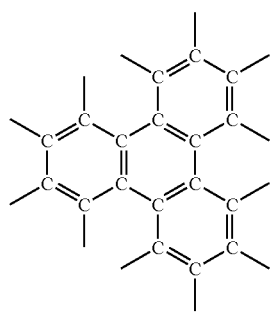
(6-186)
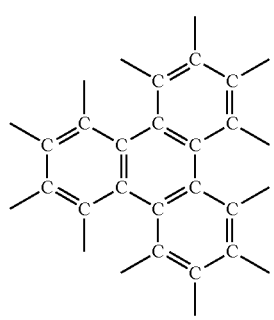
(6-187)
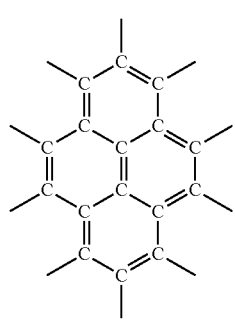
(6-188)
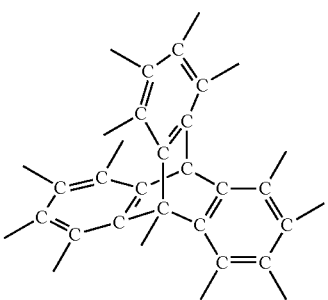
[Chemical formula 45]
(6-189)
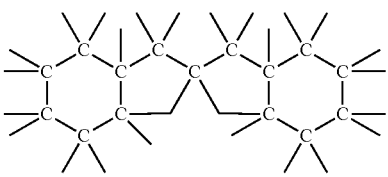
(6-190)
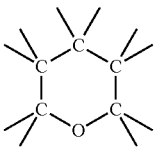
(6-191)
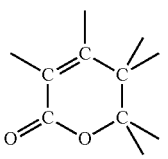
(6-192)
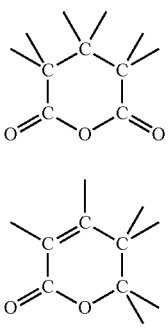
(6-193)
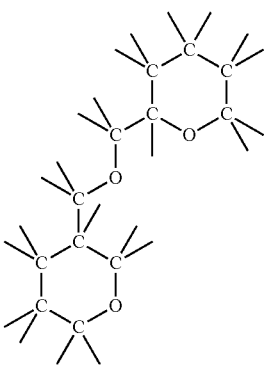
(6-194)
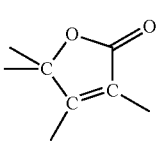

(6-195)
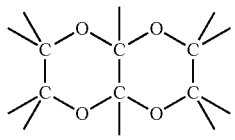

(6-196)
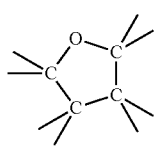

(6-197)
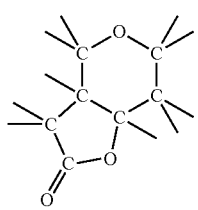

(6-198)
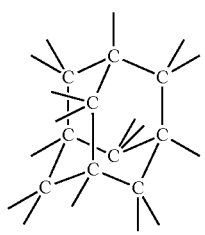

Among them, the structures represented by the above formulae (6-1), (6-61), (6-179), and (6-190) to (6-198) are preferred.

The content of the constituent unit (E) is 0.3 mol % or more based on the total number of the constituent units of the resist polymer (Y'). If the content of the constituent unit (E) is 0.3 mol % or more, the handling property of wet powder obtained by reprecipitation, the storage stability of the resist composition, and the resist pattern rectangularity are improved.

In particular, the polymer containing the constituent unit (C) has an unfavorable handling property of wet powder if reprecipitated, and is prone to become sticky. However, even if the constituent unit (C) is used, when the content of the constituent unit (E) is 0.3 mol % or more, the handling property of reprecipitated wet powder is remarkably improved. Moreover, in combination with the constituent unit (C), when the content of the constituent unit (E) is 0.3 mol % or more, the resist pattern rectangularity is particularly improved.

The lower limit of the content of the constituent unit (E) is not specifically limited. However, it is preferably 0.35 mol % or more, and more preferably 0.4 mol % or more. Moreover, the upper limit of the content of the constituent unit (E) is not specifically limited. However, it is preferably 8 mol % or less, more preferably 6 mol % or less, yet more preferably 4 mol % or less, and particularly preferably 3 mol % or less.

In order to introduce the constituent unit (E) into the polymer (Y), the production can be performed by polymerizing monomers having the abovementioned monomers (a) to (c) in a polymerization solvent containing a hydroxy group-containing ester (e).

Generally, the polymerization of the abovementioned monomers (a) to (c) is performed by radical polymerization. In radical polymerization, firstly the polymerization initiator is decomposed by heat or the like to generate a radical species, and chain polymerization of the monomers progresses using this radical species as a starting point. Thereafter, a polymer having radicals at the growth terminal thereof is generated. When a hydroxy group-containing ester (e) is used as a polymerization solvent, such a radical at this growth terminal abstracts a hydrogen atom in the hydroxy group, and a polymer with inactivated growth terminal is thereby generated. On the other hand, the hydroxy group-containing ester (e) in which the hydrogen atom has been abstracted has a structure with a radical, that is, a radical species. This radical species progresses chain polymerization as a starting point or recombines with the polymer radical so that hydroxy group-containing ester (e) residues (constituent unit (E)) are incorporated into the structure of the obtained polymer. That is, since the hydroxy group-containing ester (e) has a chain transfer property, it has an effect of introducing the constituent unit (E) having the structure of the formula (1) into the polymer.

That is, by polymerizing the monomers having the abovementioned monomers (a) to (c) in the polymerization solvent containing the hydroxy group-containing ester (e), the polymer (Y) comprising a constituent unit (A), a constituent unit (B), a constituent unit (C), and a constituent unit (E) can be produced. For example, here is a description of a case where an ester having one hydroxy group is used as a polymerization solvent. As described above, the radical species of a hydroxy group-containing ester in which a hydrogen atom has been abstracted performs as a starting point and chain polymerization starts from the starting point. If this chain reaction of the grown polymer radical is stopped due to a hydrogen abstraction, then there is obtained a polymer ($Y_1$) having a hydroxy group-containing ester (e) residue (constituent unit (E)) on one terminal. Moreover, if the polymer radical which has grown from the radical of the hydroxy group-containing ester in which a hydrogen atom is abstracted is stopped due to rebonding, then there is obtained a polymer ($Y_2$) having hydroxy group-containing ester (e) residues (constituent unit (E)) on both terminals.

In this manner, the constituent unit (E) is incorporated into the polymer, however, a chain transfer reaction to the hydroxy group-containing ester (e) occurs in competition with the chain polymerization of monomers. Therefore, when the monomers having the abovementioned monomers (a) to (c) are polymerized in the polymerization solvent containing the hydroxy group-containing ester (e), together with the polymer ($Y_1$) and the polymer ($Y_2$) comprising a constituent unit (A), a constituent unit (B), a constituent unit (C), and a constituent unit (E), there is generated a polymer ($Y_0$) (that does not correspond to the polymer (Y), but is referred to as a polymer ($Y_0$) for the sake of convenience) comprising the constituent unit (A), the constituent unit (B), and the constituent unit (C) but does not have the constituent unit (E).

Consequently, the resist polymer (Y') obtained in this manner generally becomes a mixture of the polymer ($Y_0$), the polymer ($Y_1$), the polymer ($Y_2$), and the like. Of course, by selecting the polymerization condition, it is possible to selectively obtain the polymer ($Y_1$) only, or to selectively obtain the polymer ($Y_2$) only.

As described above, if an ester having one hydroxy group is used as the polymerization solvent, there is obtained a polymer having the constituent unit (E) on one terminal or both terminals. However, if an ester having two hydroxy groups is used as the polymerization solvent, there is not only obtained a polymer having the constituent unit(s) (E) on one terminal or both terminals, but also a polymer having the constituent unit (E) in the chain of the polymer (part which is not a terminal). Moreover, if an ester having three hydroxy groups or more is used as the polymerization solvent, there is not only obtained a polymer having the constituent unit (E) on one terminal or both terminals, but also a star-shaped polymer having the constituent unit (E) in the center point.

The hydroxy group-containing ester (e) is not specifically limited. However, it includes an ester represented by the formula (2).

[Chemical formula 46]

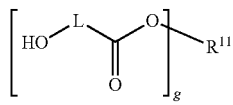
(2)

[In the formula (2), L, $R^{11}$, and g are synonymous with the definition of the above formula (1).]

In the formula (2), if g is 1, a hydroxy group-containing ester represented by the following formula (e-1) is preferred.

[Chemical formula 47]

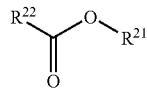
(e-1)

[In the formula, $R^{21}$ and $R^{22}$ independently represent a linear or branched $C_{1-20}$ alkyl group which may a hydroxy group. The total number of the hydroxy groups contained in $R^{21}$ and $R^{22}$ is 1 or more.]

Among them, from the point that a chain transfer constant is large, preferably, $R^{22}$ contains a hydroxy group.

Moreover, preferably, the number of carbon atoms in the linear or branched alkyl group is 1 to 6.

Specifically, those represented by the following formulae (e-11) to (e-16) are preferred.

[Chemical formula 48]

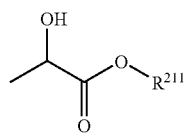
(e-11)

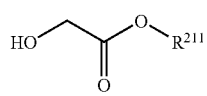
(e-12)

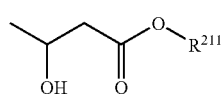
(e-13)

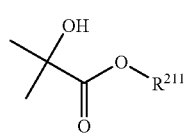
(e-14)

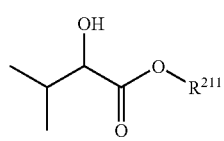
(e-15)

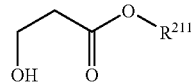
(e-16)

[In the formula, $R^{211}$ represents a linear or branched $C_{1-6}$ alkyl group.]

The formula (e-11) is an example of lactate ester, the formulae (e-12) and (e-13) are examples of hydroxy butyrate ester, the formula (e-14) is an example of hydroxy isobutyrate ester, the formula (e-15) is an example of hydroxy isovalerate ester, and the formula (e-16) is an example of hydroxy propionate ester. From the point that a chain transferability (chain transfer constant) is large and defects of the resist composition is few, ethyl lactate and butyl lactate are particularly preferred.

In the compound represented by the above formula (2), specific examples of the case where g is 2 or more include the following formulae (7-1) to (7-21). Among them, (7-3), (7-14), and (7-21) are preferred.

[Chemical formula 49]

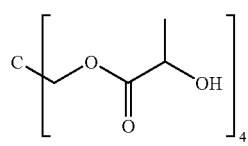
(7-1)

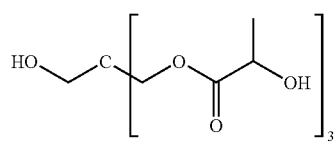
(7-2)

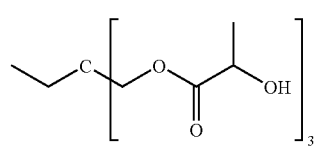
(7-3)

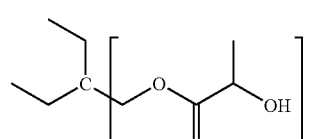
(7-4)

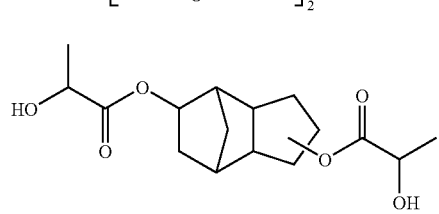
(7-5)

-continued
(7-6)
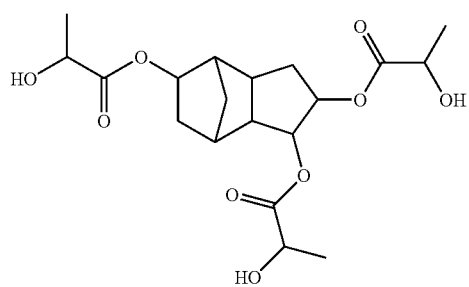
(7-7)
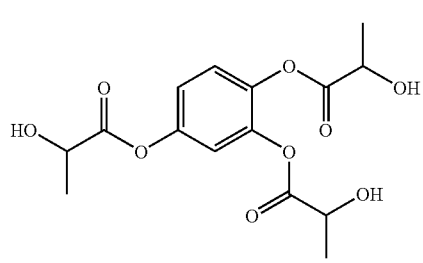
(7-8)
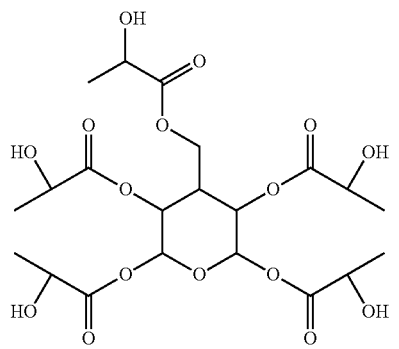
(7-9)
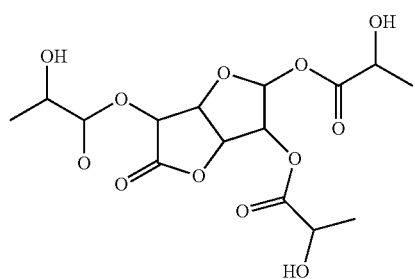
(7-10)
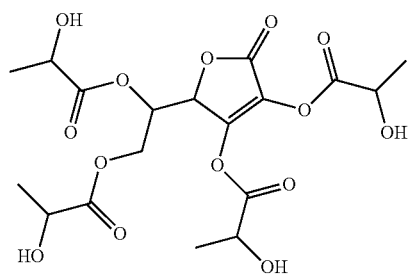
-continued
(7-11)
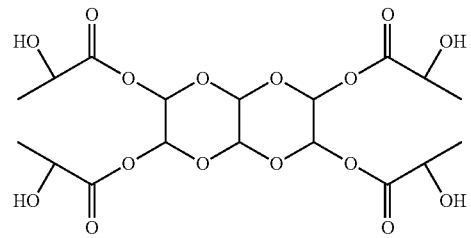
(7-12)
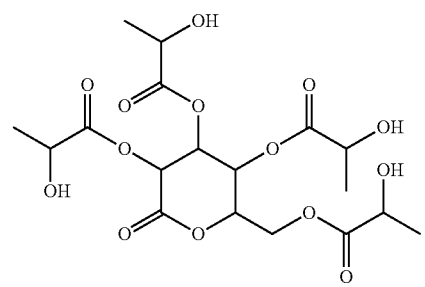
(7-13)
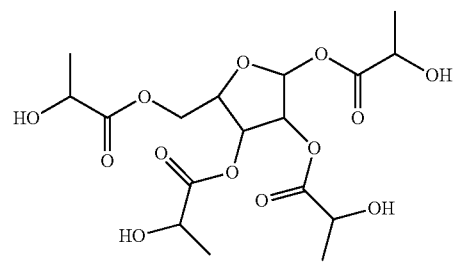
(7-14)
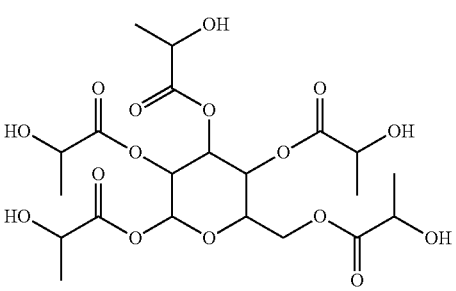
[Chemical formula 50]
(7-15)
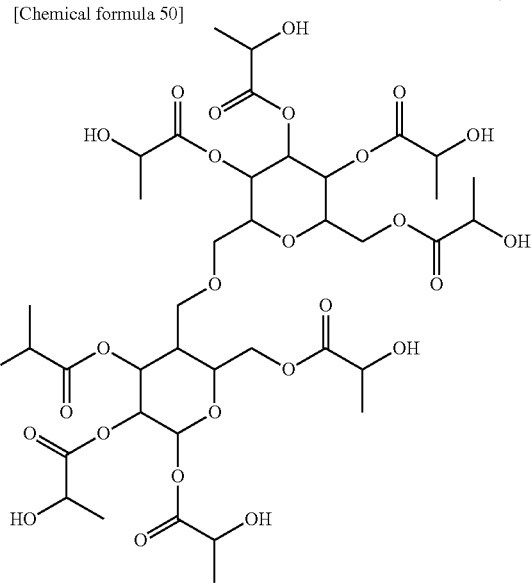

(7-16)
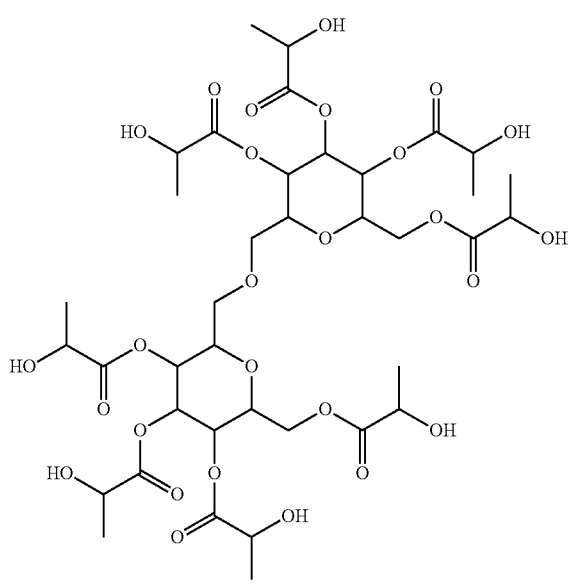
(7-17)
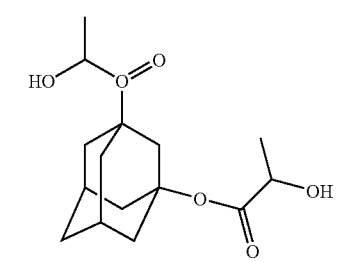
(7-18)
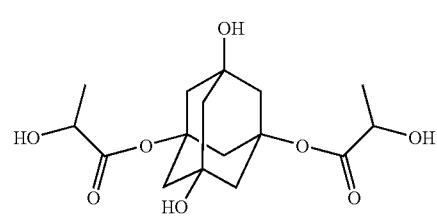
(7-19)
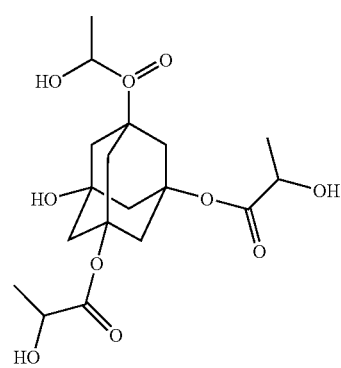
(7-20)
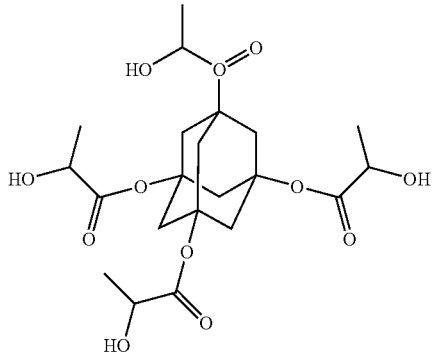
(7-21)
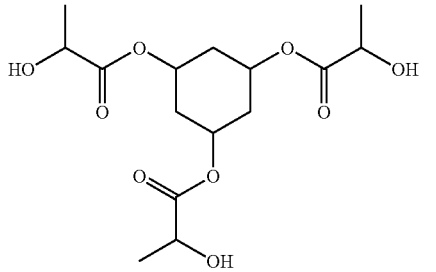
For example, compounds represented by the formulae (7-3), (7-14), and (7-21) can be respectively synthesized by the following schemes, however they are not limited to these schemes.
[Chemical formula 51]
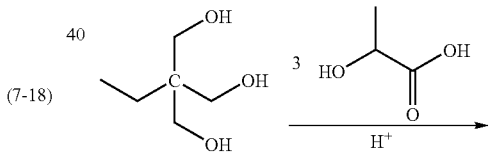
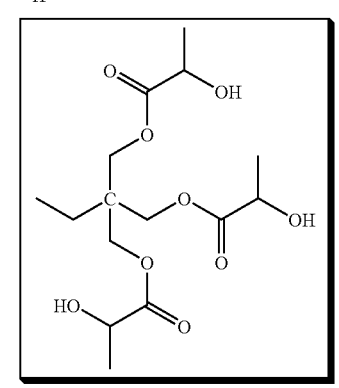
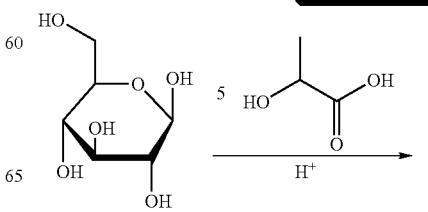

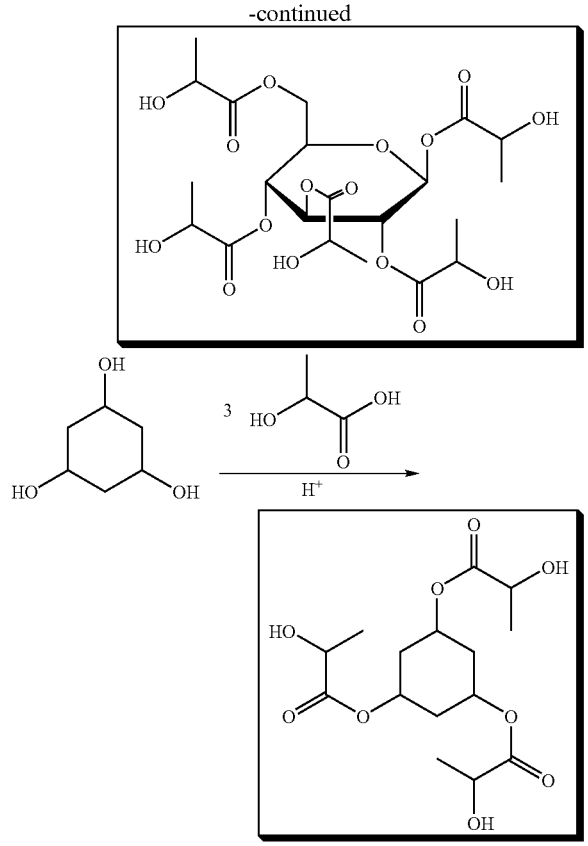

The compound of the above formula (2) may be solely used or a plurality of types thereof may be used in combination.

Moreover, since the hydroxy group-containing ester (e) has the chain transfer property, it demonstrates an effect of reducing the molecular weight of the polymer. Consequently, the polymer (Y) obtained by polymerizing in a polymerization solvent containing a hydroxy group-containing ester (e) has a narrow molecular weight distribution (Mw/Mn). Consequently, the resist polymer (Y') containing the polymer (Y) contains a polymer (Y) having a low molecular weight, a narrow molecular weight distribution, and the constituent unit (E) (hydrophilic group called an ester group) in the polymer. Therefore, in a resist composition or a resist film, entanglement between polymers is limited to some extent, and a result it is prone to have a superior line edge roughness.

The molecular weight distribution of the resist polymer (Y') containing the polymer (Y) is not specifically limited. However, it is preferably within a range between 1.85 and 1.0, and more preferably 1.8 and 1.2.

Moreover, the mass average molecular weight of the resist polymer (Y') is not specifically limited. However, from the point of the dry etching resistance and the resist pattern shape, it is preferably 1000 or more, more preferably 2000 or more, particularly preferably 4000 or more, and yet more preferably 5000 or more. Furthermore, from the point of the solubility into a resist solvent and the resolution, the mass average molecular weight of the resist polymer of the present invention is preferably 100000 or less, more preferably 50000 or less, and yet more preferably 30000 or less. From the point of the line edge roughness and the tailing, it is particularly preferably 15000 or less.

Since the handling property of wet powder obtained by reprecipitation is remarkably improved, the mass average molecular weight is most preferably 12000 or less.

Moreover, as described above, the resist polymer (Y') containing the polymer (Y) has a low molecular weight and a narrow molecular weight distribution without using a sulfur-containing chain transfer agent, and thus the resist composition tends to have a superior storage stability.

The resist polymer (Y') of the present invention can be produced by polymerizing monomers containing the monomer (a), the monomer (b), and the monomer (c), in a polymerization solvent containing a hydroxy group-containing ester (e) of 25 mass % or more.

The polymerization method is not specifically limited. However, from the viewpoint of reducing the production cost and impurities in the polymer, and from the viewpoint of introducing the constituent unit (E) into the polymer, preferably production is performed by radical polymerization.

The polymerization is performed by solution polymerization. In a polymerization solvent, the content of the hydroxy group-containing ester (e) is 25 mass % or more. If the content of the hydroxy group-containing ester (e) is 25 mass % or more, there can be obtained a resist polymer (Y') having the content of the constituent unit (E) of 0.3 mol % or more, and the handling property of reprecipitated wet powder tends to be improved.

The preferred range of the content of the hydroxy group-containing ester (e) has an optimum range according to the type of the hydroxy group-containing ester (e), the mass average molecular weight of the resist polymer (Y') to be produced, the solid content of the polymerization solvent obtained in the end, the polymerization temperature, or the like.

For example, when a resist polymer (Y') having the mass average molecular weight of about 15000 is to be produced, preferably, the concentration of the solid content of the polymer solution obtained in the end by means of solution polymerization is 20 mass % or more from the aspect of the yield rate of the resist polymer (Y') obtained by reprecipitation, and 60 mass % or less from the aspect of the viscosity of the polymer solution. Within the range of this solid content, in order to obtain a polymer (Y) having the content of the constituent unit (E) of 0.3 mol % or more at the polymerization temperature of 80° C., the content of the hydroxy group-containing ester (e) is preferably 25 mass % or more at the lower limit (20 mass %) of the solid content concentration, and the content of the hydroxy group-containing ester (e) is preferably 75 mass % or more at the upper limit (60 mass %) of the solid content concentration.

In order to obtain a polymer (Y) having the content of the constituent unit (E) of 0.4 mol % or more, the content of the hydroxy group-containing ester (e) is preferably 45 mass % or more at the lower limit (20 mass %) of the solid content concentration.

Moreover, for example, when a resist polymer (Y') having the mass average molecular weight of about 10,000 is to be produced, preferably the solid content concentration of the polymer solution obtained in the end by means of solution polymerization is 25 mass % or more from the aspect of the yield rate of the resist polymer (Y') obtained by reprecipitation, and 65 mass % or less from the aspect of the viscosity of the polymer solution. Within the range of this solid content, in order to obtain a polymer (Y) having the content of the constituent unit (E) of 0.3 mol % or more at the polymerization temperature of 80° C., the content of the hydroxy group-containing ester (e) is preferably 30 mass % or more at the lower limit (25 mass %) of the solid content concentration, and the content of the hydroxy group-containing ester (e) is preferably 80 mass % or more at the upper limit (65 mass %) of the solid content concentration.

In order to obtain a polymer (Y) having the content of the constituent unit (E) of 0.4 mol % or more, the content of the hydroxy group-containing ester (e) is preferably 55 mass % or more at the lower limit (25 mass %) of the solid content concentration.

Furthermore, for example, when a resist polymer (Y') having the mass average molecular weight of about 5000 is to be produced, preferably the solid content concentration of the polymer solution obtained in the end by means of solution polymerization is 30 mass % or more from the point of the yield rate of the resist polymer (Y') obtained by reprecipitation, and 70 mass % or less from the point of the viscosity of the polymer solution. Within the range of this solid content, in order to obtain a polymer (Y) having the content of the constituent unit (E) of 0.3 mol % or more at the polymerization temperature of 80° C., the content of the hydroxy group-containing ester (e) is preferably 40 mass % or more at the lower limit (30 mass %) of the solid content concentration, and the content of the hydroxy group-containing ester (e) is preferably 85 mass % or more at the upper limit (70 mass %) of the solid content concentration.

In order to obtain a polymer (Y) having the content of the constituent unit (E) of 0.4 mol % or more, the content of the hydroxy group-containing ester (e) is preferably 55 mass % or more at the lower limit (30 mass %) of the solid content concentration.

The polymerization solvent used with the hydroxy group-containing ester (e) is not specifically limited. However, it is preferably a solvent (referred to as an organic solvent A) which can dissolve all of; monomers, a polymerization initiator, and polymers. Examples of such an organic solvent include 1,4-dioxane, isopropyl alcohol, acetone, tetrahydrofuran (hereunder referred to as "THF"), methyl ethyl ketone (hereunder referred to as "MEK"), methyl isobutyl ketone (hereunder referred to as "MIBK"), γ-butyrolactone, propylene glycol monomethylether acetate (hereunder referred to as "PGMEA"), and propylene glycol monomethylether (hereunder referred to as "PGME").

Moreover, the polymerization method of the solvent polymerization is not specifically limited, and may be a batch polymerization or a dropping polymerization. Among these, from the point of readily obtaining a polymer having a narrow composition distribution and/or molecular weight distribution, a polymerization method called a dropping polymerization for adding monomers dropwise into a polymerization container is preferable. The monomers to be added dropwise may be either monomers only, or a solution having monomers dissolved in an organic solvent.

In the dropping polymerization, for example, an organic solvent is previously charged in a polymerization container (this organic solvent is referred to as a "charged solvent") and heated up to a predetermined polymerization temperature. Then, a solution having monomers and a polymerization initiator dissolved either independently or in an optional combination into an organic solvent (this organic solvent is referred to as a "dropping solvent"), is added dropwise into the charged solvent. The monomers may be added dropwise without being dissolved into the dropping solvent. In this case, the polymerization initiator may be dissolved into the monomers, or a solution having only the polymerization initiator dissolved into an organic solvent may be added dropwise into an organic solvent. Moreover, without the charged solvent in the polymerization container, the monomers or the polymerization initiator may be added dropwise into the polymerization container.

The monomers and the polymerization initiator may be added dropwise directly from independent storage tanks into a charged solvent that has been heated to a predetermined polymerization temperature. Alternatively, they may be mixed right before being added from independent storage tanks into the charged solvent that has been heated to the predetermined polymerization temperature, and then added dropwise into the charged solvent.

Furthermore, regarding the timing at which the monomers and the polymerization initiator are added dropwise into the charged solvent, the monomers may be added first and then the polymerization initiator may be added later. Alternatively the monomers and the polymerization initiator may be added at the same timing. The speed of dropping may be a constant speed until the dropwise addition is completed, the speed may be changed at multisteps according to the consumption speed of the monomers or the polymerization initiator, or the dropwise addition may be intermittently stopped or started.

The polymerization temperature in the dropping polymerization is not specifically limited. However, normally, it is preferably within a range between 50 and 150° C.

The amount of the polymerization solvent to be used is not specifically limited, and may be appropriately determined. Normally, it is preferably used within a range between 30 and 700 mass parts based on 100 mass parts of the total monomers used for copolymerization.

As described above, regarding the resist polymer (Y') having a content of the constituent unit (E) of 0.3 mol % or more, from the point of a tendency of having an excellent handling property of reprecipitated wet powder, and the point of a high actual yield of the polymer obtained after the reprecipitation, the amount of the polymerization solvent to be used is more preferably 400 mass parts or less based on 100 mass parts of the total amount of monomers used for copolymerization (that is, the concentration of solid content is 20 mass % or less).

In the dropping polymerization, the total amount of the hydroxy group-containing ester (e) to be used may be contained in the dropping solvent, or the total amount of the hydroxy group-containing ester (e) to be used may be contained in the charged solvent. Alternatively, one part thereof may be contained in the dropping solvent and the rest may be contained in the charged solvent. In this case, the hydroxy group-containing ester (e) can be set at an optional proportion, however, from the point of a capability of narrowing the molecular weight distribution, the proportion of the hydroxy group-containing ester (e) in the charged solvent is preferably not less than the proportion of the hydroxy group-containing ester (e) in the dropping solvent.

The monomer concentration of the monomer solution to be added dropwise into the organic solvent is not specifically limited. However, it is preferably within a range between 5 and 50 mass %.

The amount of the charged solvent is not specifically limited, and may be appropriately determined Normally, it is preferably used within a range between 30 and 700 mass parts based on 100 mass parts of the total monomers used for copolymerization.

Moreover, regarding the resist polymer (Y') having a content of the constituent unit (E) of 0.3 mol % or more, from the point of a tendency of having an excellent handling property of reprecipitated wet powder, and the point of a high actual yield of the polymer obtained after the reprecipitation, similarly to the amount of the polymerization solvent to be used, the amount of the charged solvent is more preferably 400 mass parts or less based on 100 mass parts of the total amount of monomers used for copolymerization.

It is preferred to use the polymerization initiator efficiently generating radicals by heating. Examples of such polymerization initiators include azo compounds such as 2,2'-azobisisobutyronitrile, dimethyl-2,2'-azobisisobutyrate, and 2,2'-azobis[2-(2-imidazolin-2-yl)propane]; and organic peroxides such as 2,5-dimethyl-2,5-bis(tert-butylperoxy) hexane. Moreover, when a resist polymer used in ArF excimer laser (wavelength: 193 nm) lithography is produced, preferably, the polymerization initiator does not have an aromatic ring in the molecular structure, from the point of minimizing the reduction of the light transmittance of the obtained resist polymer (transmittance of light of a wavelength of 193 nm). Furthermore, taking into consideration the safety during the polymerization or the like, the polymerization initiator preferably has a 10 hours half-life temperature of 60° C. or more.

The amount of the polymerization initiator to be used is not specifically limited. However, from the point of increasing the yield of the copolymer, it is preferably 0.3 mol parts or more based on 100 mol parts of the total amount of monomers used for copolymerization, and more preferably 1 mol part or more. From the point of narrowing the molecular weight distribution of the copolymer, it is preferably 30 mol parts or less based on 100 mol parts of the total amount of monomers used for copolymerization.

When the resist polymer of the present invention is to be produced, a chain transfer agent (hereunder, refer to as a chain transfer agent B) may be used in addition to the hydroxy group-containing ester (e) within a range which does not decrease the storage stability of the resist composition. Preferred examples of such a chain transfer agent B include 1-butanethiol, 2-butanethiol, 1-octanethiol, 1-decanethiol, 1-tetradecanethiol, cyclohexanethiol, and 2-methyl-1-propanethiol.

When a resist polymer used in ArF excimer laser (wavelength: 193 nm) lithography is produced, preferably, the chain transfer agent B does not have an aromatic ring, from the point of minimizing the reduction of the light transmittance of the obtained resist polymer (transmittance of light with a wavelength of 193 nm).

The polymer solution produced by the solution polymerization is diluted with a good solvent such as 1,4-dioxane, acetone, THF, MEK, MIBK, γ-butyrolactone, PGMEA, or PGME, to an appropriate viscosity, as required. Thereafter, the resultant is added dropwise into a large amount of poor solvent such as methanol, water, hexane, and heptane, so as to precipitate a polymer. This process is generally called reprecipitation, and is very effective for eliminating unreacted monomers, polymerization initiators, and the like remaining in the polymerization solution. If these unreacted products remain as they are, the resist performance may be negatively affected. Thus, it is preferable to eliminate as many unreacted products as possible. The reprecipitation process is unnecessary in some cases. Thereafter, the precipitate is collected by filtration, and sufficiently dried, so as to obtain the polymer of the present invention. Otherwise, it is also possible to directly use wet powder after filtration without being dried.

Moreover, the produced polymer solution may be used directly, or as a resist composition after being diluted with an appropriate solvent. In this case, additives such as a storage stabilizing agent may be appropriately added.

Next, the resist composition of the present invention will be explained.

The resist composition of the present invention is obtained by dissolving the resist polymer of the present invention in a solvent. Moreover, the chemically amplified resist composition of the present invention is obtained by dissolving the resist polymer of the present invention and a photoacid generator in a solvent. The resist polymer of the present invention may be solely used or a plurality of types thereof may be used in combination. Without separating polymers from the polymer solution obtained by solution polymerization or the like, this polymer solution can be directly used for a resist composition, or can be diluted or concentrated with an appropriate solvent so as to use for a resist composition.

Examples of the solvent include linear or branched ketones such as methyl ethyl ketone, methyl isobutyl ketone, 2-pentanone, and 2-hexanone; cyclic ketones such as cyclopentanone and cyclohexanone; propylene glycol monoalkyl acetates such as propylene glycol monomethyl ether acetate and propylene glycol monoethyl ether acetate; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; ethylene glycol monoalkyl ethers such as ethylene glycol monomethyl ether and ethylene glycol monoethyl ether; diethylene glycol alkyl ethers such as diethylene glycol dimethyl ether and diethylene glycol monomethyl ether; esters such as ethyl acetate and ethyl lactate; alcohols such as n-propyl alcohol, isopropyl alcohol, n-butyl alcohol, cyclohexanol, and 1-octanol; 1,4-dioxane, ethylene carbonate, and γ-butyrolactone. These solvents may be solely used or a plurality of types thereof may be used in combination.

The content of the solvent is normally 200 to 5000 mass parts, and preferably 300 to 2000 mass parts, based on 100 mass parts of the resist polymer (the polymer of the present invention).

When the resist polymer of the present invention is used for a chemically amplified resist, it is necessary to use a photoacid generator.

The photoacid generator contained in the chemically amplified resist composition of the present invention may be suitably selected from those that can be used as an acid generator for chemically amplified resist compositions.

The photoacid generator may be solely used or a plurality of types thereof may be used in combination.

Examples of such a photoacid generator include onium salt compounds, sulfone imide compounds, sulfone compounds, sulfonate compounds, quinone diazide compounds, and diazomethane compounds. Among them, preferred examples as the photoacid generator include onium salt compounds such as a sulfonium salt, an iodonium salt, a phosphonium salt, a diazonium salt, and a pyridinium salt. Specific examples thereof include triphenyl sulfonium triflate, triphenyl sulfonium hexafluoroantimonate, triphenyl sulfonium naphthalenesulfonate, (hydroxyphenyl)benzylmethyl sulfonium toluenesulfonate, diphenyl iodonium triflate, diphenyl iodonium pyrenesulfonate, diphenyl iodonium dodecylbenzenesulfonate, diphenyl iodonium hexafluoroantimonate, p-methyl phenyl diphenyl sulfonium nonafluorobutanesulfonate, and tri(tert-butylphenyl) sulfonium trifluoromethanesulfonate.

The content of the photoacid generator may be appropriately determined, according to the type of the photoacid generator selected. However, it is normally 0.1 mass parts or more, and more preferably 0.5 mass parts or more, based on 100 mass parts of the resist polymer (the polymer of the present invention). By setting the content of the photoacid generator within this range, a chemical reaction is sufficiently promoted by the catalytic action of an acid generated as a result of light exposure. Moreover, the content of the photoacid generator is normally 20 mass parts or less, and more preferably 10 mass parts or less, based on 100 mass parts of the resist polymer (the polymer of the present invention). By setting the content of the photoacid generator within this range, the stability of the resist composition is improved, and unevenness generated when the composition is applied, and scum and the like generated during the development are sufficiently reduced.

Furthermore, the chemically amplified resist composition of the present invention can be mixed with a nitrogen-containing compound. By mixing the nitrogen-containing compound, resist pattern shape and post exposure stability of the latent image formed by the pattern wise exposure of the resist layer are further improved. Namely, the resulting resist pattern has nearly rectangular profile. Although a resist film is exposed, subjected to post exposure baking (PEB) and then allowed to stand for several hours before the following development treatment in a mass production line of semiconductors, deterioration of the resist pattern profile caused when the resist film is allowed to stand (with a lapse of time) is more suppressed.

Any one of publicly known nitrogen-containing compounds can be used. However, amines are preferred, among which a secondary lower aliphatic amine and a tertiary lower aliphatic amine are more preferred.

Here, the term "lower aliphatic amine" means alkylamine or alkyl alcohol amine having 5 or less carbon atoms.

Examples of such a secondary lower aliphatic amine and a tertiary lower aliphatic amine include trimethylamine, diethylamine, triethylamine, di-n-propylamine, tri-n-propylamine, tripentylamine, diethanolamine, and triethanolamine. Among them, as a nitrogen-containing compound, a tertiary alkanolamine such as triethanolamine is more preferred.

The nitrogen-containing compound may be solely used or a plurality of types thereof may be used in combination.

The content of the nitrogen-containing compound may be appropriately determined, according to the type of the nitrogen-containing compound selected. Normally, it is preferably 0.01 mass parts or more based on 100 mass parts of the resist polymer (the polymer of the present invention). By setting the content of the nitrogen-containing compound within this range, the form of the resist pattern can be made more rectangular. Moreover, normally, the content of the nitrogen-containing compound is preferably 2 mass parts or less based on 100 mass parts of the resist polymer (the polymer of the present invention). By setting the content of the nitrogen-containing compound within this range, deterioration in sensitivity can be reduced.

Furthermore, organic carboxylic acid, phosphorus oxo acid, or a derivative thereof may be added into the chemically amplified resist composition of the present invention. By adding these compounds thereinto, deterioration in sensitivity caused by adding the nitrogen-containing compound can be prevented, and the shape of the resist pattern, the film-left stability over time, and the like are further improved.

Preferred examples of the organic carboxylic acid include malonic acid, citric acid, malic acid, succinic acid, benzoic acid, and salicylic acid.

Examples of phosphorus oxo acids or derivatives thereof include: phosphoric acids and derivatives thereof like esters thereof, such as phosphoric acid, phosphoric acid di-n-butyl ester, and phosphoric acid diphenyl ester; phosphonic acids and derivatives thereof like esters thereof, such as phosphonic acid, phosphonic acid dimethyl ester, phosphonic acid di-n-butyl ester, phenyl phosphonate, phosphonic acid diphenyl ester, and phosphonic acid dibenzyl ester; and phosphinic acids and derivatives thereof like esters thereof, such as phosphinic acid and phenyl phosphinate. Among them, phosphonic acid is preferred.

These compounds (organic carboxylic acids, phosphorus oxo acids, or derivatives thereof) may be solely used or a plurality of typed thereof may be used in combination.

The content of these compounds (organic carboxylic acids, phosphorus oxo acids, or derivatives thereof) may be appropriately determined, according to the type of a compound selected. Normally, it is preferably 0.01 mass parts or more based on 100 mass parts of the resist polymer (the polymer of the present invention). By adjusting the content of these compounds within the above range, the resulting resist pattern shape can have nearly rectangular profile. Moreover, normally, the content of these compounds (organic carboxylic acid, phosphorus oxo acid, or a derivative thereof) is preferably 5 mass parts or less based on 100 mass parts of the resist polymer (the polymer of the present invention). By adjusting the content of these compounds within the above range, thickness loss of the resist pattern can be reduced.

Both a nitrogen-containing compound, and organic carboxylic acid, phosphorus oxo acid, or a derivative thereof, may be contained in the chemically amplified resist composition of the present invention. Alternatively, either one of them may be contained therein.

Furthermore, the resist composition of the present invention can be further mixed with various additives such as a surfactant, other quencher, a sensitizer, an antihalation agent, a stabilizer, and an antifoaming agent, as required. Any publicly known one of these additives in this field can be used herein. The blending quantity of these additives is not specifically limited, and may be appropriately determined.

The resist polymer of the present invention may be used as a resist composition for metal etching, photofabrication, plate-making, holograms, color filters, phase difference films, or the like.

Next, an example of the process for production of substrates with patterns thereon of the present invention will be explained.

First, the resist composition of the present invention is coated on the surface of a to-be-processed substrate such as silicone wafer, on which a pattern is formed, by spin coating. Then, the to-be-processed substrate, on which the resist composition is coated, is dried by baking treatment (pre-baking) or the like, so that a resist film is formed on the substrate.

Subsequently, light is irradiated onto the resist film obtained in such manner through a photomask (exposure). The light used for exposure is preferably a KrF excimer laser, an ArF excimer laser, or an $F_2$ excimer laser, and particularly preferably an ArF excimer laser. Moreover, exposure with electron beam is also preferred.

After the exposure, heat treatment (post exposure baking, PEB) is appropriately performed. The substrate is immersed in an alkaline developing solution, so as to eliminate the exposed portion by dissolving into the developing solution (development). Any publicly known alkaline developing solution can be used herein. After the development, the substrate is appropriately rinsed with pure water or the like. In this manner, a resist pattern is formed on the to-be-processed substrate.

Then, the to-be-processed substrate on which a resist pattern has been formed is appropriately subject to heat treatment (post-baking) so that the resist is reinforced. Areas having no resist are selectively etched. After the etching, the resist is generally eliminated using a releasing agent so as to obtain a substrate on which a pattern has been formed.

EXAMPLES

The present invention will be described using Examples. However, the Examples are not intended to limit the scope of the present invention. The term "part" in the respective Examples and Comparative Examples, means "mass part" unless otherwise specified.

Moreover, the resist polymer and the resist composition are evaluated in the following manner.

1. Evaluation of Resist Polymer

<Content of Respective Constituent Unit>

The content of the respective constituent unit of the resist polymer (Y') was obtained by $^1$H-NMR measurement if possible. If it could not be obtained by $^1$H-NMR measurement due to overlapping proton peaks or the like, it was obtained by $^{13}$C-NMR measurement.

For $^1$H-NMR measurement, GSX-400 FT-NMR (product name) manufactured by JEOL was used. A solution containing about 5 mass % of a resist polymer sample (in chloroform deuteride or dimethyl sulfoxide deuteride) was placed in a test tube of a diameter of 5 mm$\phi$. Thereafter, integration was performed 64 times under conditions of an observation frequency of 400 MHz and a single pulse mode. The measurement temperature was 40° C. if chloroform deuteride was used as a solvent and 60° C. if dimethyl sulfoxide was used as a solvent.

Here is a description of an example of a case where -L-O-$R^{211}$ in the constituent unit (E) is either —CH(CH$_3$)—O—CH$_2$CH$_3$ or —CH(CH$_3$)—O—CH$_2$CH$_2$CH$_2$CH$_3$ (which corresponds to the above formula (e-11)).

In this case, in $^1$H-NMR spectrum where dimethyl sulfoxide deuteride is used as a solvent and the measurement temperature is 60° C., methine hydrogen of L (one hydrogen atom) and methylene hydrogen atoms of $R^{211}$ (two hydrogen atoms) adjacent to oxygen atom have overlapping peaks, which are present between 4.05 and 4.15 ppm. The peak integral value is obtained by the following equation, since there are three atoms.

Integral value between 4.05 and 4.15 ppm=3×$INT_{(E)}$, wherein the peak integral value of one hydrogen atom of the constituent unit (E) is assumed to be $INT_{(E)}$. Then, the content of the constituent unit (E) contained in the resist polymer of the present invention is obtained by the calculation method described later.

As described above, whether or not the hydroxy group-containing ester (e-11) used as a polymerization solvent is taken into the polymer as the constituent unit (E) of the present invention can be confirmed by the presence of a relatively broad single line peak (peak width: about 0.1 ppm) between 4.05 and 4.15 ppm made by overlapping peaks of methylene hydrogen atoms of $R^{211}$ (two hydrogen atoms) adjacent to an oxygen atom.

If double lines are present at 5.1 ppm, the hydroxy group-containing ester (e-11) used as a polymerization solvent itself is not taken into the polymer, but remains. Affected by this, relatively sharp quartet line peaks (width of each peak of quartet line: about 0.02 ppm) derived from the remaining hydroxy group-containing ester (e-11) are concurrently present between 4.05 and 4.15 ppm, in addition to the relatively broad single line peak derived from the constituent unit (E). Therefore, an accurate integral value can not be obtained, which should be noted. In such a case, it is required to perform a process for refining the resist polymer to be evaluated again so as to eliminate the unreacted hydroxy group-containing ester (e-11).

On the other hand, in $^1$H-NMR spectrum, peaks derived from the constituent unit (A), the constituent unit (B), the constituent unit (C), or the like may be present at 4.1 ppm where a peak of methine hydrogen of L appears, making it difficult to reliably capture the peak of methine hydrogen of L. In such a case, it is required to measure $^{13}$C-NMR by the proton complete decoupling method, in which dimethyl sulfoxide deuteride is used as a solvent, the measurement temperature is 60° C., and nuclear Overhauser effect (NOE) is eliminated.

In the case of $^{13}$C-NMR measurement, UNITY-INOVA FT-NMR (product name) manufactured by Varian Technologies Japan Ltd. was used. A solution containing about 20 mass % of a resist polymer sample in dimethyl sulfoxide deuteride was placed in a test tube of a diameter of 5 mm$\phi$. Thereafter, integration was performed 50000 times under conditions of an observation frequency of 125 MHz and a measurement temperature of 60° C.

In the $^{13}$C-NMR spectrum obtained in this measurement, similarly to the $^1$H-NMR spectrum, the peak integral value is obtained according to the number of carbon atoms, and thus the quantitativity is increased. The peak of methine carbon of L in the constituent unit (E) is present between 60 and 61 ppm in the $^{13}$C-NMR spectrum.

Incidentally, peaks derived from the constituent unit (A), the constituent unit (B), the constituent unit (C), and the constituent unit (D) differ depending on the specific constituent unit. Therefore, although the details are described in the following examples, the content of the respective constituent units are as follows, wherein the peak integral values of one hydrogen atom or carbon atom specific to these constituent units are respectively assumed to be $INT_{(A)}$, $INT_{(B)}$, $INT_{(C)}$, and $INT_{(D)}$, and $INT_{(TOTAL)}$ represents the total of $INT_{(A)}$, $INT_{(B)}$, $INT_{(C)}$, $INT_{(D)}$, and $INT_{(E)}$.

Content of constituent unit (A) (mol %)=$INT_{(A)}$×100/$INT_{(TOTAL)}$

Content of constituent unit (B) (mol %)=$INT_{(B)}$×100/$INT_{(TOTAL)}$

Content of constituent unit (C) (mol %)=$INT_{(C)}$×100/$INT_{(TOTAL)}$

Content of constituent unit (D) (mol %)=$INT_{(D)}$×100/$INT_{(TOTAL)}$

Content of constituent unit (E) (mol %)=$INT_{(E)}$×100/$INT_{(TOTAL)}$

<Mass Average Molecular Weight>

About 20 mg of a resist polymer was dissolved in 5 ml of THF. The solution was then filtered through a 0.5 μm membrane filter, so as to prepare a sample solution. This sample solution was measured using gel permeation chromatography (GPC) manufactured by Tosoh Corp. In this measurement, 3 separation columns (Shodex GPC K-805L (product name) manufactured by Showa Denko K.K.) were used in series, THF was used as a solvent, the flow rate was 1.0 mL/min, a differential refractometer was used as a detector, the measurement temperature was 40° C., the injection volume was 0.1 mL, and polystyrene was used as a standard polymer.

2. Evaluation of Resist Composition

A resist composition was prepared using the produced polymer in the following manner, and the performance thereof was evaluated.

<Preparation of Resist Composition>

100 parts of the produced resist polymer, 2 parts of triphenyl sulfonium triflate serving as a photoacid generator, and 700 parts of PGMEA serving as a solvent were mixed, so as to form a homogeneous solution. The obtained solution was then filtered through a membrane filter with a pore size of 0.1 μm, so as to prepare a resist composition solution.

<Production of Resist Pattern>

The prepared resist composition solution was spin-coated on a silicon wafer, and pre-baking was performed using a hot plate at 120° C. for 60 seconds, so as to form a resist film having a film thickness of 0.4 μm. Subsequently, the film was exposed to light using an ArF excimer laser light exposure machine (wavelength: 193 nm), and then, post exposure baking was performed using a hot plate at 120° C. for 60 seconds. Next, development was performed at room temperature using 2.38 mass % of tetramethylammonium hydroxide aqueous solution, followed by washing with pure water and drying, so as to form a resist pattern.

<Sensitivity>

A light exposure (mJ/cm$^2$) at which a mask with a line-and-space pattern of 0.16 μm is transcribed into a line width of 0.16 μm, was measured as the sensitivity.

<Resolution>

The resolution was defined as the minimal dimension (μm) of a resist pattern which was imaged when exposure was performed at the above light exposure.

<Storage Stability of Resist Composition>

The resist sensitivity of the prepared resist composition solution which was left for a week at 40° C., was measured in the same manner as that of the above method. Then, the change of sensitivity of the resist composition during storage, which can be calculated by (resist sensitivity after a lapse of time)−(resist sensitivity right after solution preparation) was evaluated.

The smaller absolute value of the change of sensitivity means superior storage stability of the resist composition.

<Pattern Rectangularity>

The vertical section of the abovementioned 0.20 μm resist pattern was observed with a JSM-6340F field emission-type scanning electron microscope (product name) manufactured by JEOL. When the sectional shape was rectangular, the evaluation is "good", and when the sectional shape was a convex or concave, the evaluation is "no good".

Example 1

In a flask equipped with a nitrogen inlet, a stirrer, a condenser, and a thermometer on a water bath, 33.8 parts of ethyl lactate represented by the following formula (41) were placed under a nitrogen atmosphere, and the temperature of the water bath was increased to 80° C. while stirring.

[Chemical formula 52]

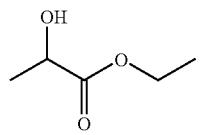

(41)

A monomer solution obtained by mixing 13.6 parts of α-methacryloyloxy-γ-butyrolactone (hereunder referred to as GBLMA) represented by the following formula (51), 18.7 parts of 2-methacryloyloxy-2-methyladamantane (hereunder referred to as MAdMA) represented by the following formula (52), 8.2 parts of 2- or 3-cyano-5-norbornyl methacrylate (hereunder referred to as CNNMA) represented by the following formula (53),

[Chemical formula 53]

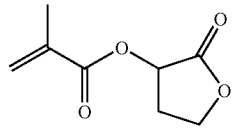

(51)

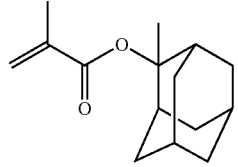

(52)

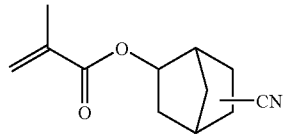

(53)

60.8 parts of ethyl lactate represented by the above formula (41), and 1.80 parts of 2,2'-azobis isobutyronitrile (hereunder referred to as AIBN) was added dropwise to the flask using a dropping device with a constant speed over 6 hours, and the mixture was then retained at 80° C. for 1 hour.

Next, while stirring, the obtained reaction solution was added dropwise to about 10 times its volume of methanol, so as to obtain a white precipitate (resist polymer Y'-1). The obtained precipitate was separated by filtration, and was again put into methanol the volume of which was about 10 times of the reaction solution, so as to be washed while stirring. Thereafter, the washed precipitate was separated by filtration, and then dried under reduced pressure at 60° C. for about 40 hours. Regarding the properties of the precipitate obtained by reprecipitation and washing, it had no stickiness and the handling property was excellent. The physical properties of the obtained resist polymer Y'-1 were measured, the results of which are shown in Table 5.

The respective composition ratios (contents) of GBLMA unit corresponding to the constituent unit (A) in the polymer, MAdMA unit corresponding to the constituent unit (B) therein, CNNMA unit corresponding to the constituent unit (C) therein, and ethyl lactate unit corresponding to the constituent unit (E) therein were calculated from four equations based on the peak integral values of the $^1$H-NMR spectrum shown below.

Peak integral value between 5.10 and 5.80 ppm= $INT_{(A)}$

Peak integral value between 4.15 and 4.90 ppm= $2 \times INT_{(A)} + INT_{(C)}$

Peak integral value between 4.05 and 4.15 ppm= $3 \times INT_{(E)}$

Peak integral value between 3.00 and 0.20 ppm=$7 \times INT_{(A)} + 22 \times INT_{(B)} + 14 \times INT_{(C)}$ Here, the integral value of relatively sharp quintet line peaks (peak width: about 0.2 ppm) which appear at 2.49 ppm derived from dimethyl sulfoxide serving as a light hydride of the measurement solvent, was removed from the peak integral value between 3.00 and 0.20 ppm.

Example 2

In a flask equipped with a nitrogen inlet, a stirrer, a condenser, and a thermometer on a water bath, 25.6 parts of ethyl lactate and 31.3 parts of PGMEA were placed under a nitrogen atmosphere, and the temperature of the water bath was increased to 80° C. while stirring. The concentration of ethyl lactate in the polymerization solvent at this time was 45 mass %.

A monomer solution obtained by mixing 47.2 parts of 8- or 9-methacryloyloxy-4-oxatricyclo[5.2.1.0$^{2,6}$]decan-3-one (hereunder referred to as OTDMA) represented by the following formula (54), 17.0 parts of tert-butylmethacrylate (hereunder referred to as TBMA) represented by the following formula (55), 17.8 parts of 1-acryloyloxy-3-hydroxyadamantane (hereunder referred to as HAdA) represented by the following formula (56).

[Chemical formula 54]

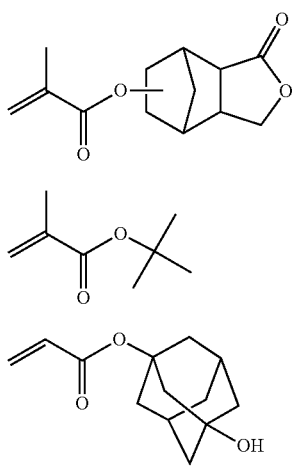

(54)

(55)

(56)

40.0 parts of ethyl lactate, 48.9 parts of PGMEA, and 3.68 parts of dimethyl-2,2'-azobis isobutylate (hereunder referred to as DAIB) was added dropwise to the flask using a dropping device at a certain rate over 4 hours. The concentration of ethyl lactate in the polymerization solvent after dropping was 45 mass %. The mixture was then retained at 80° C. for 3 hours.

The following operation was the same as that of Example 1 except that the reprecipitation solvent was changed from methanol to methanol/water=70 vol %/30 vol % and the washing solvent was changed from methanol to methanol/water=80 vol %/20 vol %, so as to obtain a resist polymer Y'-2. Regarding the properties of the precipitate obtained by reprecipitation and washing, it had no stickiness and the handling property was excellent. The physical properties of the obtained resist polymer Y'-2 were measured, the results of which are shown in Table 5.

The respective composition ratios (contents) of OTDA unit corresponding to the constituent unit (A) in the polymer, TBMA unit corresponding to the constituent unit (B) therein, HAdA unit corresponding to the constituent unit (C) therein, and ethyl lactate unit corresponding to the constituent unit (E) therein were calculated from four equations based on the peak integral values of the $^{13}$C-NMR spectrum shown below.

Peak integral value between 176 and 178 ppm=$INT_{(A)}$

Peak integral value between 67 and 69 ppm=$INT_{(C)}$

Peak integral value between 60 and 61 ppm=$INT_{(E)}$

Peak integral value between 27 and 29 ppm=$3 \times INT_{(B)}$

Example 3

In a flask equipped with a nitrogen inlet, a stirrer, a condenser, and a thermometer on a water bath, 34.5 parts of ethyl lactate was placed under a nitrogen atmosphere, and the temperature of the water bath was increased to 80° C. while stirring. A monomer solution obtained by mixing 17.8 parts of 8- or 9-acryloyloxy-4-oxatricyclo[5.2.1.0$^{2,6}$]decan-3-one (hereunder referred to as OTDA) represented by the following formula (57), 15.7 parts of 2-methacryloyloxy-2-ethylcyclohexane (hereunder referred to as ECHMA) represented by the following formula (58), 8.9 parts of HAdA, 63.5 parts of ethyl lactate, and 0.28 parts of DAIB was added dropwise to the flask using a dropping device with a constant speed over 6 hours, and the mixture was then retained at 80° C. for 1 hour.

[Chemical formula 55]

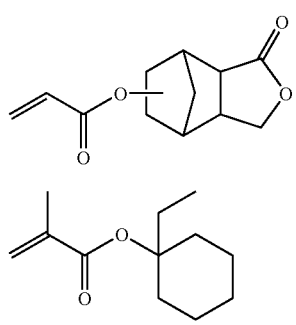

(57)

(58)

The following operation was the same as that of Example 1 except that the reprecipitation solvent was changed from methanol to methanol/water=70 vol %/30 vol % and the washing solvent was changed from methanol to methanol/water=80 vol %/20 vol %, so as to obtain a resist polymer Y'-3. Regarding the properties of the precipitate obtained by reprecipitation and washing, it had no stickiness and the handling property was excellent. The physical properties of the obtained resist polymer Y'-3 were measured, the results of which are shown in Table 5.

The respective composition ratios (contents) of OTDA unit corresponding to the constituent unit (A) in the polymer, ECHMA unit corresponding to the constituent unit (B) therein, HAdA unit corresponding to the constituent unit (C) therein, and ethyl lactate unit corresponding to the constituent unit (E) therein were calculated from four equations based on the peak integral values of the $^{13}$C-NMR spectrum shown below.

Peak integral value between 176 and 178 ppm=$INT_{(A)}$

Peak integral value between 67 and 69 ppm=$INT_{(C)}$

Peak integral value between 60 and 61 ppm=$INT_{(E)}$

Peak integral value between 5 and 7 ppm=$INT_{(B)}$

Example 4

In a flask equipped with a nitrogen inlet, a stirrer, a condenser, and a thermometer on a water bath, 34.8 parts of butyl lactate represented by the following formula (42) was placed under a nitrogen atmosphere, and the temperature of the water bath was increased to 80° C. while stirring.

[Chemical formula 56]

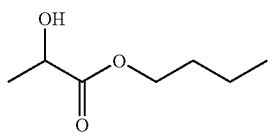

(42)

A monomer solution obtained by mixing 13.6 parts of GBLMA, 18.7 parts of MAdMA, and 9.4 parts of 1-methacryloyloxy-3-hydroxyadamantane (hereunder referred to as HAdMA) represented by the following formula (59), 62.6 parts of butyl lactate represented by the above formula (42), and 2.30 parts of DAIB was added dropwise to the flask using a dropping device with a constant speed over 6 hours, and the mixture was then retained at 80° C. for 1 hour.

[Chemical formula 57]

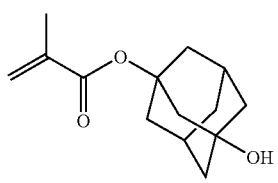

(59)

The following operation was the same as that of Example 1 except that the reprecipitation solvent was changed from methanol to methanol/water=80 vol %/20 vol % and the washing solvent was changed from methanol to methanol/water=90 vol %/10 vol %, so as to obtain a resist polymer Y'-4. Regarding the properties of the precipitate obtained by reprecipitation and washing, it had no stickiness and the handling property was excellent. The physical properties of the obtained resist polymer Y'-4 were measured, the results of which are shown in Table 5.

The respective composition ratios (contents) of GBLMA unit corresponding to the constituent unit (A) in the polymer, MAdMA unit corresponding to the constituent unit (B) therein, HAdMA unit corresponding to the constituent unit (C) therein, and butyl lactate unit corresponding to the constituent unit (E) therein were calculated from four equations based on the peak integral values of the $^1$H-NMR spectrum shown below.

Peak integral value between 5.10 and 5.80 ppm= $INT_{(A)}$

Peak integral value between 4.20 and 4.80 ppm=2× $INT_{(A)}$+$INT_{(C)}$

Peak integral value between 4.05 and 4.15 ppm=3× $INT_{(E)}$

Peak integral value between 3.00 and 0.20 ppm=7× $INT_{(A)}$+22×$INT_{(B)}$+19×$INT_{(C)}$ Here, the integral value of relatively sharp quintet line peaks (peak width: about 0.2 ppm) which appear at 2.49 ppm derived from dimethyl sulfoxide serving as a light hydride of the measurement solvent, was removed from the peak integral value between 3.00 and 0.20 ppm.

Example 5

In a flask equipped with a nitrogen inlet, a stirrer, a condenser, and a thermometer on a water bath, 66.0 parts of ethyl lactate and 44.0 parts of PGMEA were placed under a nitrogen atmosphere, and the temperature of the water bath was increased to 80° C. while stirring. The concentration of ethyl lactate in the polymerization solvent at this time was 60 mass %.

A monomer solution obtained by mixing 56.7 parts of OTDMA, 47.0 parts of ECHMA, 28.3 parts of HAdMA, 118.8 parts of ethyl lactate, 79.3 parts of PGMEA, and 11.73 parts of DAIB was added dropwise to the flask using a dropping device with a constant speed over 4 hours. The concentration of ethyl lactate in the polymerization solvent after dropping was 60 mass %. The mixture was then retained at 80° C. for 3 hours.

The following operation was the same as that of Example 1 except that the reprecipitation solvent was changed from methanol to methanol/water=80 vol %/20 vol % and the washing solvent was changed from methanol to methanol/water=85 vol %/15 vol %, so as to obtain a resist polymer Y'-5. Regarding the properties of the precipitate obtained by reprecipitation and washing, it had no stickiness and the handling property was excellent. The physical properties of the obtained resist polymer Y'-5 were measured, the results of which are shown in Table 5.

The respective composition ratios (contents) of OTDA unit corresponding to the constituent unit (A) in the polymer, ECHMA unit corresponding to the constituent unit (B) therein, HAdMA unit corresponding to the constituent unit (C) therein, and ethyl lactate unit corresponding to the constituent unit (E) therein were calculated from four equations based on the peak integral values of the $^{13}$C-NMR spectrum shown below.

Peak integral value between 176 and 178 ppm=$INT_{(A)}$

Peak integral value between 67 and 69 ppm=$INT_{(C)}$

Peak integral value between 60 and 61 ppm=$INT_{(E)}$

Peak integral value between 5 and 7 ppm=$INT_{(B)}$

Example 6

In a flask equipped with a nitrogen inlet, a stirrer, a condenser, and a thermometer on a water bath, 75.4 parts of ethyl lactate was placed under a nitrogen atmosphere, and the temperature of the water bath was increased to 80° C. while stirring.

A monomer solution obtained by mixing 35.5 parts of OTDA, 32.8 parts of MAdMA, 17.8 parts of HAdA, 4.4 parts of tricyclodecanylmethacrylate (hereunder referred to as TCDMA) represented by the following formula (60), 135.7 parts of ethyl lactate, and 2.48 parts of DAIB was added dropwise to the flask using a dropping device with a constant speed over 4 hours, and the mixture was then retained at 80° C. for 3 hours.

[Chemical formula 58]

(60)

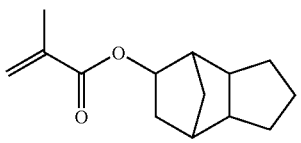

The following operation was the same as that of Example 1 except that the reprecipitation solvent was changed from methanol to methanol/water=75 vol %/25 vol % and the washing solvent was changed from methanol to methanol/water=85 vol %/15 vol %, so as to obtain a resist polymer Y'-6. Regarding the properties of the precipitate obtained by reprecipitation and washing, it had no stickiness and the handling property was excellent. The physical properties of the obtained resist polymer Y'-6 were measured, the results of which are shown in Table 5.

The respective composition ratios (contents) of OTDA unit corresponding to the constituent unit (A) in the polymer, MAdMA unit corresponding to the constituent unit (B) therein, HAdMA unit corresponding to the constituent unit (C) therein, TCDMA unit corresponding to the constituent unit (D1) therein, and ethyl lactate unit corresponding to the constituent unit (E) therein were calculated from four equations based on the peak integral values of the $^{13}$C-NMR spectrum shown below.

Peak integral value between 176 and 178 ppm=$INT_{(A)}$

Peak integral value between 67 and 69 ppm=$INT_{(C)}$

Peak integral value between 60 and 61 ppm=$INT_{(E)}$

Peak integral value between 37 and 39 ppm=$INT_{(B)}$

Peak integral value between 27 and 29 ppm=$INT_{(D1)}$

Comparative Example 1

In a flask equipped with a nitrogen inlet, a stirrer, a condenser, and a thermometer on a water bath, 7.9 parts of ethyl lactate and 31.5 parts of PGMEA were placed under a nitrogen atmosphere, and the temperature of the water bath was increased to 75° C. while stirring. The concentration of ethyl lactate in the polymerization solvent was 20 mass %.

A monomer solution obtained by mixing 18.7 parts of 2-exo-acryloyloxy-4-oxatricyclo[4.2.1.0.$^{3,7}$]nonan-5-one (hereunder referred to as NLA) represented by the following formula (61), 21.0 parts of 1-(1-methacryloyloxy-1-methylethyl)amantane (hereunder referred to as IAdMA) represented by the following formula (62), 7.6 parts of 1-methacryloyloxy-3,5-dihydroxyamantane (hereunder referred to as DHAdMA) represented by the following formula (63), 14.2 parts of ethyl lactate, 56.7 parts of PGMEA, and 10.2 parts of DAIB was added dropwise to the flask using a dropping device with a constant speed over 6 hours. The concentration of ethyl lactate in the polymerization solvent after dropping was 20 mass %.

[Chemical formula 59]

(61)

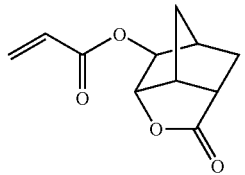

(62)

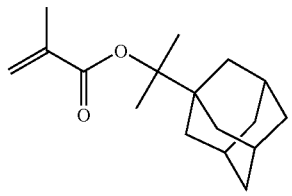

(63)

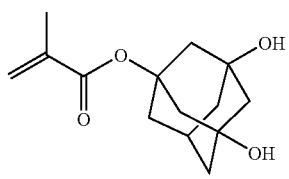

The following operation was the same as that of Example 1 except that the reprecipitation solvent was changed from methanol to methanol/water=70 vol %/30 vol % and the washing solvent was changed from methanol to methanol/water=80 vol %/20 vol %, so as to obtain a resist polymer B-1. Regarding the properties of the precipitate obtained by reprecipitation and washing, it was thickened like a sticky substance and had stickiness, and the handling property was unfavorable. The physical properties of the obtained resist polymer B-1 were measured, the results of which are shown in Table 5.

The respective composition ratios (contents) of NLA unit corresponding to the constituent unit (A) in the polymer, IAdMA unit corresponding to the constituent unit (B) therein, DHAdMA unit corresponding to the constituent unit (C) therein, and ethyl lactate unit corresponding to the constituent unit (E) therein were calculated from four equations based on the peak integral values of the $^{13}$C-NMR spectrum shown below.

Peak integral value between 176 and 178 ppm=$INT_{(A)}$

Peak integral value between 79 and 81 ppm=$INT_{(B)}$

Peak integral value between 67 and 69 ppm=$2 \times INT_{(C)}$

Peak integral value between 60 and 61 ppm=$INT_{(E)}$

Comparative Example 2

The same operation as that of Example 4 was performed except that PGMEA was used instead of butyl lactate and 1.31 parts of AIBN and 0.56 part of n-octylmercaptan were used instead of 2.30 parts of DAIB, so as to obtain a resist polymer B-2. Regarding the properties of the precipitation obtained by reprecipitation and washing, the precipitation was thickened like a sticky substance and had stickiness, and the handling property was unfavorable. The physical properties of the obtained resist polymer B-2 were measured, the results of which are shown in Table 5.

No peak of ¹H-NMR or ¹³C-NMR corresponding to the constituent unit (E) in the polymer was observed. Moreover, the respective composition ratios (contents) of GBLMA unit corresponding to the constituent unit (A) in the polymer, MAdMA unit corresponding to the constituent unit (B) therein, and HAdMA unit corresponding to the constituent unit (C) therein were calculated in the same manner as that of Example 4.

Comparative Example 3

The same operation as that of Example 3 was performed except that PGMEA was used instead of ethyl lactate and 3.19 parts of DAIB was used, so as to obtain a resist polymer B-3.

Regarding the properties of the precipitation obtained by reprecipitation and washing, the precipitation was thickened like a sticky substance and had stickiness, and the handling property was unfavorable. The physical properties of the obtained resist polymer B-3 were measured, the results of which are shown in Table 5.

No peak of ¹H-NMR or ¹³C-NMR corresponding to the constituent unit (E) in the polymer was observed. Moreover, the respective composition ratios (contents) of OTDA unit corresponding to the constituent unit (A) in the polymer, ECHMA unit corresponding to the constituent unit (B) therein, and HAdA unit corresponding to the constituent unit (C) therein were calculated in the same manner as that of Example 6.

TABLE 5

|  |  | Examples |  |  |  |  |  | Comparative Examples |  |  |
|---|---|---|---|---|---|---|---|---|---|---|
|  |  | 1 | 2 | 3 | 4 | 5 | 6 | 1 | 2 | 3 |
| Copolymer |  | Y'-1 | Y'-2 | Y'-3 | Y'-4 | Y'-5 | Y'-6 | B-1 | B-2 | B-3 |
| Mass average molecular weight (Mw) |  | 7,100 | 10,700 | 10,300 | 7,100 | 11,200 | 6,400 | 6,500 | 6,900 | 9,900 |
| Molecular weight distribution (Mw/Mn) |  | 1.48 | 1.78 | 1.74 | 1.50 | 1.78 | 1.62 | 1.90 | 1.48 | 2.08 |
| Polymerization solvent |  | EL | EL/PGMEA | EL | BL | EL/PGMEA | EL | EL/PGMEA | PGMEA | PGMEA |
| Content of hydroxy group-containing ester (e) in the the polymerization solvent |  | 100 | 45 | 100 | 100 | 60 | 100 | 20 | 0 | 0 |
| Structure having chain transferability |  | —OH | —OH | —OH | —OH | —OH | —OH | —OH | —SH | None |
| Content of constituent unit (A) (mol %) | GBLMA | 41.4 | — | — | 40.4 | — | — | — | 40.7 | — |
|  | NLA | — | — | — | — | — | — | 45.7 | — | — |
|  | OTDA | — | — | 41.1 | — | — | 40.5 | — | — | 40.7 |
|  | OTDMA | — | 48.0 | — | — | 41.7 | — | — | — | — |
| Content of constituent unit (B) (mol %) | MAdMA | 40.3 | — | — | 39.3 | — | 33.9 | — | 40.0 | — |
|  | ECHMA | — | — | 37.8 | — | 37.4 | — | — | — | 38.3 |
|  | IAdMA | — | — | — | — | — | — | 39.6 | — | — |
|  | TBMA | — | 29.9 | — | — | — | — | — | — | — |
| Content of constituent unit (C) (mol %) | CNNMA | 17.6 | — | — | — | — | — | — | — | — |
|  | HAdMA | — | — | — | 19.6 | 20.4 | — | — | 19.3 | — |
|  | HAdA | — | 21.7 | 20.5 | — | — | 20.1 | — | — | 21.0 |
|  | DHAdMA | — | — | — | — | — | — | 14.5 | — | — |
| Content of constituent unit (D1) (mol %) | TCDMA | — | — | — | — | — | 4.7 | — | — | — |
| Content of constituent unit (E) (mol %) |  | 0.7 | 0.4 | 0.6 | 0.7 | 0.5 | 0.8 | 0.2 | 0 | 0 |
| Sensitivity (mJ/cm²) |  | 4.2 | 5.6 | 5.0 | 4.3 | 5.4 | 4.9 | 5.6 | 4.6 | 5.2 |
| Resolution (μm) |  | 0.13 | 0.13 | 0.13 | 0.13 | 0.13 | 0.13 | 0.13 | 0.13 | 0.14 |
| Storage stability (mJ/cm²) |  | 0.0 | 0.0 | −0.1 | 0.0 | 0.0 | 0.0 | 0.1 | 0.3 | 0.1 |
| Pattern rectangularity |  | good (○) |  |  |  |  |  | bad (X) |  |  |
| Handling property of wet powder obtained by reprecipitation |  | good |  |  |  |  |  | thickened like a sticky substance |  |  |

The invention claimed is:

1. A resist polymer (Y') comprising a polymer (Y) comprising:
   a constituent unit (A) having a lactone skeleton;
   a constituent unit (B) having an acid-eliminable group;
   a constituent unit (C) having a hydrophilic group; and
   a constituent unit (E) having a structure represented by formula (1),
   wherein
   a content of the constituent unit (E) is 0.3 mol % or more based on the total number of the constituent units of the resist polymer (Y'):

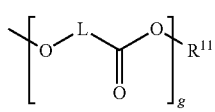
(1)

where
   L is a divalent linear, branched, or cyclic $C_{1-20}$ hydrocarbon group which may have a substituent, a heteroatom, or a combination thereof;
   g is 3 to 24
   $R^{11}$ is a g-valent linear, branched, or cyclic $C_{1-12}$ hydrocarbon group, optionally having a substituent, a heteroatom, or a combination thereof,
   wherein
   the constituent unit (A) is selected from the group consisting of formulae (4-2), (4-3), (4-4), and (10-1)

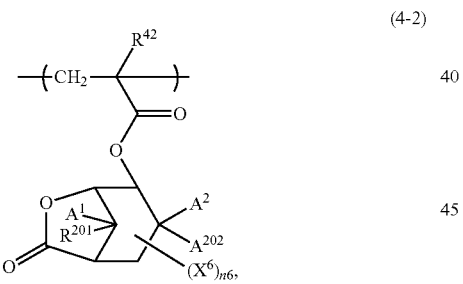
(4-2)

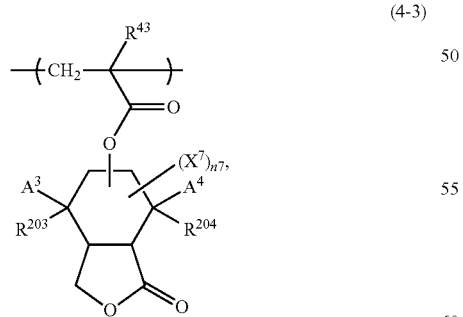
(4-3)

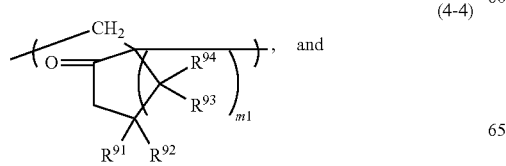
(4-4)

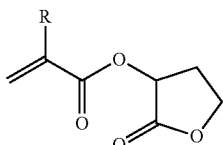
(10-1)

wherein,
   in the formula (4-2), $R^{42}$ represents a hydrogen atom or a methyl group; $R^{201}$ and $R^{202}$ independently represent a hydrogen atom, a linear or branched $C_{1-6}$ alkyl group, a hydroxy group, a carboxy group, or a carboxy group esterified with $C_{1-6}$ alcohol; $A^1$ and $A^2$ independently represents a hydrogen atom, a linear or branched $C_{1-6}$ alkyl group, a hydroxy group, a carboxy group, or a carboxy group esterified with $C_{1-6}$ alcohol; or $A^1$ and $A^2$ together represent —O—, —S—, —NH—, or a $C_{1-6}$ methylene chain [—$(CH_2)_k$— (wherein k represents an integer of 1 to 6)]; $X^6$ represents a linear or branched $C_{1-6}$ alkyl group, a hydroxy group, a carboxy group, a $C_{1-6}$ acyl group, a $C_{1-6}$ alkoxy group, a carboxy group esterified with $C_{1-6}$ alcohol, a cyano group, or an amino group; the linear or branched $C_{1-6}$ alkyl group may have, as a substituent, at least one group selected from a group consisting of a hydroxy group, a carboxy group, a $C_{1-6}$ acyl group, a carboxy group esterified with $C_{1-6}$ alcohol, a cyano group, and an amino group; n6 represents an integer of 0 to 4; and $X^6$ may have a plurality of different groups if n6 is 2 or more;

in the formula (4-3), $R^{43}$ represents a hydrogen atom or a methyl group; $R^{203}$ and $R^{204}$ independently represent a hydrogen atom, a linear or branched $C_{1-6}$ alkyl group, a hydroxy group, a carboxy group, or a carboxy group esterified with $C_{1-6}$ alcohol; $A^3$ and $A^4$ independently represent a hydrogen atom, a linear or branched $C_{1-6}$ alkyl group, a hydroxy group, a carboxy group, or a carboxy group esterified with $C_{1-6}$ alcohol; or $A^3$ and $A^4$ together represent —O—, —S—, —NH—, or a $C_{1-6}$ methylene chain, [—$(CH_2)_l$— (wherein l represents an integer of 1 to 6)], $X^7$ represents a linear or branched $C_{1-6}$ alkyl group, a hydroxy group, a carboxy group, a $C_{1-6}$ acyl group, a $C_{1-6}$ alkoxy group, a carboxy group esterified with $C_{1-6}$ alcohol, a cyano group, or an amino group; the linear or branched $C_{1-6}$ alkyl group may have, as a substituent, at least one group selected from a group consisting of a hydroxy group, a carboxy group, a $C_{1-6}$ acyl group, a carboxy group esterified with $C_{1-6}$ alcohol, a cyano group, and an amino group; n7 represents an integer of 0 to 4; and $X^7$ may have a plurality of different groups if n7 is 2 or m in the formula (4-4), $R^{91}$, $R^{92}$, $R^{93}$, and $R^{94}$ independently represent a hydrogen atom, a linear or branched $C_{1-6}$ alkyl group, a hydroxy group, a carboxy group, or a carboxy group esterified with $C_{1-6}$ alcohol; or $R^{91}$ and $R^{92}$ together represent —O—, —S—, —NH—, or a $C_{1-6}$ methylene chain [—$(CH_2)_t$— (wherein t represents an integer of 1 to 6)]; and m1 represents 1 or 2; and in the formula (10-1), R represents a hydrogen atom or a methyl group.

2. A resist polymer (Y') comprising a polymer (Y) comprising:
- a constituent unit (A) having a lactone skeleton;
- a constituent unit (B) having an acid-eliminable group;
- a constituent unit (C) having a hydrophilic group; and
- a constituent unit (E) having a structure represented by formula (1), wherein
the polymer (Y) comprises (meth)acrylic monomers;
a content of the constituent unit (A) is 30 mol % or more based on the total number of constituent units of the resist polymer (Y'); and
a content of the constituent unit (E) is 0.3 mol % or more based on the total number of the constituent units of the resist polymer (Y'):

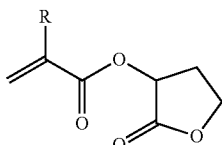
(1)

where
L is a divalent linear, branched, or cyclic $C_{1-20}$ hydrocarbon group which may have a substituent, a heteroatom, or a combination thereof;
g is 3 to 24
$R^{11}$ is a g-valent linear, branched, or cyclic $C_{1-12}$ hydrocarbon group, optionally having a substituent, a heteroatom, or a combination thereof, wherein
the constituent unit (A) is selected from the group consisting of formulae (4-2), (4-3), (4-4), and (10-1)

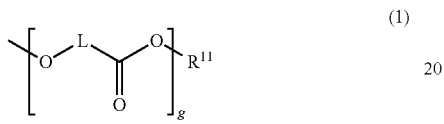
(4-2)

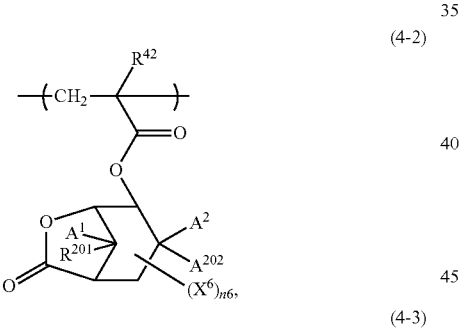
(4-3)

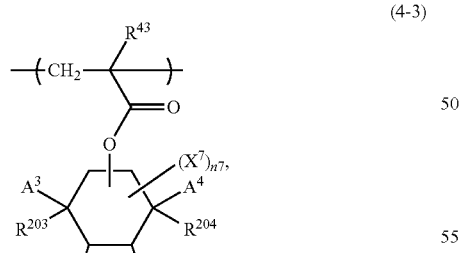
(4-4)

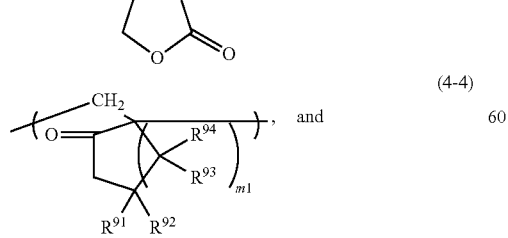
, and (10-1)

wherein,
in the formula (4-2), $R^{42}$ represents a hydrogen atom or a methyl group; $R^{201}$ and $R^{202}$ independently represent a hydrogen atom, a linear or branched $C_{1-6}$ alkyl group, a hydroxy group, a carboxy group, or a carboxy group esterified with $C_{1-6}$ alcohol; $A^1$ and $A^2$ independently represents a hydrogen atom, a linear or branched $C_{1-6}$ alkyl group, a hydroxy group, a carboxy group, or a carboxy group esterified with $C_{1-6}$ alcohol; or $A^1$ and $A^2$ together represent —O—, —S—, —NH—, or a $C_{1-6}$ methylene chain [—$(CH_2)_k$— (wherein k represents an integer of 1 to 6)]; $X^6$ represents a linear or branched $C_{1-6}$ alkyl group, a hydroxy group, a carboxy group, a $C_{1-6}$ acyl group, a $C_{1-6}$ alkoxy group, a carboxy group esterified with $C_{1-6}$ alcohol, a cyano group, or an amino group; the linear or branched $C_{1-6}$ alkyl group may have, as a substituent, at least one group selected from a group consisting of a hydroxy group, a carboxy group, a $C_{1-6}$ acyl group, a carboxy group esterified with $C_{1-6}$ alcohol, a cyano group, and an amino group; n6 represents an integer of 0 to 4; and $X^6$ may have a plurality of different groups if n6 is 2 or more;

in the formula (4-3), $R^{43}$ represents a hydrogen atom or a methyl group; $R^{203}$ and $R^{204}$ independently represent a hydrogen atom, a linear or branched $C_{1-6}$ alkyl group, a hydroxy group, a carboxy group, or a carboxy group esterified with $C_{1-6}$ alcohol; $A^3$ and $A^4$ independently represent a hydrogen atom, a linear or branched $C_{1-6}$ alkyl group, a hydroxy group, a carboxy group, or a carboxy group esterified with $C_{1-6}$ alcohol; or $A^3$ and $A^4$ together represent —O—, —S—, —NH—, or a $C_{1-6}$ methylene chain, [—$(CH_2)_l$— (wherein l represents an integer of 1 to 6)], $X^7$ represents a linear or branched $C_{1-6}$ alkyl group, a hydroxy group, a carboxy group, a $C_{1-6}$ acyl group, a $C_{1-6}$ alkoxy group, a carboxy group esterified with $C_{1-6}$ alcohol, a cyano group, or an amino group; the linear or branched $C_{1-6}$ alkyl group may have, as a substituent, at least one group selected from a group consisting of a hydroxy group, a carboxy group, a $C_{1-6}$ acyl group, a carboxy group esterified with $C_{1-6}$ alcohol, a cyano group, and an amino group; n7 represents an integer of 0 to 4; and $X^7$ may have a plurality of different groups if n7 is 2 or m in the formula (4-4), $R^{91}$, $R^{92}$, $R^{93}$, and $R^{94}$ independently represent a hydrogen atom, a linear or branched $C_{1-6}$ alkyl group, a hydroxy group, a carboxy group, or a carboxy group esterified with $C_{1-6}$ alcohol; or $R^{91}$ and $R^{92}$ together represent —O—, —S—, —NH—, or a $C_{1-6}$ methylene chain [—$(CH_2)_t$— (wherein t represents an integer of 1 to 6)]; and m1 represents 1 or 2; and in the formula (10-1), R represents a hydrogen atom or a methyl group.

* * * * *

UNITED STATES PATENT AND TRADEMARK OFFICE
CERTIFICATE OF CORRECTION

| | | |
|---|---|---|
| PATENT NO. | : 8,476,401 B2 | |
| APPLICATION NO. | : 11/574860 | |
| DATED | : July 2, 2013 | |
| INVENTOR(S) | : Hikaru Momose et al. | |

It is certified that error appears in the above-identified patent and that said Letters Patent is hereby corrected as shown below:

On the title page, Item (54) and in the Specification, column 1, the title of invention is incorrect. Title should read:

--RESIST POLYMER, PROCESS FOR PRODUCTION THEREOF, RESIST COMPOSITION, AND PROCESS FOR PRODUCTION OF SUBSTRATES WITH PATTERNS THEREON--

Signed and Sealed this
Third Day of September, 2013

Teresa Stanek Rea
*Acting Director of the United States Patent and Trademark Office*